United States Patent
Kim et al.

(10) Patent No.: US 12,272,705 B2
(45) Date of Patent: Apr. 8, 2025

(54) IMAGE SENSOR

(71) Applicant: SAMSUNG ELECTRONICS CO., LTD., Suwon-si (KR)

(72) Inventors: Kook Tae Kim, Hwaseong-si (KR); Chang Kyu Lee, Hwaseong-si (KR); Dongmo Im, Seoul (KR); Ju-eun Kim, Hwaseong-si (KR); Miseon Park, Hwaseong-si (KR); Jungim Choe, Hwaseong-si (KR); Soojin Hong, Guri-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 225 days.

(21) Appl. No.: 17/239,291

(22) Filed: Apr. 23, 2021

(65) Prior Publication Data
US 2022/0102405 A1 Mar. 31, 2022

(30) Foreign Application Priority Data
Sep. 29, 2020 (KR) .................. 10-2020-0126750

(51) Int. Cl.
H01L 31/062 (2012.01)
H10F 39/00 (2025.01)
(52) U.S. Cl.
CPC ..... H10F 39/80377 (2025.01); H10F 39/807 (2025.01)
(58) Field of Classification Search
None
See application file for complete search history.

(56) References Cited

U.S. PATENT DOCUMENTS

| | | |
|---|---|---|
| 5,199,994 A | 4/1993 | Aoki |
| 5,599,735 A | 2/1997 | Moslehi |
| 6,048,782 A | 4/2000 | Moslehi |
| 6,506,619 B2 | 1/2003 | Chen et al. |
| 6,555,451 B1 | 4/2003 | Kub et al. |
| 6,645,839 B2 | 11/2003 | Haupt et al. |
| 6,727,141 B1 | 4/2004 | Bronner et al. |
| 7,064,406 B2 | 6/2006 | Mouli |
| 7,358,108 B2 * | 4/2008 | Han .................. H01L 27/14689 257/515 |

(Continued)

FOREIGN PATENT DOCUMENTS

| | | |
|---|---|---|
| CN | 109728025 A | 5/2019 |
| CN | 111146218 A | 5/2020 |

(Continued)

Primary Examiner — Ali Naraghi
(74) Attorney, Agent, or Firm — Sughrue Mion, PLLC

(57) ABSTRACT

An image sensor is provided and may include a semiconductor substrate having a surface and including trench, the trench extending from the surface into the semiconductor substrate, an insulating pattern provided in the trench; and a doped region in the semiconductor substrate and on the insulating patterns. The doped region includes a side portion on a side surface of the insulating pattern, and a bottom portion on a bottom surface of the insulating pattern. A thickness of the side portion of the doped region is from 85% to 115% of a thickness of the bottom portion of the doped region, and a number of dopants per unit area in the side portion of the doped region is from 85% to 115% of a number of dopants per unit area in the bottom portion.

12 Claims, 63 Drawing Sheets

(56) References Cited

U.S. PATENT DOCUMENTS

| | | | |
|---|---|---|---|
| 7,626,685 | B2 | 12/2009 | Jin et al. |
| 8,035,142 | B2* | 10/2011 | Mouli ............... H01L 27/14601 |
| | | | 257/292 |
| 8,569,672 | B2 | 10/2013 | Ha |
| 8,592,915 | B2* | 11/2013 | Huang ............. H01L 21/76237 |
| | | | 257/374 |
| 8,785,991 | B2 | 7/2014 | Mabuchi |
| 8,829,636 | B2 | 9/2014 | Ohchi et al. |
| 8,975,154 | B2 | 3/2015 | Dutartre et al. |
| 9,190,441 | B2 | 11/2015 | Lai et al. |
| 9,385,157 | B2 | 7/2016 | Jung et al. |
| 9,553,119 | B2* | 1/2017 | Choi ................. H01L 27/14614 |
| 9,666,473 | B2 | 5/2017 | Kao |
| 10,134,792 | B2 | 11/2018 | Lee et al. |
| 10,177,187 | B2 | 1/2019 | Kalnitsky et al. |
| 10,304,886 | B2 | 5/2019 | Chiang et al. |
| 10,461,110 | B2 | 10/2019 | Manda et al. |
| 10,475,839 | B2 | 11/2019 | Tsai et al. |
| 10,615,228 | B2 | 4/2020 | Im et al. |
| 10,672,934 | B2 | 6/2020 | Wang et al. |
| 11,088,253 | B2 | 8/2021 | Qi |
| 11,239,269 | B2 | 2/2022 | Kim et al. |
| 11,476,286 | B2 | 10/2022 | Ezaki et al. |
| 11,961,862 | B2 | 4/2024 | Masagaki |
| 2005/0045926 | A1* | 3/2005 | Mouli ............... H01L 27/14609 |
| | | | 257/E27.15 |
| 2006/0033127 | A1* | 2/2006 | Yaung .................. H01L 31/103 |
| | | | 257/E31.057 |
| 2006/0273355 | A1* | 12/2006 | Han .................. H01L 27/14609 |
| | | | 257/292 |
| 2007/0158771 | A1* | 7/2007 | Hynecek ........... H01L 27/14643 |
| | | | 257/431 |
| 2010/0002108 | A1 | 1/2010 | Mabuchi |
| 2011/0168873 | A1* | 7/2011 | Ha ..................... H01L 27/1463 |
| | | | 257/222 |
| 2012/0083105 | A1 | 4/2012 | Pellegrin |
| 2014/0197464 | A1 | 7/2014 | Ihara |
| 2014/0295648 | A1 | 10/2014 | Nakaiso et al. |
| 2015/0115397 | A1* | 4/2015 | Cheng ................ H01L 21/3065 |
| | | | 438/437 |
| 2018/0286899 | A1 | 10/2018 | Muramatsu et al. |
| 2019/0139997 | A1 | 5/2019 | Chiang et al. |
| 2019/0139999 | A1 | 5/2019 | Kalnitsky et al. |
| 2019/0214297 | A1 | 7/2019 | Wu et al. |
| 2020/0091212 | A1 | 3/2020 | Park et al. |
| 2020/0111821 | A1 | 4/2020 | Hong et al. |
| 2020/0266223 | A1 | 8/2020 | Takahashi |

FOREIGN PATENT DOCUMENTS

| | | |
|---|---|---|
| JP | 2003-218337 A | 7/2003 |
| JP | 2005-223084 A | 8/2005 |
| JP | 2006-287117 A | 10/2006 |
| JP | 2007-504666 A | 3/2007 |
| JP | 2009-224585 A | 10/2009 |
| JP | 2010-016114 A | 1/2010 |
| JP | 2012-500491 A | 1/2012 |
| JP | 2015-070070 A | 4/2015 |
| JP | 2018-181910 A | 11/2018 |
| JP | 2020-507211 A | 3/2020 |
| KR | 10-2005-0097646 A | 10/2005 |
| KR | 10-2010-0004064 A | 1/2010 |
| KR | 10-1550590 B1 | 9/2015 |
| KR | 10-2016-0007217 A | 1/2016 |
| KR | 10-2016-0031586 A | 3/2016 |
| KR | 10-1897191 B1 | 9/2018 |
| KR | 10-2019-0120116 A | 10/2019 |
| KR | 10-2087233 B1 | 3/2020 |
| WO | 2020/012824 A1 | 1/2020 |

* cited by examiner

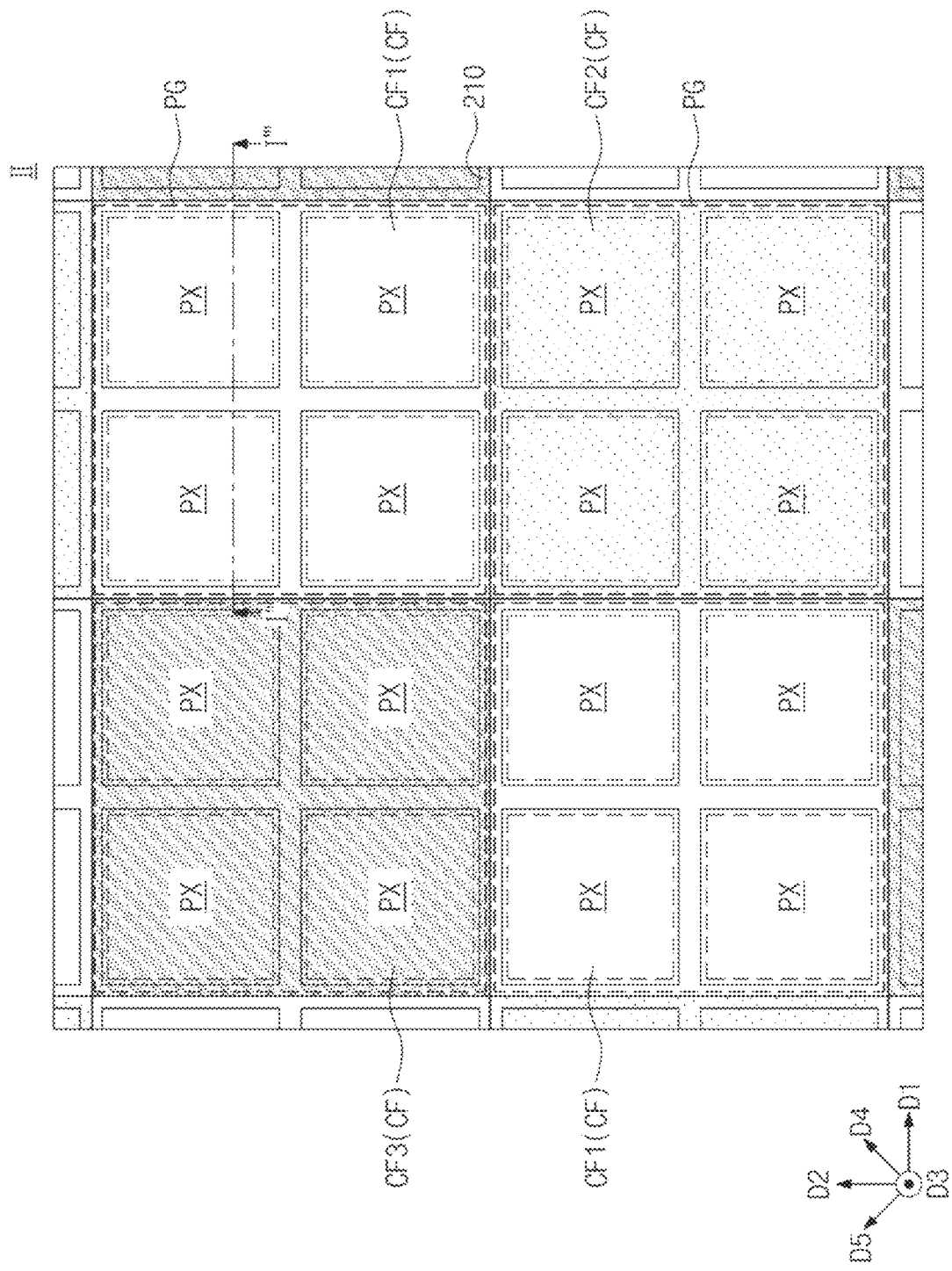

IMAGE SENSOR

CROSS-REFERENCE TO RELATED APPLICATIONS

This U.S. non-provisional patent application claims priority under 35 U.S.C. § 119 to Korean Patent Application No. 10-2020-0126750, filed on Sep. 29, 2020, in the Korean Intellectual Property Office, the entire contents of which are hereby incorporated by reference.

BACKGROUND

1. Field

The present disclosure relates to an image sensor and a method of fabricating the same, and in particular, to an image sensor with a doped region and method of fabricating the same.

2. Description of Related Art

An image sensor is a device converting an optical image to electrical signals. The image sensor is classified into two types: a charge coupled device (CCD) type and a complementary metal-oxide-semiconductor (CMOS) type. The CMOS-type image sensor is called CIS for short. The CIS includes a plurality of pixels which are two-dimensionally arranged. Each of the unit pixel regions includes a photodiode, which is used to convert an incident light to an electric signal.

SUMMARY

It is an aspect to provide an image sensor with improved electrical and optical characteristics.

According to an aspect of one or more embodiments, there is provided an image sensor comprising a semiconductor substrate having a surface and comprising a trench, the trench extending from the surface into the semiconductor substrate; an insulating pattern provided in the trench; and a doped region n the semiconductor substrate and on the insulating pattern. Wherein the doped region comprises a side portion on a side surface of the insulating pattern, and a bottom portion on a bottom surface of the insulating pattern, wherein a thickness of the side portion of the doped region is from 85% to 115% of a thickness of the bottom portion of the doped region, and a number of dopants per unit area in the side portion of the doped region is from 85% to 115% of a number of dopants per unit area in the bottom portion.

According to another aspect of one or more embodiments, there is provided an image sensor comprising a semiconductor substrate with a trench; an insulating pattern in the trench of the semiconductor substrate; and a doped region disposed in the semiconductor substrate and on the insulating pattern, wherein the doped region comprises a first region, which is in contact with the insulating pattern and comprises a dopant and a first auxiliary element; and a second region, which is interposed between the first region and the semiconductor substrate and comprises the dopant, and wherein a concentration of the dopant in the first region is higher than a concentration of the first auxiliary element in the first region.

According to yet another aspect of one or more embodiments, there is provided an image sensor comprising a substrate having a first surface and a second surface, which are opposite to each other, the substrate having a trench provided on one of the first surface and the second surface; photoelectric conversion regions provided between the flat surface and the second surface of the substrate; color filters disposed on the second surface of the substrate; a fence pattern disposed between the color filters; a micro lens layer disposed on the color filters; impurity regions disposed in the substrate and adjacent to the first surface of the substrate; an interconnection layer disposed on the first surface of the substrate, the interconnection layer comprising lower insulating layers and an interconnection structure; an insulating pattern covering the trench of the substrate; and a doped region provided in the substrate and in contact with the insulating pattern, wherein the insulating pattern comprises a first surface and a second surface, which have inclination angles different from each other, the doped region comprises a first portion on the first surface of the insulating pattern; and a second portion on the second surface of the insulating pattern, a thickness of the second portion of the doped region is from 85% to 115% of a thickness of the first portion of the doped region, and a number of dopants per unit area in the second portion of the doped region is from 85% to 115% of a number of dopants per unit area in the first portion.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 14B is a plan view illustrating color filters, which are arranged in an image sensor according to an embodiment.

DETAILED DESCRIPTION

Example embodiments will now be described more fully with reference to the accompanying drawings, in which example embodiments are shown.

Figure 1:
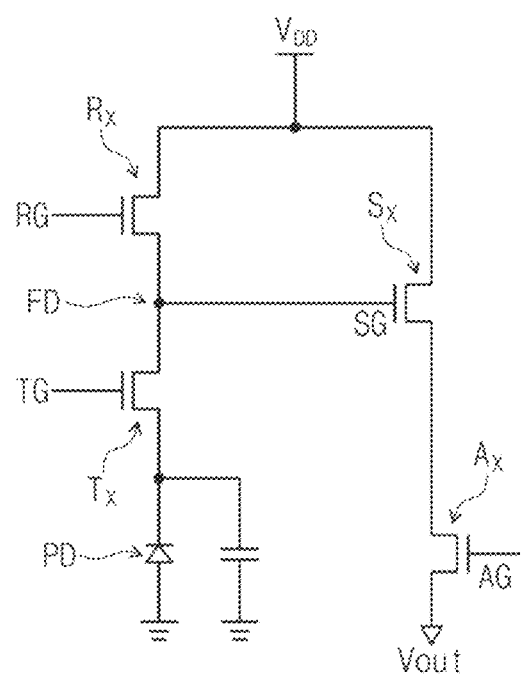
FIG. 1 is a circuit diagram of a pixel of an image sensor according to an embodiment.

FIG. 1 is a circuit diagram of a pixel of the image sensor according to an embodiment.

Referring to FIG. 1, each of the pixels of the image sensor may include a photoelectric conversion region PD, a transfer transistor Tx, a source-follower transistor Sx, a reset transistor Rx, and a selection transistor Ax. The transfer transistor Tx, the source-follower transistor Sx, the reset transistor Rx, and the selection transistor Ax may include a transfer gate TG, a source-follower gate SG, a reset gate RG, and a selection gate AG, respectively.

The photoelectric conversion region PD may be a photodiode including an n-type impurity region and a p-type impurity region. A floating diffusion region ED may serve as a drain electrode of the transfer transistor Tx. The floating diffusion region ED may serve as a source electrode of the reset transistor Rx. The floating diffusion region ED may be electrically connected to the source-follower gate SG of the source-follower transistor Sx. The source-follower transistor Sx may be connected to the selection transistor Ax.

Hereinafter, an operation of the image sensor will be described with reference to FIG. 1. In a light-blocking state, electric charges may be discharged from the floating diffusion region FD by applying a power voltage VDD to drain electrodes of the reset and source-follower transistors Rs and Sx and turning on the reset transistor Rx. Next, the reset transistor Rx may be turned off, and then electron-hole pairs may be produced in the photoelectric conversion region PD by an external light incident from the outside. The holes may be moved to and accumulated in the p-type impurity region of the photoelectric conversion region PD, and the electrons may be moved to and accumulated in the n-type impurity region of the photoelectric conversion region PD. In this state, if the transfer transistor Tx is turned on, the electric charges, such as the elections and holes, may be transferred to and accumulated in the floating diffusion region FD. A change in the accumulated charge amount may lead to a change in gate bias of the source-follower transistor Sx and consequently a change in source potential of the source follower transistor Sx. In this case, if the selection transistor Ax is turned on, an amount of the electric charges may be read out as a signal to be transmitted through a column line.

An interconnection line may be electrically connected to at least one of the transfer gate TG, the source-follower gate SG, the reset gate RG, and the selection gate AG. The interconnection line may be configured to apply the power voltage VDD to the drain electrode of the reset transistor Rx or the drain electrode of the source-follower transistor Sx. The interconnection line may include the column line connected to the selection transistor Ax. The interconnection line may be a first conductive structure 830, which will be described with reference to FIGS. 7A and 15A.

Although the pixel of FIG. 1 is illustrated to have a single photoelectric conversion region PD and four transistors (i.e., Tx Rx, Ax, and Sx), embodiments are not thereto. For example, a plurality of pixels may be provided, and the reset transistor Rx, the source-follower transistor Sx, or the selection transistor Ax may be shared by adjacent one of the pixels. Thus, an integration density of the image sensor may be increased.

Figure 2A:
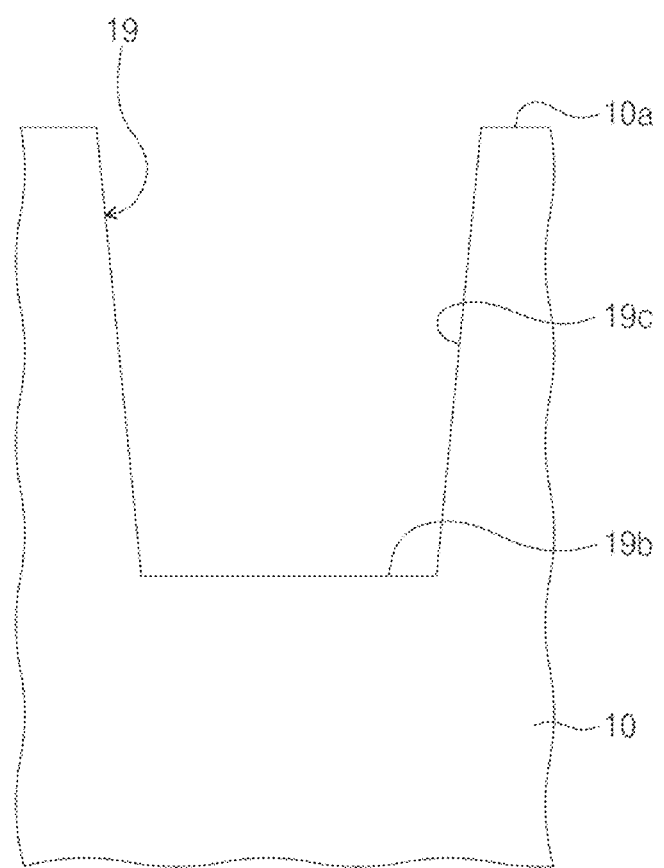
FIGS. 2A to 2D are sectional views illustrating a process of fabricating a semiconductor device with a doped region, according to an embodiment.
Figure 2B:
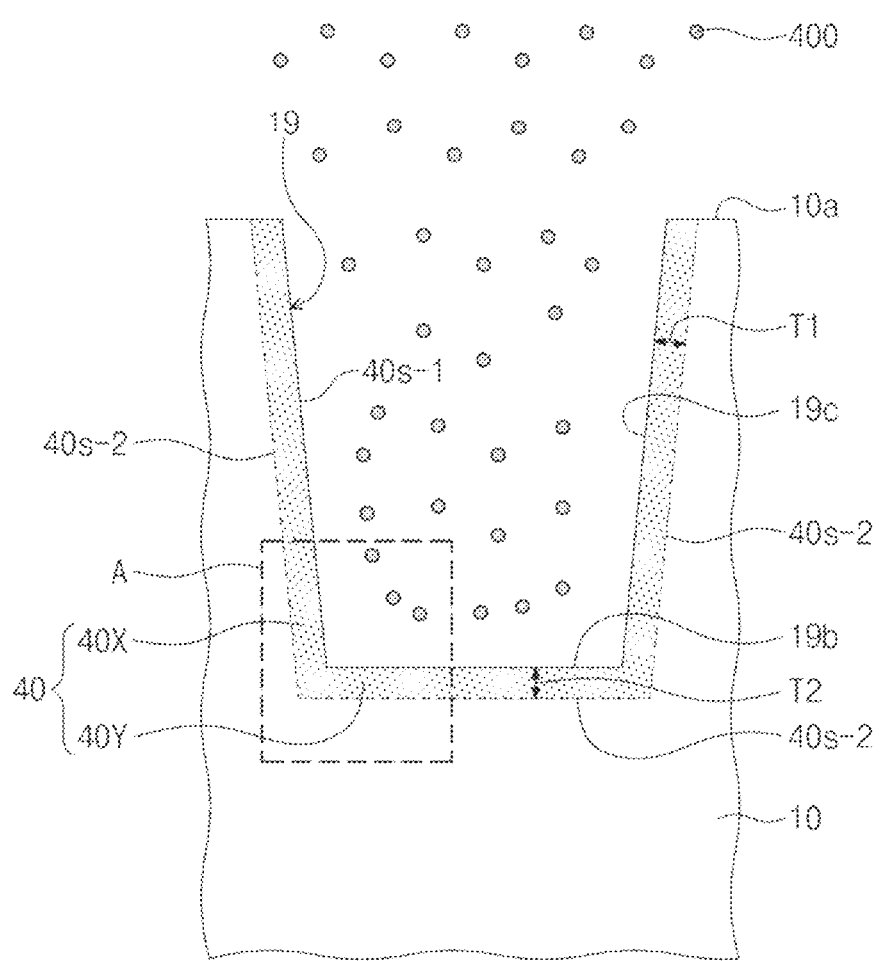
Figure 2C:
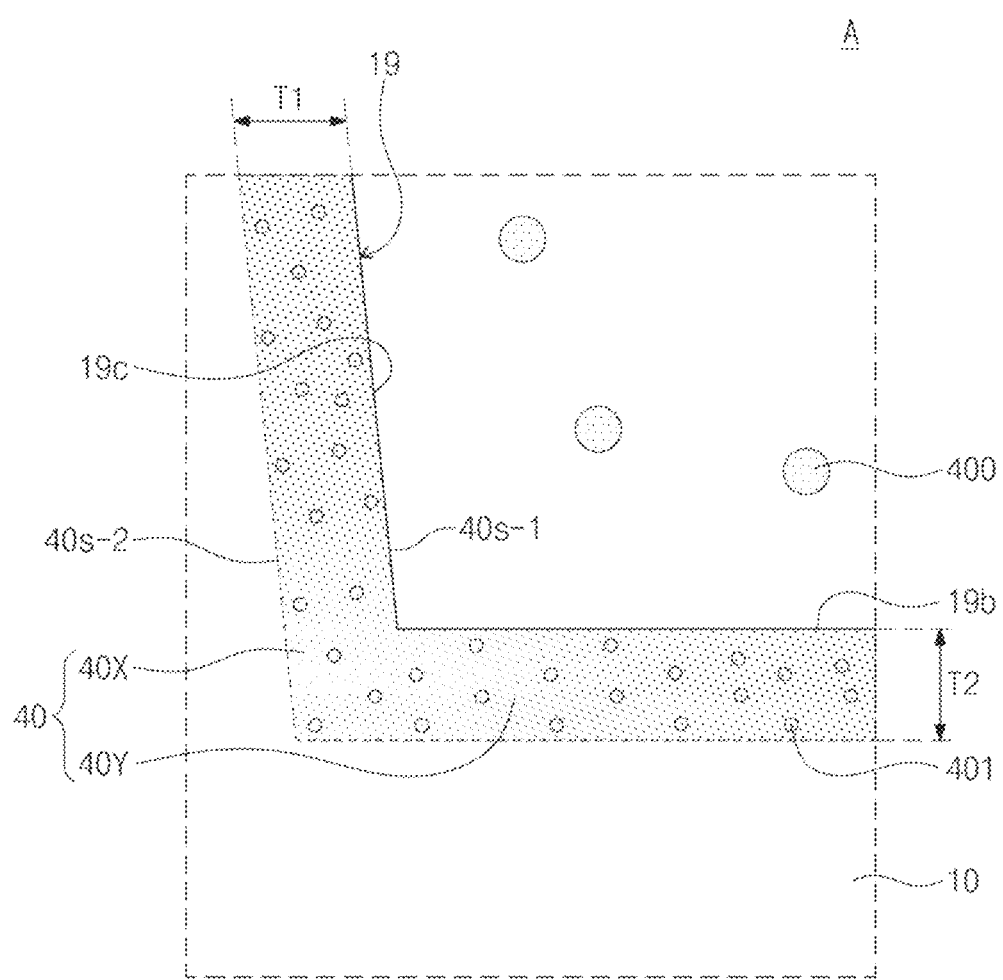

FIGS. 2A to 2D are sectional views illustrating a process of fabricating a semiconductor device with a doped region, according to an embodiment. FIG. 2C is an enlarged sectional view of a portion A of FIG. 2B, FIG. 3 is a flow chart illustrating a method of forming a doped region, according to an embodiment.

Referring to FIG. 2A, a substrate 10 may be prepared. In an embodiment, the substrate 10 may be a semiconductor substrate or a silicon-on-insulator (SOI) substrate. The semiconductor substrate may include, for example, a silicon substrate, a germanium substrate or a silicon-germanium substrate. The substrate 10 may have a crystalline structure. A trench 19 may be formed in a surface 10a of the substrate 10. The formation of the trench 19 may include an etching process performed on the substrate 10. During the formation of the trench 19, an interface defect may be formed on a side surface 19c and/or a bottom surface 19b of the trench 19. The interface defect may include oxide or dangling bonds. The trench 19 may include a first surface and a second surface whose inclination angles are different from each other. As an example, the first and second surfaces of the trench 19 may be the side surface 19c and the bottom surface 19b, respectively. The inclination angle of the side surface 19c of the trench 19 may be different from the inclination angle of the bottom surface 19b of the trench 19. For example, the bottom surface 19b of the trench 19 may be substantially parallel to the surface 10a of the substrate 10. The side surface 19c of the trench 19 may be inclined at an angle to the surface 10a of the substrate 10. The angle between the side surface 19c of the trench 19 and the surface 10a of the substrate 10 may be an obtuse angle and may be equal to or greater than 90° and may be smaller than 180°.

The first and second surfaces of the trench 19 may not be limited to the side surface 19c and the bottom surface 19b, respectively. Although not shown, the side surface 19c of the trench 19 may have a first surface and a second surface whose inclination angles are different from each other. The bottom surface 19b of the trench 19 may have a first surface and a second surface whose inclination angles are different from each other.

The substrate 10 may be disposed in a reactor (not shown). The reactor may be a batch-type reactor or a single-type reactor, the batch-type reactor may include a single gas supply line or a double gas supply line. The reactor may further include an exhausting line, a pump, or a scrubber.

Referring to FIGS. 2B, 2C, and 3, a doped region 40 may be formed in the substrate 10, along the side and bottom surfaces 19c and 19b of the trench 19. The doped region 40 may be formed by a gas phase doping (GPD) method. For example, the formation of the doped region 40 may include performing a first purge process (in S10), performing a GPD process (in S20), and performing a second purge process (in S30).

The first purge process (in S10) may be performed by supplying a hydrogen purge gas onto the surface 10a of the substrate 10 and into the trench 19. The hydrogen purge gas may remove the interface defect of the trench 19 described in FIG. 2A. Thus, it may be possible to prevent migration of a semiconductor material (e.g., silicon) caused by the interface defect. The first purge process may be performed under a temperature condition of about 200° C. to about 700° C. and a pressure condition of 20 Pa to 2000 Pa for 1 sec to 480 min. In an embodiment, an inactive gas, such as a nitrogen gas, may be used as a carrier gas. In the first purge process, a flow rate of the hydrogen purge gas and the inert gas may range from 0.01 sccm to 2000 sccm.

The GPD process may be performed after the first purge process is completed. The GPD process (in S20) may include supplying a doping gas 400 onto the side and bottom surfaces 19c and 19b of the trench 19. Here, the doping gas 400 may contain at least one of group 3 elements (e.g., aluminum (Al), boron (B), indium (In), and of gallium (Ga). As an example, the doping, gas 400 may include a boron-containing gas (e.g., $BCl_3$ or $B_2H_6$). As another example, the doping gas 400 may include $BF_3$. The GPD process may be performed under a temperature condition that is higher than a process temperature of the first purge process. For example, the GPD process may be performed under a temperature condition of about 200° C. to about 800° C. The GPD process may be performed under a pressure condition of 20 Pa to 2000 Pa for 1 sec to 480 min. A carrier gas and a hydrogen gas, along with the doping gas 400, may be supplied into the reactor. An inactive gas, such as a nitrogen gas, may be used as the carrier gas, in the GPD process. In the GPD process, the total flow rate of the hydrogen gas, the doping gas 400, and the carrier gas may range from 0.01 sccm to 2000 sccm. The doping gas 400 may be injected into the substrate 10 through the side and bottom surfaces 19c and 19b of the trench 19, during the GPD process. Thus, the doped region 40 may be formed in the substrate 10 and along the side and bottom surfaces 19c and 19b of the trench 19. The doped region 40 may include a dopant 401. The dopant 401 may include at least one of group 3 elements. As an example, the dopant 401 may include boron (B). As another example, the dopant 401 may include aluminum (Al), indium (In), and/or gallium (Ga). As another example, the doping gas 400 and the dopant 401 may include a group 5 element.

In the case where the doped region 40 is formed by an ion implantation process or a plasma injection process as in the related art, it may be difficult to control an injection position and a dopant concentration of the dopant 401. In this case, the doped region 40 may be formed to have a non-uniform thickness and a non-uniform doping profile. Furthermore, the doped region 40 may have a relatively large thickness and a relatively high dopant concentration.

By contrast, in the formation of the doped region according to various embodiments, since the doped region 40 is formed by the GPD process, the doping gas 400 may be conformally injected into the substrate 10 (i.e., uniformly along the side and bottom surfaces 19c and 19b of the trench 19. Thus, the doped region 40 may be formed to have a substantially constant thickness, along the side and bottom surfaces 19c and 19b of the trench 19. For example, the thickness of the doped region 40 may have a tolerance of 15% or less. In the present specification, a tolerance of a process parameter may denote a difference between the highest and lowest values of the process parameter. The doped region 40 may include a side portion 40X and a bottom portion 40Y. The side portion 40X of the doped region 40 may be provided along the side surface 19c of the trench 19 to be in contact with the side surface 19c of the trench 19. The side portion 40X of the doped region 40 may have a first thickness T1, which is substantially uniform. For example, the tolerance of the first thickness T1 may be equal to or less than 15%. The bottom portion 40Y of the doped region 40 may be provided along the bottom surface 19b of the trench 19 and may be in contact with the bottom surface 19b of the trench 19. The bottom portion 40Y of the doped region 40 may be connected to the side portion 40X. The bottom portion 40Y of the doped region 40 may have a second thickness T2. The second thickness T2 may be substantially uniform. For example, the tolerance of the second thickness T2 may be equal to or less than 15%. The second thickness T2 may be equal or similar to the first thickness T1. For example, in some embodiments, the second thickness T2 may be from 85% to 115% of the first thickness T1.

Since the doped region 40 is formed by the GPD process, it may be possible to form the doped region 40 to a smaller thickness than possible using the ion implantation process or the plasma injection process of the related art. For example, the first thickness T1 may range from about 30 nm to about 180 nm, and the second thickness T2 may range from about 30 nm to about 180 nm.

Since the doped region 40 is formed by the GPD process, the doped region 40 may be formed to have a uniform doping profile. The doped region 40 may have a uniform doping concentration. For example, the concentration of the dopant 401 in the doped region 40 may have a tolerance of 15% or less. For example, the concentration of the dopant 401 in the side portion 40X may have a tolerance of 15% or less. The concentration of the dopant 401 in the bottom p ion 401 may have a tolerance of 15% or less. The concentration of the dopant 401 in the bottom portion 40Y may be from 85% to 115% of the concentration of the dopant 401 in the side portion 40X. In the present specification, the concentration of the dopant 401 may be expressed in terms of the number of the dopant 401 per unit area. For example, the number of the dopant 401 per unit area, in the side portion 40X of the doped region 40, may be from 85% to 115% of the number of the dopant 401 per unit area, in the bottom portion 40Y.

The doped region 40 may have a first surface 40s-1, which is exposed to the trench 19, and a second surface 40s-2, which is opposite to the first surface 40s-1 and in contact with the substrate 10. The concentration of the dopant 401 may have the highest value at one of the first surface 40s-1 and the second surface 40s-2 of the doped region 40. The concentration of the dopant 401 may have the lowest value at an intermediate position between the first surface 40s-1 and the second surface 40s-2 of the doped region 40.

Since the doped region 40 is formed by the GPD process, it may be possible to easily control the concentration of the dopant 401 in the doped region 40. The concentration of the dopant 401 in the doped region 40 may have a relatively low value. The number of the dopant 401 per unit area in the doped region 40 may range from $5.0 \times 10^{11}$ atoms/cm$^2$ to $1.0 \times 10^{14}$ atoms/cm$^2$. The number of the dopant 401 per unit area in the side portion 40X may range from $5.0 \times 10^{11}$ atoms/cm$^2$ to $1.0 \times 10^{14}$ atoms/cm$^2$, and the number of the dopant 401 per unit area in the bottom portion 40Y may range from $5.0 \times 10^{11}$ atoms/cm$^2$ to $1.0 \times 10^{14}$ atoms/cm$^2$.

The doped region 40 may further include an extended portion (not shown), which is in contact with the surface 10a of the substrate 10.

The second purge process (in S30) may be performed after the GPD process is completed. The second purge process (in S30) may include supplying an oxygen purge gas onto the doped region 40. The second purge process may be performed at a temperature that is lower than the process temperature of the GPD process and that is higher than the process temperature of the first purge process. For example, the second purge process may be performed under a temperature condition of about 200° C. to about 800° C. The second purge process may be performed under a pressure condition of 20 Pa to 2000 Pa for 1 sec to 480 min. The oxygen purge gas may be supplied into the reactor, along with a carrier gas. An inactive gas, such as a nitrogen gas, may be used as the carrier gas in the second purge process. In the second purge process, the total flow rate of the oxygen purge gas and the carrier gas may range from 0.01 sccm to 2000 sccm.

The second purge process may prevent the doping gas 400 or the dopant 401, which are injected into the substrate 10, from being exhausted to the outside. In other words, the second purge process may prevent an outgassing or out-diffusion issue of the supplied doping gas 400. During the second purge process in S30), an exposed surface of the doped region 40 may be oxidized. A thickness of the oxidized portion may range from 1 Å to 30 Å but is not limited to this range.

In an embodiment, at least one of the first purge process (in S10) and the second purge process (in S30) may be omitted.

Figure 2D:
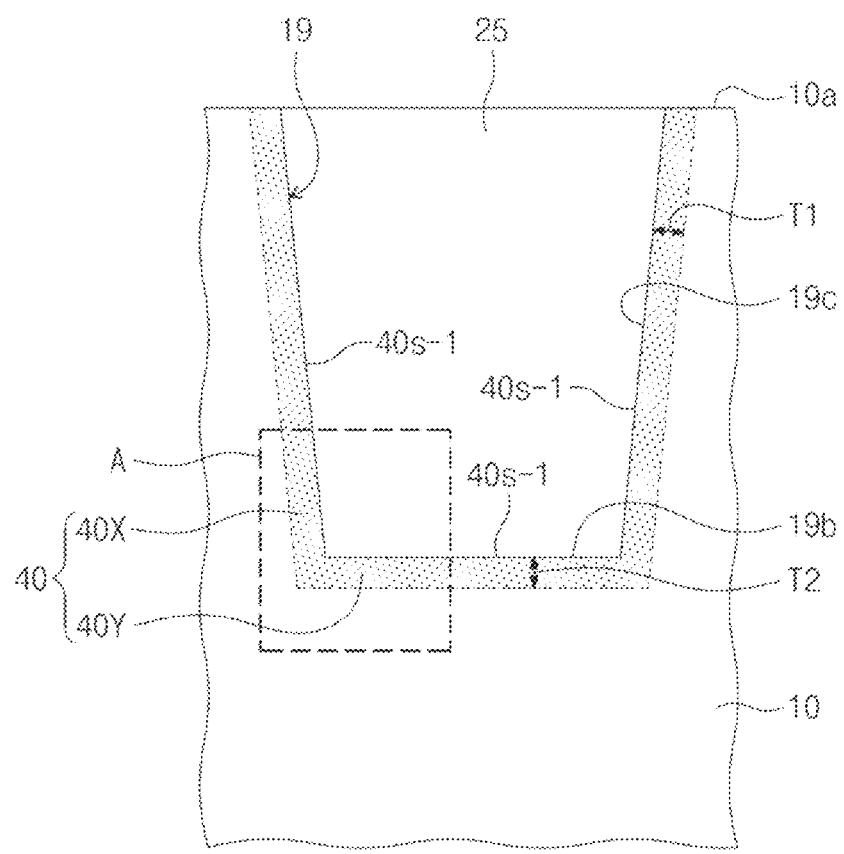
Figure 3:
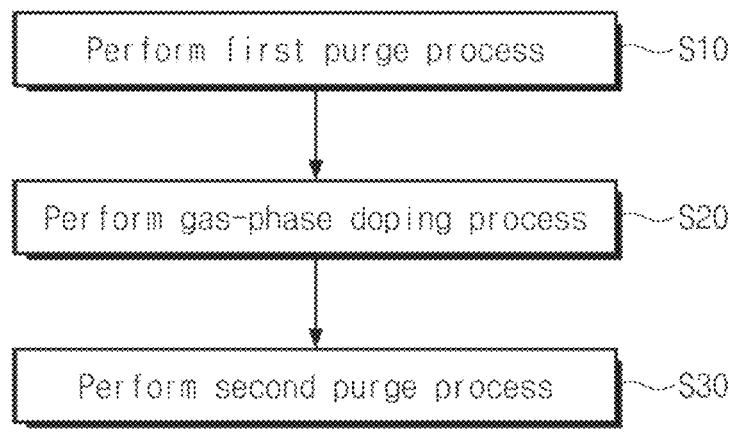
FIG. 3 is a flow chart illustrating a method of forming a doped region, according to an embodiment.

Referring to FIG. 2D, a gapfill pattern 25 may be formed in the trench 19 to cover the doped region 40. The gapfill pattern 25 may be provided on the side and bottom surfaces 19c and 19b of the trench 19 to fill the trench 19. Each of the side and bottom portions 40X and 40Y of the doped region 40 may have a first surface 40s-1 that is exposed to the trench 19. The exposed first surfaces 40s-1 of the side and bottom portions 40X and 40Y of the doped region 40 may be in contact with the gapfill pattern 25. The exposed surface of the side portion 40X of the doped region 40 may correspond to the side surface 19c of the trench 19. The exposed surface of the bottom portion 40Y of the doped region 40 may correspond to the bottom surface 19b of the trench 19. The gapfill pattern 25 may be formed of or include at least one of, for example, conductive, insulating, or semiconductor materials. The gapfill pattern 25 may be a gate electrode, a device isolation layer, or a deep trench isolation layer. Although not shown, an insulating pattern may be further formed between the gapfill pattern 25 and the doped region 40.

Figure 2E:
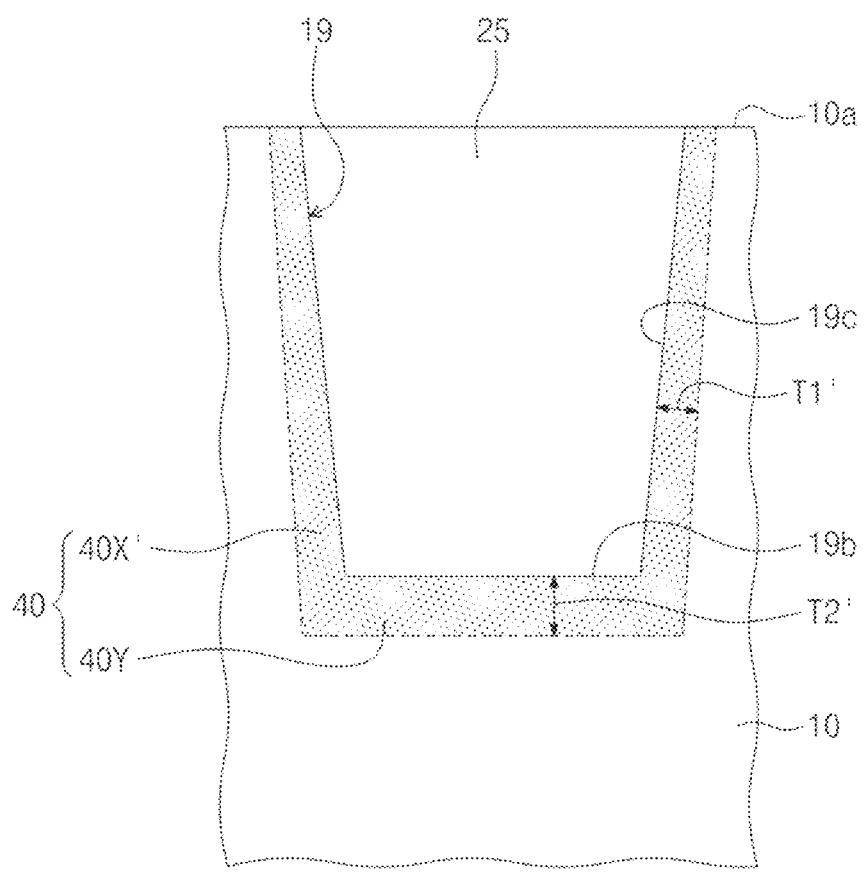
FIG. 2E is a sectional view illustrating a semiconductor device with a doped region, according to an embodiment.

FIG. 2E is a sectional view illustrating a semiconductor device with a doped region, according to an embodiment.

Referring to FIG. 2E, the semiconductor device may include the substrate 10, the doped region 40, and the gapfill pattern 25. The semiconductor device may be an image sensor. The substrate 10, the doped region 40, and the gapfill pattern 25 may be formed by substantially the same method as that in the embodiments of FIGS. 2A to 2D and FIG. 3. However, in an embodiment illustrated in FIG. 2E, a thickness T2' of the bottom portion 40Y of the doped region 40 may be larger than a thickness T1' of the side portion 40X. A side portion 40X' of the doped region 40 may include upper and lower portions. The lower portion of the side portion 40X' of the doped region 40 may be disposed between the upper portion of the side portion 40X' and the bottom portion 40Y. The upper portion of the side portion 40X' of the doped region 40 may have a thickness that is smaller than the lower portion of the side portion 40X'. For example, the thickness T1' of the side portion 40X' of the doped region 40 may decreased with decreasing distance to the top surface of the doped region 40. In other words, the thickness T1' of the side portion 40X' may describes as a distance from the surface 10a decreases such that the thickness T1' near the bottom portion 40Y is greater than the thickness T1' near the surface 10a. In an embodiment, since the doped region 40 is formed by the GPD process, the bottom portion 40Y of the doped region 40 may be formed in such a way that the thickness T2' is larger than the thickness T1' of the side portion 40X'. The concentration of the dopant in the doped region 40 may be the same as that in the previous embodiment.

Figure 4A:
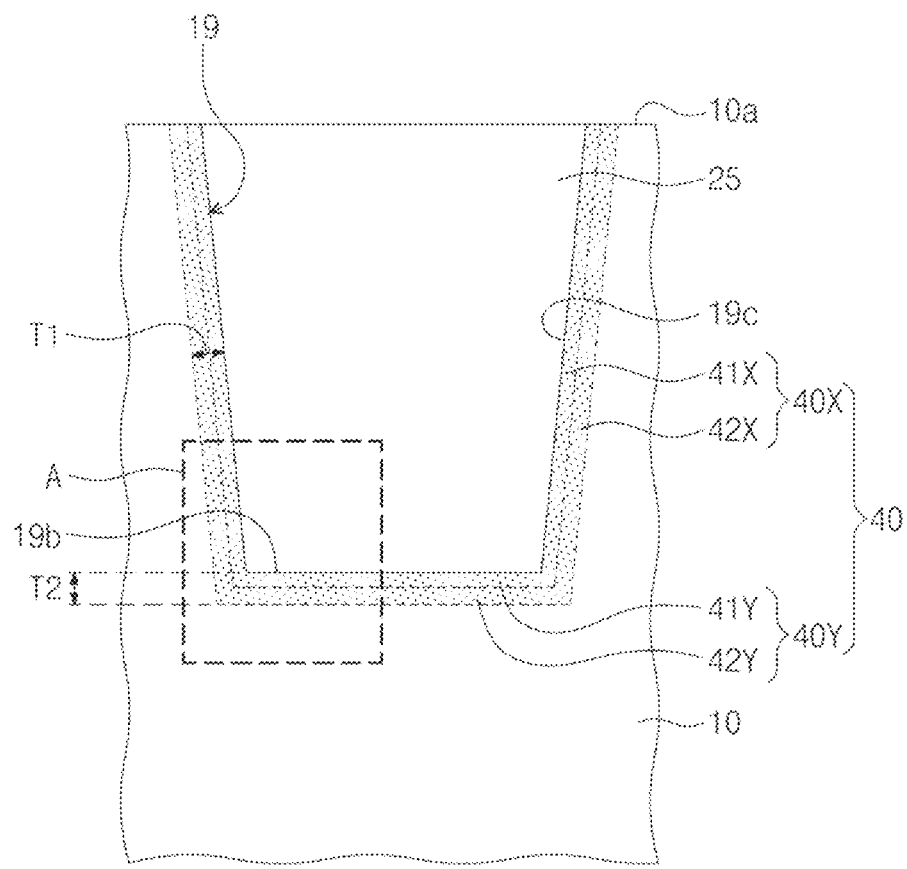
FIG. 4A is a sectional view illustrating a semiconductor device including a doped region according to an embodiment.
Figure 4B:
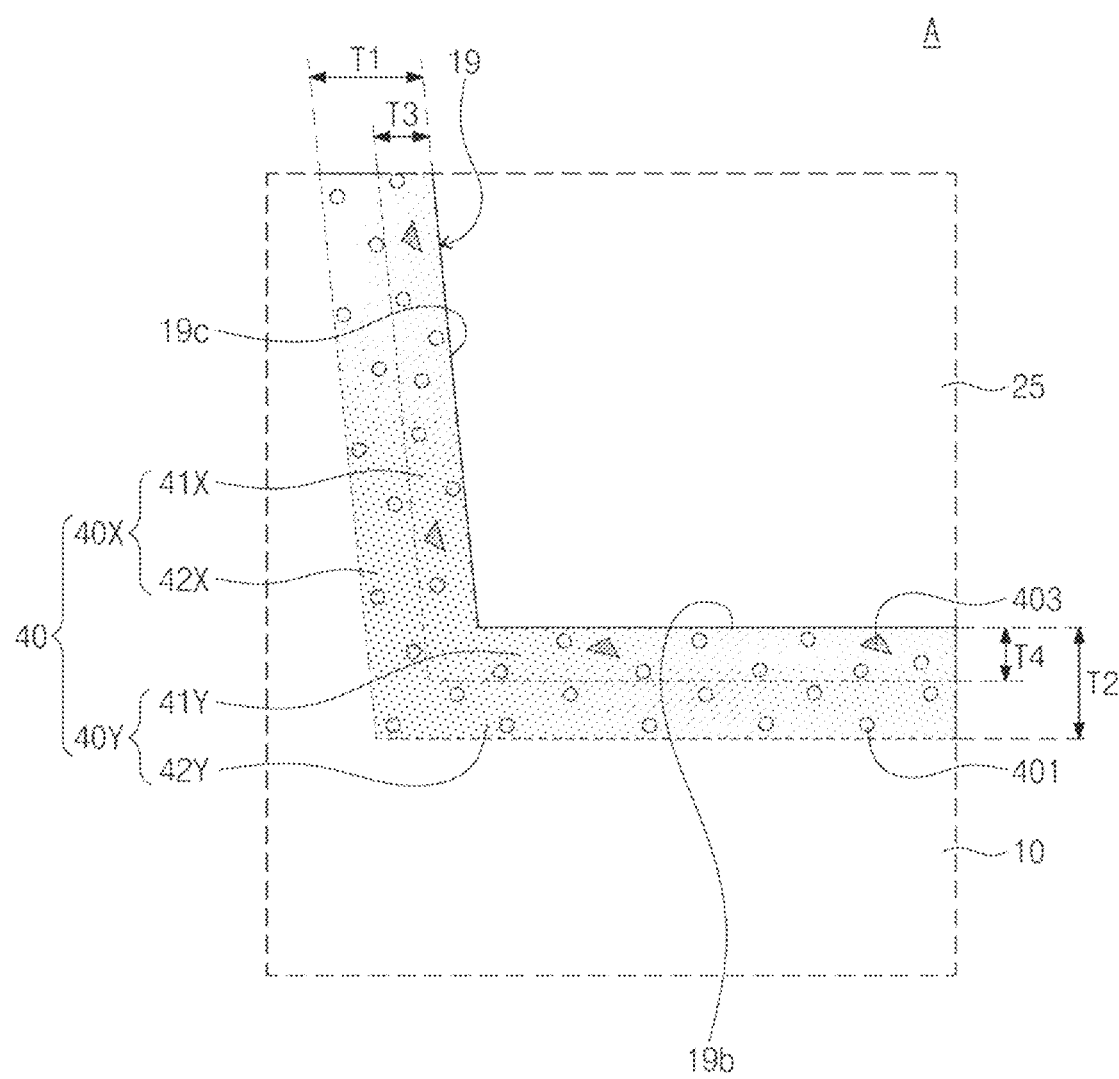
FIG. 4B is an enlarged sectional of a portion A of FIG. 4A.

FIG. 4A is a section view illustrating a semiconductor device including a doped region according to an embodiment. FIG. 4B is an enlarged sectional view of a portion A of FIG. 4A.

Referring to FIGS. 4A and 4B, the semiconductor device may include the substrate 10, the doped region 40, and the gapfill pattern 25. The substrate 10, the doped region 40, and the gapfill pattern 25 may be formed by substantially the same method as that in the embodiments of FIGS. 2A to 2D and FIG. 3. The doped region 40 may be formed by, for example, the GPD process.

The side portion 40X of the doped region 40 may include a first region 41X and a second region 42X. The first region 41X of the side portion 40X of the doped region 40 may be in contact with the side surface 19c of the trench 19. For example, the second region 42X of the side portion 40X of the doped region 40 may be interposed between the substrate 10 and the first region 41X. The bottom portion 40Y of the doped region 40 may include a first region 41Y and a second region 42Y. The first region 41Y of the bottom portion 40Y of the doped region 40 may be in contact with the bottom surface 19b of the trench 19. The first region 41Y of the bottom portion 40X of the doped region 40 may be connected to the first region 41X of the side portion 40X of the doped region 40. The second region 42Y of the bottom portion 40Y of the doped region 40 may be interposed between the substrate 10 and the first region 41Y of the bottom portion 40Y. The second region 42Y of the bottom portion 40Y of the doped region 40 may be connected to the second region 42X of the side portion 40X. Hereinafter, the first regions 41X and 41Y of the doped region 40 may indicate a region including the first region 41X of the side portion 40X and the first region 41Y of the bottom portion 40Y, unless the context clearly indicates otherwise. Similarly, the second regions 42X and 42Y of the doped region 40 may mean the second region 42X of the side portion 40X and the second region 42Y of the bottom portion 40Y. The second regions 42X and 42Y of the doped region 40 may be peripheral regions, which enclose the first regions 41X and 41Y.

The first regions 41X and 41Y of the doped region 40 may be an auxiliary element region. For example, as shown in FIG. 4B, the first regions 41X and 41Y of the doped region 40 may include the dopant 401 and a first auxiliary element 403. The first auxiliary element 403 may be an element different from the dopant 401. For example, the first auxiliary element 403 may be chlorine. As another example, the first auxiliary element 403 may include fluorine or hydrogen. The first regions 41X and 41Y of the doped region 40 may be thinner than the doped region 40. For example, a thickness T3 of the first region 41X of the side portion 40X of the doped region 40 may be smaller than a thickness T1 of the side portion 40X at a corresponding position. A thickness T4 of the first region 41Y of the bottom portion 40Y of the doped region 40 may be smaller than the thickness T2 of the bottom portion 40Y at a corresponding position. The thickness T3 of the first region 41X of the side portion 40X of the doped region 40 may have a tolerance of 15% or less. The thickness T4 of the first region 41Y of the bottom portion 40Y of the doped region 40 may have a tolerance of 15% or less. The thickness T3 of the first region 41X of the side portion 40X of the doped region 40 may be from 85% to 115% of the thickness T4 of the first region 41Y of the bottom portion 40Y.

The concentration of the first auxiliary element 403 in the first regions 41X and 41Y of the doped region 40 may be smaller than the concentration of the dopant 401 in the first regions 41X and 41Y. Thus, the electric characteristics of the image sensor may be improved. The concentration of the first auxiliary element 403 in the first region 41X of the side portion 40X of the doped region 40 may be from 85% to 115% of the concentration of the first auxiliary element 403 in the first region 41X of the bottom portion 40Y.

The second regions 42X and 42Y of the doped region 40 may include the dopant 401 but may omit the first auxiliary element 403. In other words, the first auxiliary element 403 may be omitted from the second regions 42X and 42Y of the doped region. The concentration of the dopant 401 in the second region 42X of the side portion 40X of the doped region 40 may be 85% to 115% of the concentration of the dopant 401 in the second region 42Y of the bottom portion 40Y. The concentration of the dopant 401 in the second regions 42X and 42Y of the doped region 40 may be higher than the concentration of the first auxiliary element 403 in the first regions 41X and 41Y.

The first and second thicknesses T1 and T2 of the doped region 40, the concentration of the dopant 401 in the side portion 40X, and the concentration of the dopant 401 in the bottom portion 40Y may be the same as those mentioned in the embodiment of FIGS. 2B and 2C.

Figure 5A:
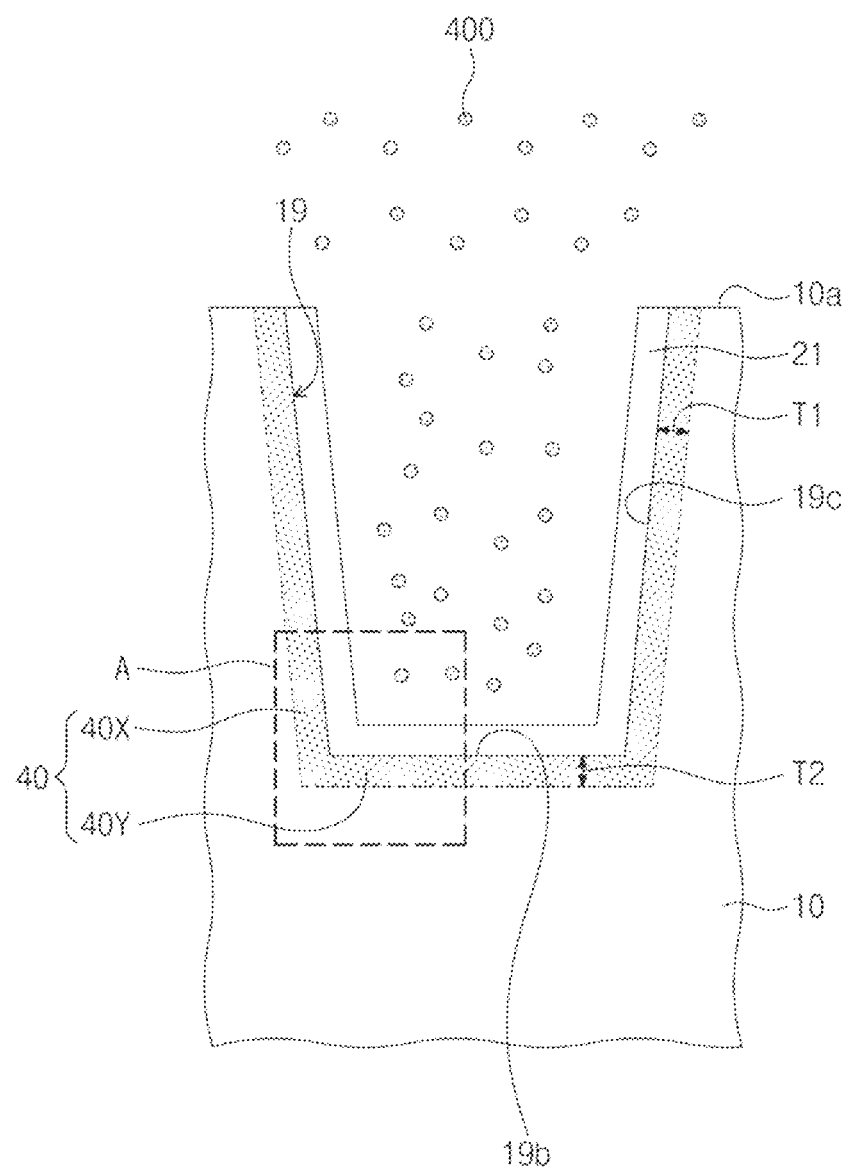
FIGS. 5A and 5C are sectional views illustrating a process of fabricating a semiconductor device, according to an embodiment.
Figure 5B:
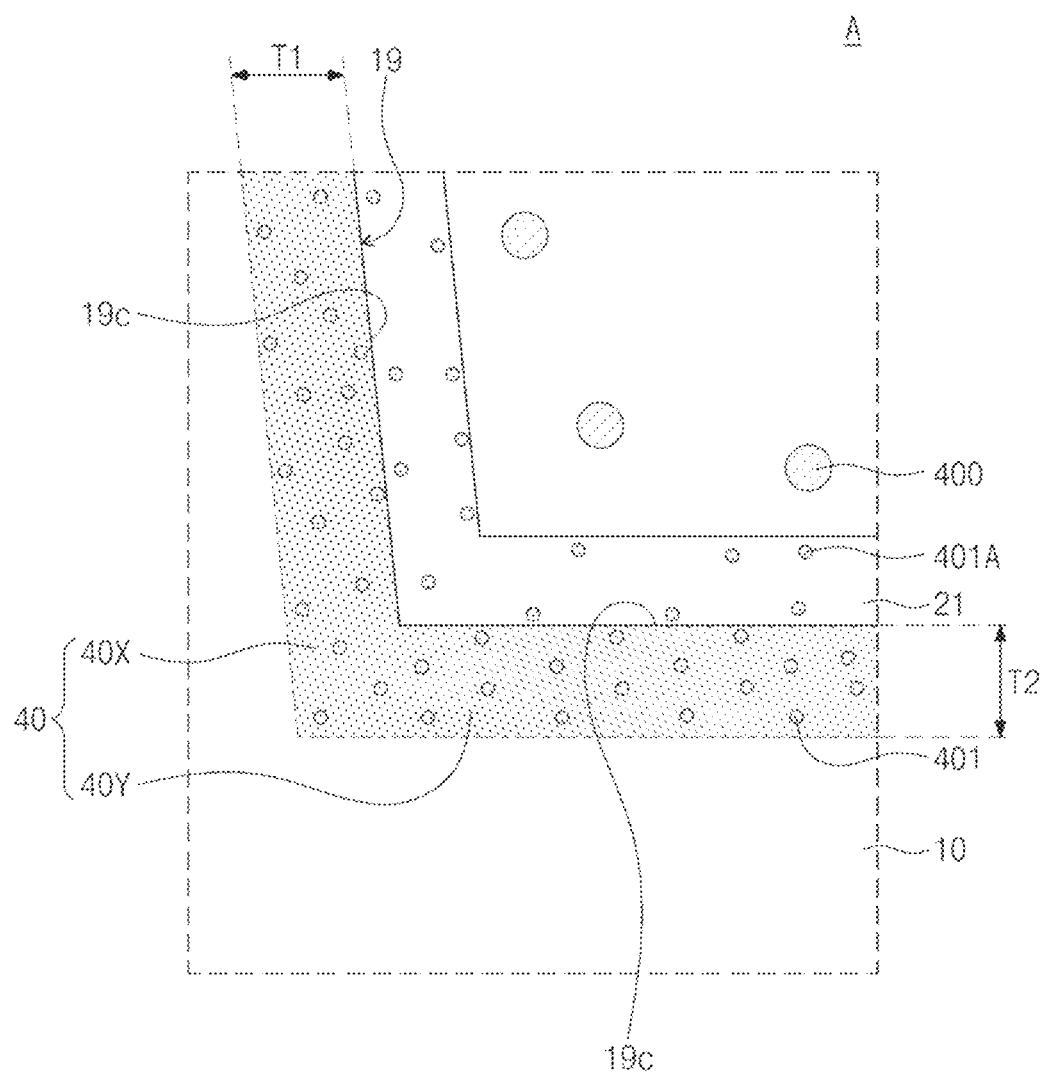
FIG. 5B is a enlarged sectional view of a portion A of FIG. 5A.
Figure 5C:
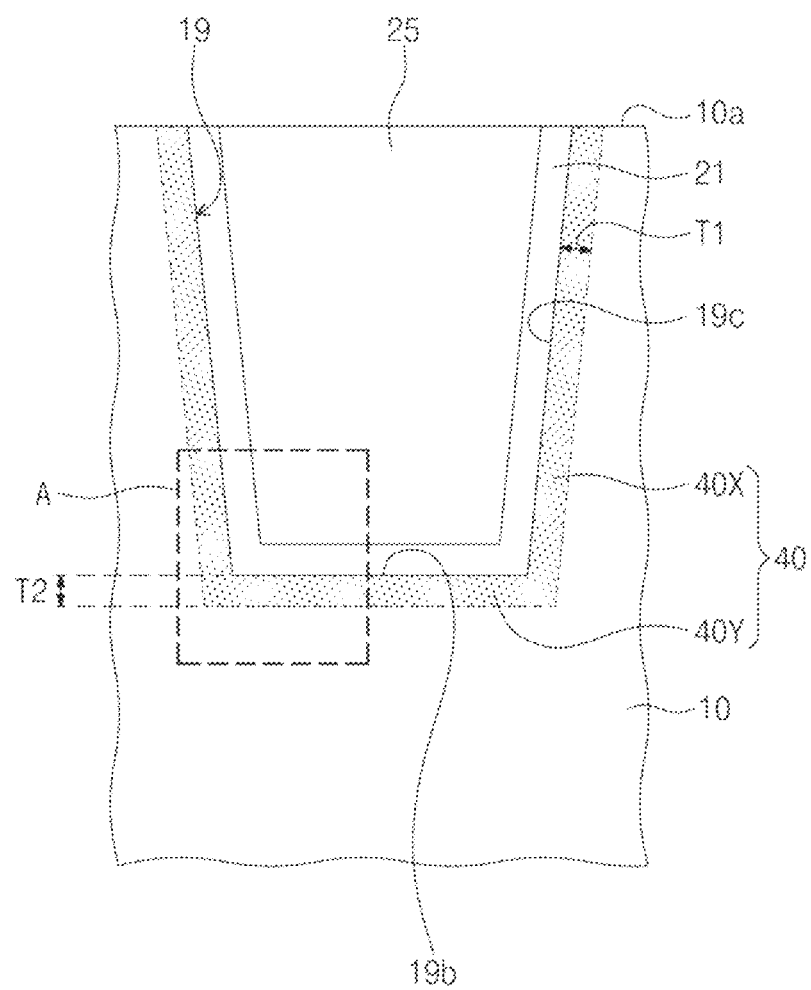

FIGS. 5A and 5C are sectional views illustrating a process of fabricating a semiconductor device, according to an embodiment. FIG. 5B is an enlarged sectional view of a portion A of FIG. 5A.

Referring to FIGS. 5A and 5B, the trench 19 may be formed in the surface 10a of the substrate 10. An insulating pattern 21 may be formed in the trench 19 to cover the bottom surface 19b and the side surface 19c of the trench 19. Although not shown, the insulating pattern 21 may be further extended onto the surface 10a of the substrate 10. The insulating pattern 21 may have an amorphous structure. For example, the insulating pattern 21 may be formed of or include at least one of silicon-based insulating materials (e.g., silicon oxide). As another example, the insulating pattern 21 may be formed of or include at least one of high-k dielectric materials (e.g., hafnium oxide and/or aluminum oxide).

The formation of the doped region 40 may be performed by substantially the same method as described in the embodiment of FIGS. 2B to 2C. However, in an embodiment, the GPD process may be performed after the formation of the insulating pattern 21. The doping gas 400 may be provided on the insulating pattern 21. In this case, the doped region 40 may be formed by the doping gas 400 that is supplied into the substrate 10 through the insulating pattern 21. Thus, as shown in FIG. 5B, the doped region 40 may include the dopant 401, and the insulating pattern 21 may include a first additional element 401A. The first additional element 401A may be the same element as the dopant 401 in the doped region 40. For example, the first additional element 401A may be a group 3 element, such as boron. As another example, the first additional element 401A may include a group 5 element. Since the insulating pattern 21 has the amorphous structure and serves as an insulator, the first additional element 401A may not serve as a dopant in the insulating pattern 21. The first additional element 401A may be distributed in the insulating pattern 21 to be adjacent to the doped region 40 or the trench 19. The concentration of the dopant 401 in the doped region 40 and the first and second thicknesses T1 and T2 of the doped region 40 may be the same as those previously described with reference to FIGS. 2B and 2C.

Referring to FIG. 5C, the gapfill pattern 25 may be formed in the insulating pattern 21 to fill the trench 19. The insulating pattern 21 may be interposed between the doped region 40 and the gapfill pattern 25.

Figure 5D:
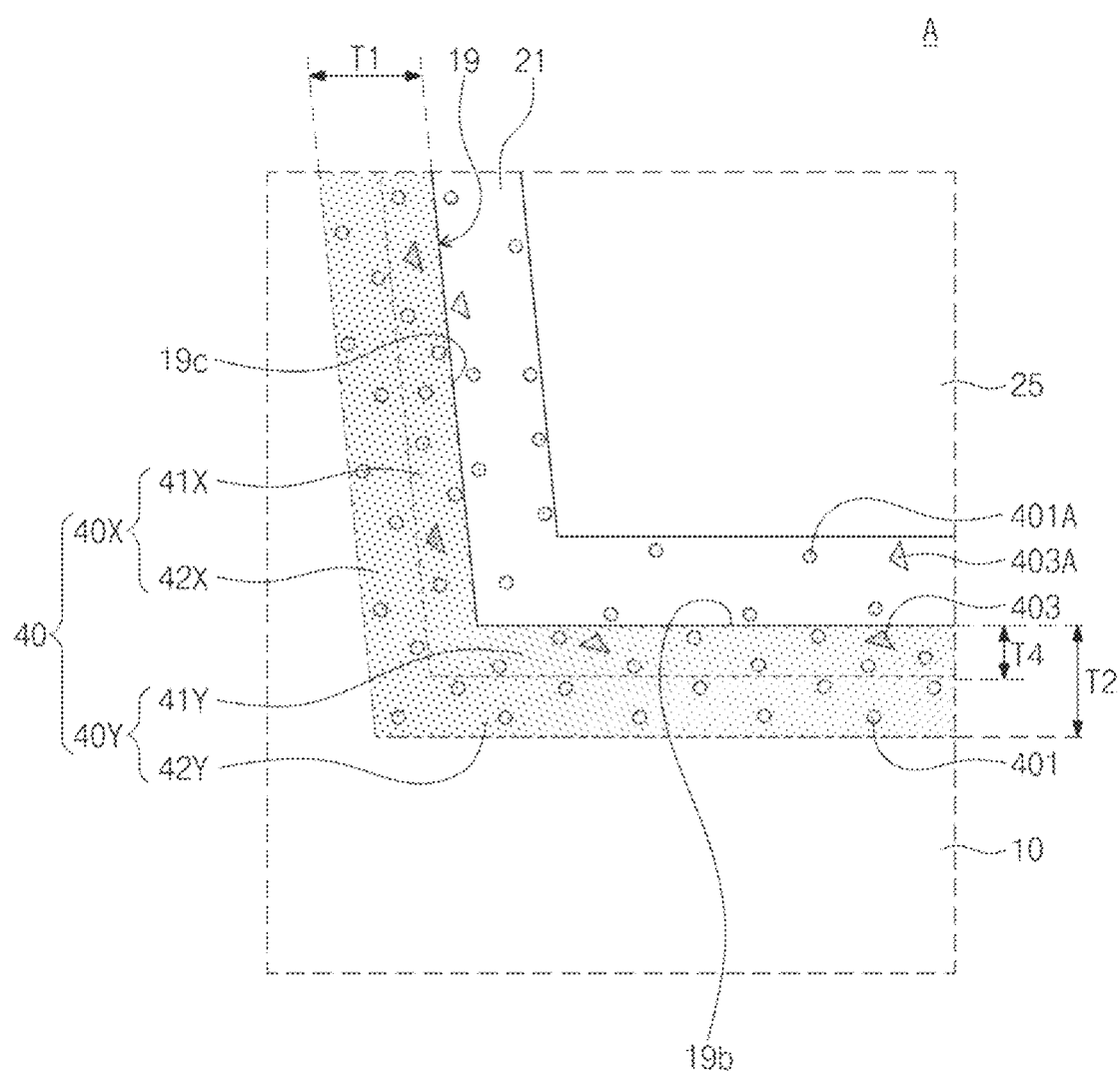
FIG. 5D is a sectional view illustrating a doped region according to an embodiment and a process of forming the doped region.

FIG. 5D illustrates an enlarged shape of a portion A of FIG. 5C, and hereinafter, the doped region and the forming method of the doped region will be described in more detail with reference to FIGS. 5C and 5D.

Referring to FIGS. 5C and 5D, the doped region 40 may include the first regions 41X and 41Y and the second regions 42X and 42Y. The first regions 41X and 41Y and the second regions 42X and 42Y of the doped region 40 may be formed to have substantially the same features as the first regions 41X and 41Y and the second regions 42X and 42Y in the embodiment of FIGS. 4A and 4B.

The insulating pattern 21 may be formed in the trench 19 of the substrate 10. A GPD process may be performed on the insulating pattern 21 to form the doped region 40. The insulating pattern 21 may further include a second auxiliary element 403A, in addition to the first additional element 401A. The first additional element 401A may be the same element as the dopant 401 in the doped region 40. The second auxiliary element 403A may be the same element as the first auxiliary element 403 in the first regions 41X and 41Y. The concentration of the second auxiliary element 403A may be lower than the concentration of the first additional element 401A, but embodiments are not limited to this example.

Figure 6:
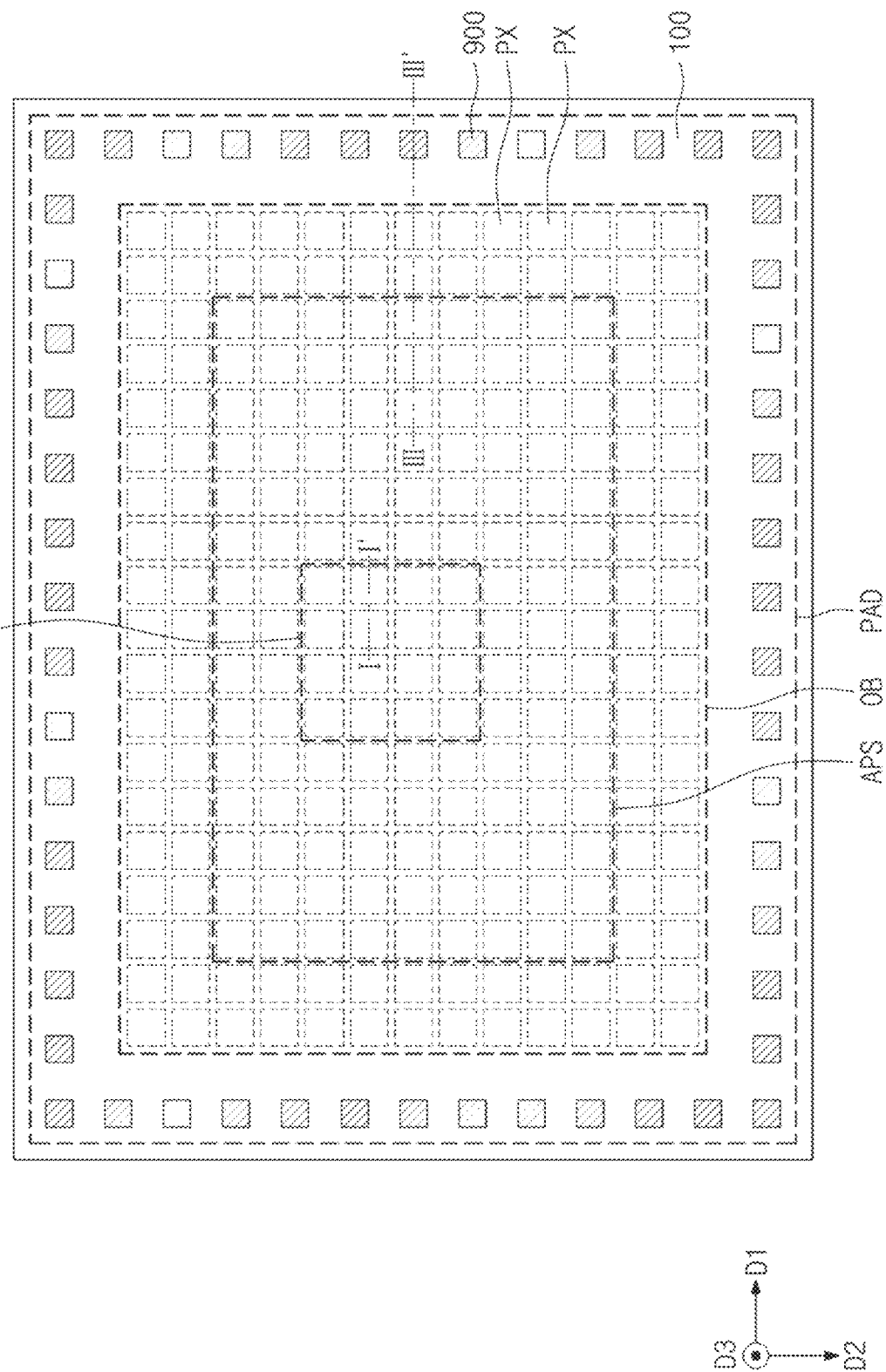
FIG. 6 is a plan view illustrating an image sensor according to an embodiment.
Figure 7A:
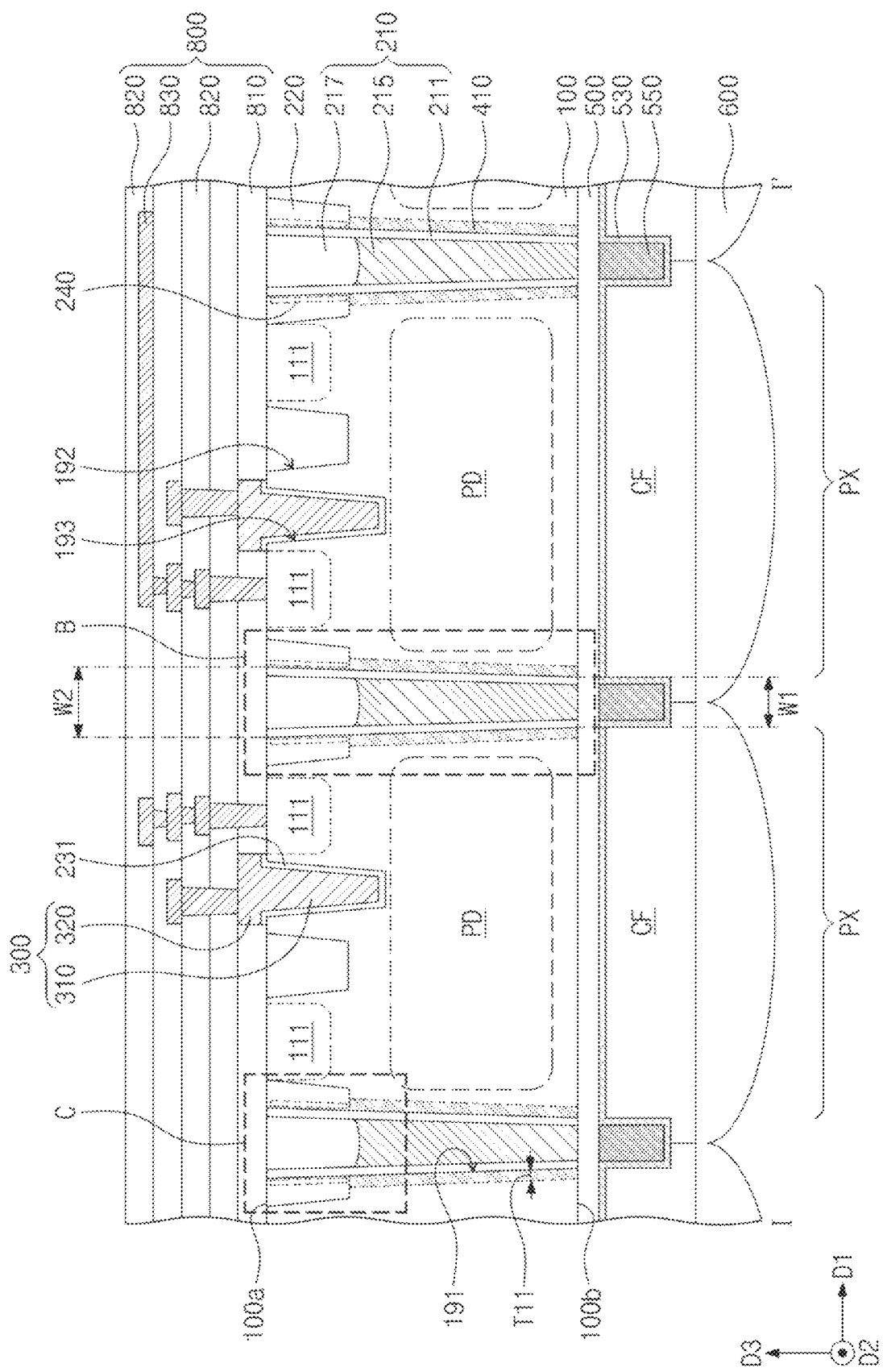
FIG. 7A is a sectional view taken along a line of FIG. 6.
Figure 7B:
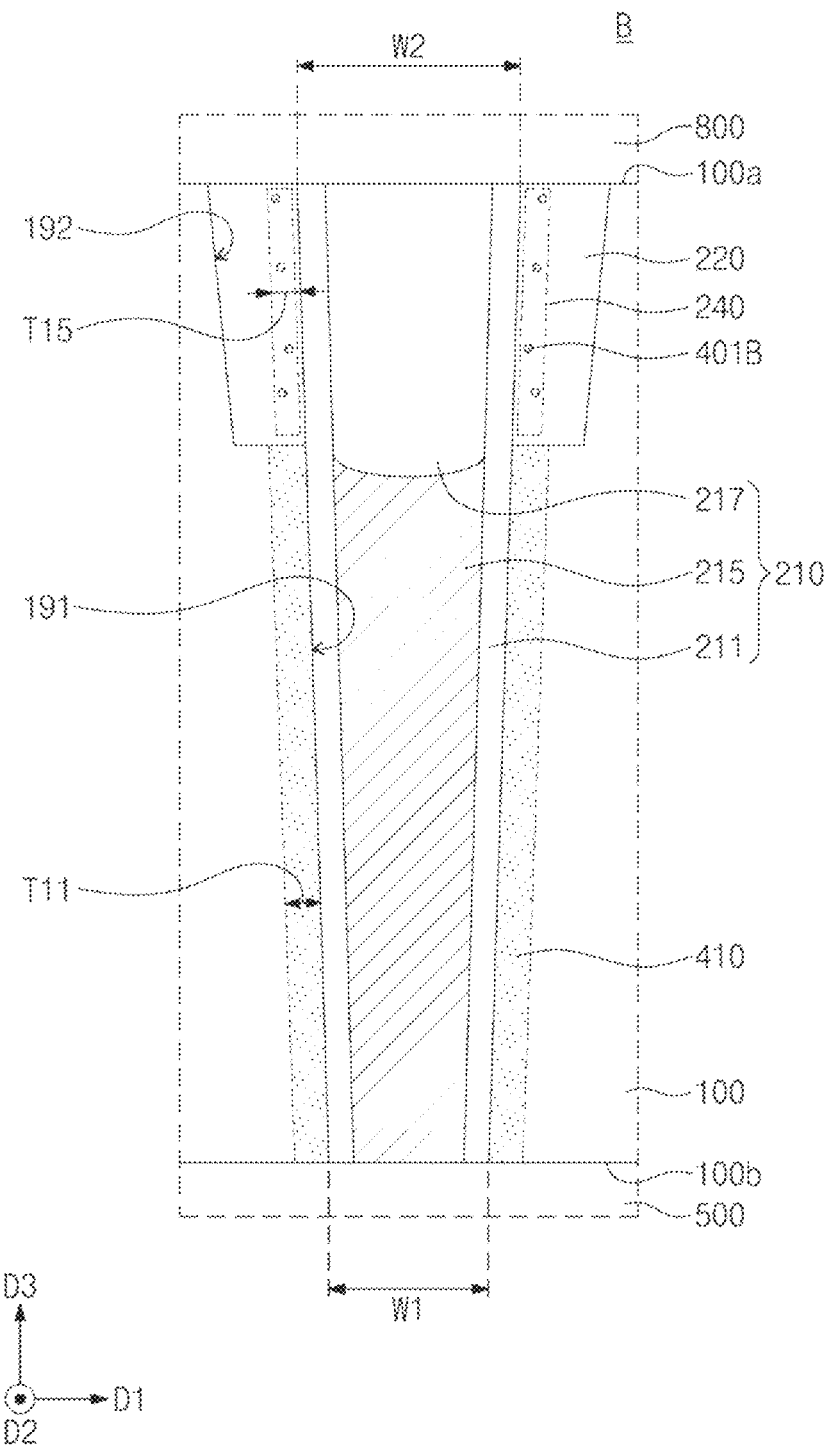
FIG. 7B is an enlarged sectional view illustrating a portion B of FIG. 7A.

FIG. 6 is a plan view illustrating an image sensor according to an embodiment. FIG. 7A is a sectional view taken along a line I-I' of FIG. 6. FIG. 7B is an enlarged sectional view illustrating a portion B of FIG. 7A. For concise description, a previously described element may be identified by the same reference number without repeating an overlapping description thereof.

Referring to FIGS. 6, 7A and 7B, the image sensor may include a first substrate 100, a first interconnection layer 800, a first doped region 410, a first isolation pattern 210, a device isolation pattern 220, a gate pattern 300, color filters CF, and a micro lens layer 600.

The first substrate 100 may have a first surface 100a and a second surface 100b that are opposite to each other. The first surface 100a of the first substrate 100 may be a front surface of the image sensor, and the second surface 100b may be a rear surface (or a back side) of the image sensor. In the image sensor, light may be incident into the first substrate 100 through the second surface 100b.

As shown in FIG. 6, the first substrate 100 may include a pixel array region APS, an optical black region OB, and a pad region PAD, when viewed in a plan view. The pixel array region APS may be disposed to be overlapped with a center portion of the first substrate 100, when viewed in a plan view. The pixel array region APS may include a plurality of pixel regions PX. The pixels of FIG. 1 may be respectively formed in the pixel regions PX of the first substrate 100. For example, elements constituting the pixels may be provided on the pixel regions PX respectively. The pixel regions PX may output a photoelectric signal produced by an incident light. The pixel regions PX may be two-dimensionally arranged to form a plurality of rows and a plurality of columns. The rows may be parallel to a first direction D1. The columns may be parallel to a second direction D2. In the present specification, the first direction D1 may be parallel to the first surface 100a of the first substrate 100. The second direction D2 may be parallel to the first surface 100a of the first substrate 100 but may not be parallel to the first direction D1. For example, the second direction D2 may be substantially perpendicular to the first direction D1. A third direction D3 may not be parallel to both of the first and second directions D1 and D2. For example, the third direction D3 may be substantially perpendicular to the first surface 100a of the first substrate 100.

The pad region PAD may be provided in an edge portion of the first substrate 100 to enclose the pixel array region APS. Pad terminals 900 may be provided on the pad region PAD. The pad terminals 900 may be used to output electrical signals, which are produced in the pixel regions PX, to the outside. In addition, electric signals or voltages from the outside may be provided to the pixel regions PX through the pad terminals 900. Since the pad region PAD is disposed in the edge portion of the first substrate 100, the pad terminals 900 may be easily coupled to the outside. Hereinafter, for brevity's sake, just one of the pad terminals 900 will be mentioned in the following description. The optical black region OB will be described below. The pixel array region APS of the sensor chip of the image sensor will be described in more detail below.

The first substrate 100 may be a semiconductor substrate or a silicon-on-insulator (SOI) substrate. The first substrate 100 may further include group 3 elements. The group 3 element gray be an impurity of a first conductivity type. Due to the impurity of the first conductivity type, the first substrate 100 may have the first conductivity type. The first conductivity type may be for example, a p-type. For example, the impurity of the first conductivity type may include aluminum (Al), boron (B), indium (In), and/or gallium (Ga). The first substrate 100 may have the pixel regions PX.

As shown in FIGS. 7A and 7B, the first substrate 100 may include the photoelectric conversion regions PD. The photoelectric conversion regions PD may be interposed between the first surface 100a and the second surface 100b of the first substrate 100. The photoelectric conversion regions PD may be respectively provided in the pixel regions PX of the first substrate 100. Each of the photoelectric conversion regions PD may be configured to have the same function as the photoelectric conversion region PD of FIG. 1. The photoelectric conversion regions PD may further include group 5 elements. The group 5 element may be an impurity of a second conductivity type. The photoelectric conversion regions PD may be a region, which is formed in the first substrate 100 and is doped with the impurity of the second conductivity type. The second conductivity type may be different from the first conductivity type. For example, the second conductivity type may be an n-type. The impurity of the second conductivity type may include n-type impurities (e.g., phosphorus, arsenic, bismuth, and/or antimony). The photoelectric conversion regions PD may be formed in a deep region of the first substrate 100, which is spaced apart from the first surface 100a. In the present specification, the impurity of the first conductivity type may be a dopant of the first conductivity type, and the impurity of the second conductivity type may be a dopant of the second conductivity type.

The first isolation pattern 210 may be provided in the first substrate 100 and may define the pixel regions PX. For example, the first isolation pattern 210 may be provided between the pixel regions PX of the first substrate 100. The first isolation pattern 210 may be a pixel isolation pattern. The first isolation pattern 210 may be provided in a first trench 191, which is vertically recessed from the first surface 100a of the first substrate 100. The first isolation pattern 210 may be a deep trench isolation pattern. The first isolation pattern 210 may be provided to pass through the second surface 100b of the first substrate 100. A width W2 of a top surface of the first isolation pattern 210 may be larger than a width W1 of a bottom surface of the first isolation pattern 210. Here, the top surface of the first isolation pattern 210 may be coplanar with the first surface 100a of the first substrate 100. In the first isolation pattern 210, the bottom surface may be opposite to the top surface. The bottom surface of the first isolation pattern 210 may be coplanar with the second surface 100b of the first substrate 100.

The first isolation pattern 210 may include a first insulating pattern 211, a conductive isolation pattern 215, and a capping pattern 217. The first insulating pattern 211 may be provided along a side surface of the first trench 191. The first insulating pattern 211 may be formed of or include at least one of for example, silicon-based insulating materials (e.g., silicon nitride, silicon oxide, and/or silicon oxynitride) and/or high-k dielectric materials (e.g., hafnium oxide and/or aluminum oxide). As another example, the first insulating pattern 211 may include a plurality of layers, which are formed of at least two different materials. The first insulating pattern 211 may have a refractive index that is lower than the first substrate 100. Thus, it may be possible to prevent or suppress a cross-talk issue from occurring between the pixel regions PX of the first substrate 100.

The conductive isolation pattern 215 may be provided in the first trench 191 to cover the first insulating pattern 211. The conductive isolation pattern 215 may fill a lower portion of the first trench 191. A top surface of the conductive isolation pattern 215 may be located at a level lower than the first surface 100 of the first substrate 100. Thus, the conductive isolation pattern 215 may be omitted on an upper side surface of the first insulating pattern 211. In the present specification, the terms 'level' or 'level difference' may denote a vertical level and a difference in vertical level (e.g., in the third direction D3), respectively. The first insulating pattern 211 may be interposed between the conductive isolation pattern 215 and the first substrate 100. The conductive isolation pattern 215 may be spaced apart from the first substrate 100 by the first insulating pattern 211. Thus, during operations of the image sensor, the conductive isolation pattern 215 may be electrically separated from the first substrate 100.

The conductive isolation pattern 215 may be formed of or include at least one of crystalline semiconductor materials (e.g., poly silicon). In an embodiment, the conductive isolation pattern 215 may further include a dopant. The dopant may include impurities of the first or second conductivity type. For example, the conductive isolation pattern 215 may be formed of or include a doped poly silicon.

The conductive isolation pattern 215 may have a uniform dopant concentration, and this may make it possible to improve characteristics of the image sensor. For example, the concentration of the dopant in the conductive isolation pattern 215 may have a tolerance of 15% or less. The number of dopants per unit area in the conductive isolation pattern 215 may range from $5.0\times10^{11}$ atoms/cm$^2$ to $1.0\times10^{14}$ atoms/cm$^2$. The conductive isolation pattern 215 may further include an auxiliary element. The auxiliary element may include chlorine. As another example, the auxiliary element may include fluorine or hydrogen. The concentration of the auxiliary element in the conductive isolation pattern 215 may be smaller than the concentration of the dopant in the conductive isolation pattern 215. Thus, the reliability of the image sensor may be improved. As other example, the conductive isolation pattern 215 may be formed of or include at least one of conductive or metallic materials.

The top surface of the conductive isolation pattern 215 may have a upward convex shape. For example, a center portion of the top surface of the conductive isolation pattern 215 may be located at a level lower than an edge portion of the top surface. However, the shape of the top surface of the conductive isolation pattern 215 is not limited to this example and in some embodiments may be variously changed.

The capping pattern 217 may be disposed on the top surface of the conductive isolation pattern 215. The capping pattern 217 may fill an upper portion of the first trench 191. The first insulating pattern 211 may be further extended into a region between the first substrate 100 and the capping pattern 217. For example, the first insulating pattern 211 may be interposed between a device isolation pattern 220 and the capping pattern 217. The capping pattern 217 may be formed of or include at least one of silicon-containing insulating materials (e.g., silicon oxide, tetramethyl orthosilicate (TEOS), and/or silicon oxynitride).

The first doped region 410 may be provided in the first substrate 100 and may be in contact with the first insulating pattern 211. The first doped region 410 may be interposed between the first isolation pattern 210 and the first substrate 100. The first doped region 410 may be formed by substantially the same method as the doped region 40 in the embodiment of FIGS. 2B and 2C. However, in some embodiments, the first doped region 410 may omit the bottom portion.

During operations of the image sensor, the photoelectric conversion regions PD may output a photoelectric signal, which is produced by an incident light. An interface defect may be formed on the side surface of the first trench 191 by a process of forming the first trench 191. The interface defect may produce unintended electrons (e.g., noise electrons), during operations of the image sensor. Such electrons may result in a dark current issue. For example, in the case where the noise electrons are transferred to the photoelectric conversion regions PD, not only the photoelectric signal but also a noise signal may be output from the pixel regions PX of the first substrate 100. The noise signal may include an electrical signal, which is produced from the noise electrons caused by the interface defect. In an embodiment, the first doped region 410 may be in contact with the side surface of the first trench 191. Noise electrons and a dark current, which are caused by the interface defect on the side surface of the first trench 191, may be trapped by the first doped region 410. Thus, it may be possible to prevent or suppress a noise signal from being output from the pixel regions PX and to thereby improve the optical characteristics of the image sensor.

In the case Where the first doped region 410 is formed to have an excessively large thickness or an excessively high dopant concentration as in the related art, the photoelectric conversion regions PD may be formed to have a reduced size, and this reduced size may lead to a reduction in fill well capacity of the pixel regions PX. By contrast, according to an embodiment, since the first doped region 410 is formed by the GPD method, a first thickness T11 of the first doped region 410 may be relatively small. For example, the first thickness T11 may range from about 30 nm to about 180 nm. Since the first thickness T11 is equal to or smaller than about 180 nm, the full well capacity of the pixel regions PX may be improved. Since the first thickness T11 is equal to or larger than about 30 nm, the noise signal may be effectively removed by the first doped region 410.

The first doped region 410 may include dopants, and the concentration of the dopant in the first doped region 410 may be the same as that described with reference to FIGS. 2B and 2C. For example, the number of dopants per unit area in the first doped region 410 may range from $5.0 \times 10^{11}$ atoms/cm$^2$ to $1.0 \times 10^{14}$ atoms/cm$^2$. Since the number of dopants per unit area in the first doped region 410 is greater than $5.0 \times 10^{11}$ atoms/cm$^2$, it may be possible to effectively remove a noise signal. Since the number of dopants per unit area in the first doped region 410 is less than $1.0 \times 10^{14}$ atoms/cm$^2$, it may be possible to improve the full well capacity of the pixel regions PX. Since the number of dopant is per unit area in the first doped region 410 has a tolerance of 15% or less, the optical characteristics of the image sensor may be further improved.

As shown in FIG. 7A, the first substrate 100 may include impurity regions 111. The impurity regions 111 may be disposed in the first substrate 100 and in the pixel regions PX, respectively. The impurity regions 111 may be disposed adjacent to the first surface 100*a* of the first substrate 100. The impurity regions 111 may have bottom surfaces that are located in the first substrate 100 and are spaced apart from the photoelectric conversion regions PD. The impurity regions 111 may be doped with impurities of the second conductivity type (e.g., n-type impurity). The impurity region 111 may be used as at least a part of an active region. Here, the active region may be a region, which is used for an operation of a transistor, and may include the floating diffusion region FD described with reference to FIG. 1 and/or source/drain regions of the transistor. The transistor may be used as the transfer transistor Tx, the source-follower transistor Sx, the reset transistor Rx, or the selection transistor Ax described with reference to FIG. 1.

The device isolation pattern 220 may be provided in the first substrate 100. The device isolation pattern 220 may be provided in a second trench 192, and the second trench 192 may be recessed from the first surface 100*a* of the first substrate 100. The device isolation pattern 220 may define active regions. Concretely, in each pixel region PX, the device isolation pattern 220 may define the impurity regions 111, and the impurity regions 111 may be isolated from each other by the device isolation pattern 220. For example, the device isolation pattern 220 may be disposed in the first substrate 100 and beside one of the impurity regions 111. The device isolation pattern 220 may be a shallow trench isolation (STI) layer. For example, a height of the device isolation pattern 220 may be smaller than that of the first isolation pattern 210. A portion of the device isolation pattern 220 may be disposed on the side surface of the first insulating pattern 211. The device isolation pattern 220 may be formed of or include at least one of silicon-based insulating materials (e.g., silicon oxide, silicon nitride, and/or silicon oxynitride). The device isolation pattern 220 may include a plurality of layers, but embodiments are not limited to this example.

As shown in FIG. 7B, the device isolation pattern 220 may further include a first additional element region 240. The first additional element region 240 of the device isolation pattern 220 may be in contact with the side surface of the upper portion of the first trench 191. For example, the first additional element region 240 may be disposed on a side surface of an upper portion of the first insulating pattern 211 and may be interposed between the bottom surface of the first interconnection layer 800 and the top surface of the first doped region 410. As an example, a bottom surface of the first additional element region 240 may be physically connected to the top surface of the first doped region 410. The first addition element region 240 may include a second additional element 401B. The second additional element 401B may include the same element as the dopant in the first doped region 410. For example, the second additional element 401B may include boron, but embodiments are not limited to this example. The number of the second additional element 401B per unit area in the first additional element region 240 may be smaller than the number of dopants per area in the first doped region 410. A thickness T15 of the first additional element region 240 may be smaller than the first thickness T11. Thus, it may be possible to improve the characteristics of the image sensor. The first additional element region 240 and the first doped region 410 may be formed by a single GPD process. In order to reduce complexity in the drawings, the second additional element 401B is not illustrated in the drawings except for FIGS. 7B, 7D, and 7E, but embodiments are not limited to the structures illustrated in such simplified figures.

As shown in FIG. 7A, the gate pattern 300 may be disposed on the first surface 100*a* of the first substrate 100. The gate pattern 300 may serve as the gate electrode of the transfer transistor Tx, the source-follower transistor Sx, the reset transistor Rx, or the selection transistor Ax previously described with reference to FIG. 1. For example, the gate pattern 300 may include the transfer gate TG, the source-follower gate SG, the reset gate RG, or the selection gate AG. For brevity's sake, FIG. 3B illustrates an example, in which one gate pattern 300 is disposed on each pixel region PX, but in an embodiment, a plurality of the gate patterns 300 may be disposed on each pixel region PX. Hereinafter, one of the gate patterns 300 will be mentioned in the following description, for brevity's sake.

The gate pattern 300 may have a buried-type gate structure. For example, the gate pattern 300 may include a first portion 310 and a second portion 320. The first portion 310 of the gate pattern 300 may be a protruding portion inserted into the first substrate 100. For example, the first portion 310 of the gate pattern 300 may be provided in a third trench 193, which is vertically recessed from the first surface 100*a* of the first substrate 100. The second portion 320 of the gate pattern 300 may be disposed on the first surface 100*a* of the first substrate 100. The second portion 320 of the gate pattern 300 may be connected to the first portion 310. Unlike the illustrated structure, in some embodiments, the gate pattern 300 may have a planar gate structure. In this case, the gate pattern 300 may omit the first portion 310. As another example, the gate pattern 300 may omit the second portion. The gate pattern 300 may be formed of or include at least one of metallic materials, metal silicide materials, doped poly silicon, and combinations thereof.

The image sensor may further include a gate insulating pattern 231. The gate insulating pattern 231 may be interposed between the gate pattern 300 and the first substrate 100. The gate insulating pattern 231 may be formed of or include at least one of, for example, silicon-based insulating materials (e.g., silicon oxide, silicon nitride, and/or oxynitride) and/or high-k dielectric materials (e.g., hafnium oxide and/or aluminum oxide).

The first interconnection layer 800 may be disposed on the first surface 100*a* of the first substrate 100. The first interconnection layer 800 may include a first insulating layer 810, second insulating layers 820, and the first conductive structure 830. The first insulating layer 810 may be provided on the first surface 100*a* of the first substrate 100 and the side surface of the gate pattern 300. The second insulating layers 820 may be stacked on the first insulating layer 810. The first and second insulating layers 810 and 820 may be formed of or include at least one of silicon-based insulating materials (e.g., silicon oxide, silicon nitride, and/or silicon oxynitride).

The first conductive structure 830 may be provided in the insulating layers 810 and 820. The first conductive structure 830 may include a contact plug portion, a line portion, and a via portion. The contact plug portion may be provided in the first insulating layer 810 or the lowermost one of the second insulating layers 820 and may be electrically connected to one of the impurity regions 111 and the gate pattern 300. The line portion of the first conductive structure 830 may be interposed between the two adjacent insulating layers 810 and 820. The line portion may be connected to the contact plug portion. The via portion of the first conductive structure 830 may penetrate at least one of the second insulating layers 820 and may be connected to the line portion. The first conductive structure 830 may be used to deliver photoelectric signals, which are produced from the photoelectric conversion regions PD.

The color filters CF may be disposed on the second surface 100b of the first substrate 100 and on the pixel regions PX, respectively. For example, the color filters CF may be respectively provided at positions corresponding to the photoelectric conversion regions PD. The color filters CF may be laterally disposed. Each of the color filters CF may include one of a red color filter, a blue color filter, and a green color filter. The color filters CF may form a color filter array. For example, the color filters CF may be arranged in the first and second directions D1 and D2 to form an array, when viewed in a plan view.

The image sensor may further include a fence pattern 550. The fence pattern 550 may be disposed in a position corresponding to the first isolation pattern 210. For example, in some embodiments, the fence pattern 550 may be disposed on the first isolation pattern 210. For example, the fence pattern 550 may be overlapped with the first isolation pattern 210, when viewed in a plan view. The fence pattern 550 may be interposed between two adjacent ones of the color filters CF and may separate the color filters CF from each other. That is, the color filters CF may be optically separated from each other by the fence pattern 550. The fence pattern 550 may have a grid shape and may enclose each of the pixel regions PX, when viewed in a plan view. The fence pattern 550 may be formed of or include at least one of metallic materials, metal nitrides, or low refractive materials. For example, the fence pattern 550 may be formed of or include titanium and/or titanium nitride. The low refractive material may include a polymer and nano-sized silica particles in the polymer. The low refractive material may have an insulating property.

The image sensor may further include an insulating layer 500. The insulating layer 500 may cover the second surface 100b of the first substrate 100 and the bottom surface of the first isolation pattern 210. The insulating layer 500 may be interposed between the first substrate 100 and the color filters CF and between the first isolation pattern 210 and the fence pattern 550. The insulating layer 500 may be a back-side insulating layer. The insulating layer 500 may include a bottom anti-reflection coating (BARC) layer. The insulating layer 500 may include a plurality of layers. For example, the insulating layer 500 may include a fixed charge layer, and in an embodiment, the fixed charge layer may be formed of metal oxide or metal fluoride containing at least one metal, which is selected from the group consisting of hafnium (Hf), zirconium (Zr), aluminum (Al), tantalum (Ta), titanium, (Ti), yttrium (Y), and lanthanoid. As an example, the fixed charge layer may include an aluminum oxide layer and a hafnium oxide layer which are stacked. The insulating layer 500 may further include an insulating gapfill layer, which is formed of or includes tetramethyl orthosilicate (TEOS) or silicon oxide. The insulating layer 500 may further include a silicon nitride layer. The insulating layer 500 may further include a capping layer. The capping layer may be formed of or include at least one of metal oxides (e.g., hafnium oxide). The fixed charge layer, the insulating gapfill layer, the silicon nitride layer, and the capping layer may be stacked on the second surface 100b of the first substrate 100.

The image sensor may further include a protection layer 530. The protection layer 530 may be interposed between the insulating layer 500 and the color filters CF and between the fence pattern 550 and the color filters CF. For example, the protection layer 530 may be formed of or include aluminum oxide or hafnium oxide. The protection layer 530 may protect the photoelectric conversion regions PD of the first substrate 100 from the external environment.

The micro lens layer 600 may be disposed on the second surface 100b of the first substrate 100. For example, the micro lens layer 600 may be disposed on bottom surfaces of the color filters CF. The micro lens layer 600 may include a planarization portion and lens portions. The lens portions may be respectively provided at positions corresponding to the photoelectric conversion regions PD of the first substrate 100 and may protrude in a direction away from the second surface 100b of the first substrate 100. The lens portions may be arranged in the first and second directions D1 and D2 to form a two-dimensional array, when viewed in a plan view. The planarization portion of the micro lens layer 600 may be interposed between the color filters CF and the lens portions. The planarization portion and the lens portions may be provided to form a single object, which an interfacial surface is absent. As another example, the planarization portion may be omitted, and the lens portions of the micro lens layer 600 may not be connected to each other. The micro lens layer 600 may be transparent to light. The micro lens layer 600 may be formed of or include at least one of organic materials (e.g., polymers).

The image sensor may further include a lens coating layer (not shown). The lens coating layer may be provided to conformally cover a bottom surface of the micro lens layer 600 and may protect the micro lens layer 600. The lens coating layer may also be transparent.

Figure 7C:
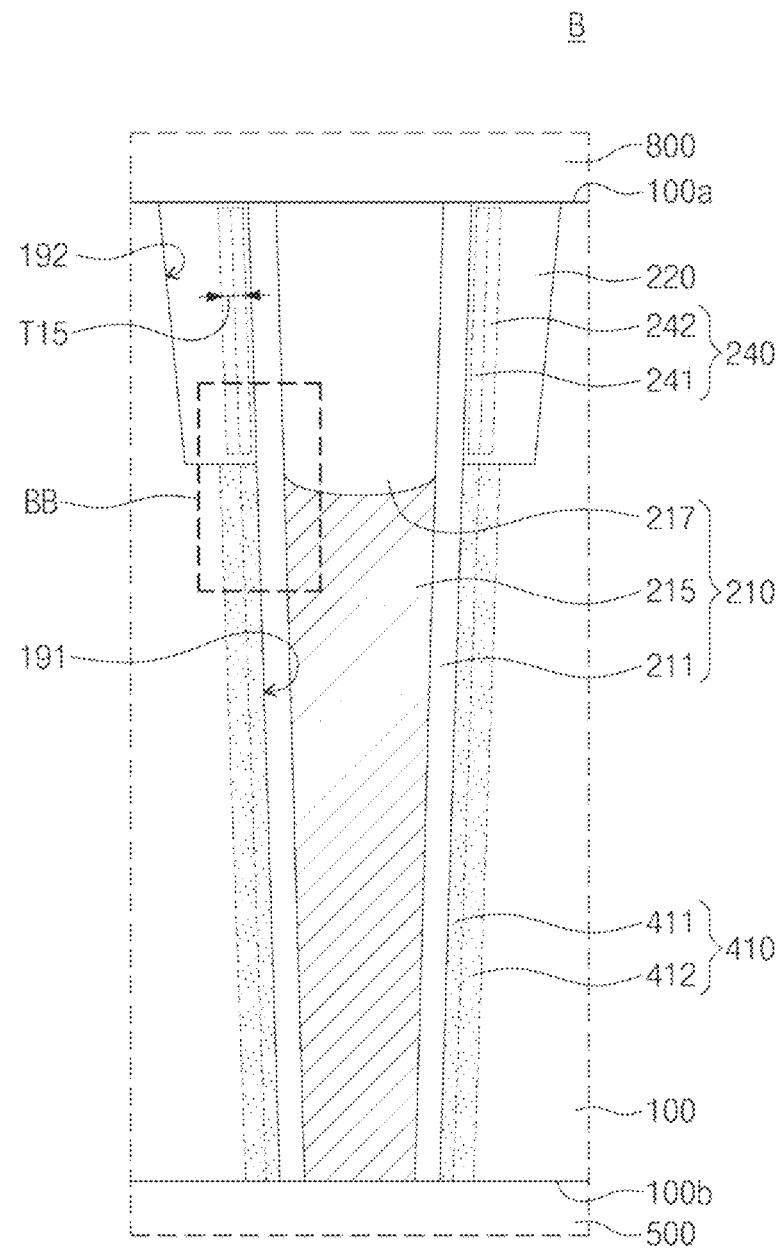
FIG. 7C is a sectional view illustrating a device isolation pattern, a first isolation pattern, and a first doped region according to an embodiment.
Figure 7D:
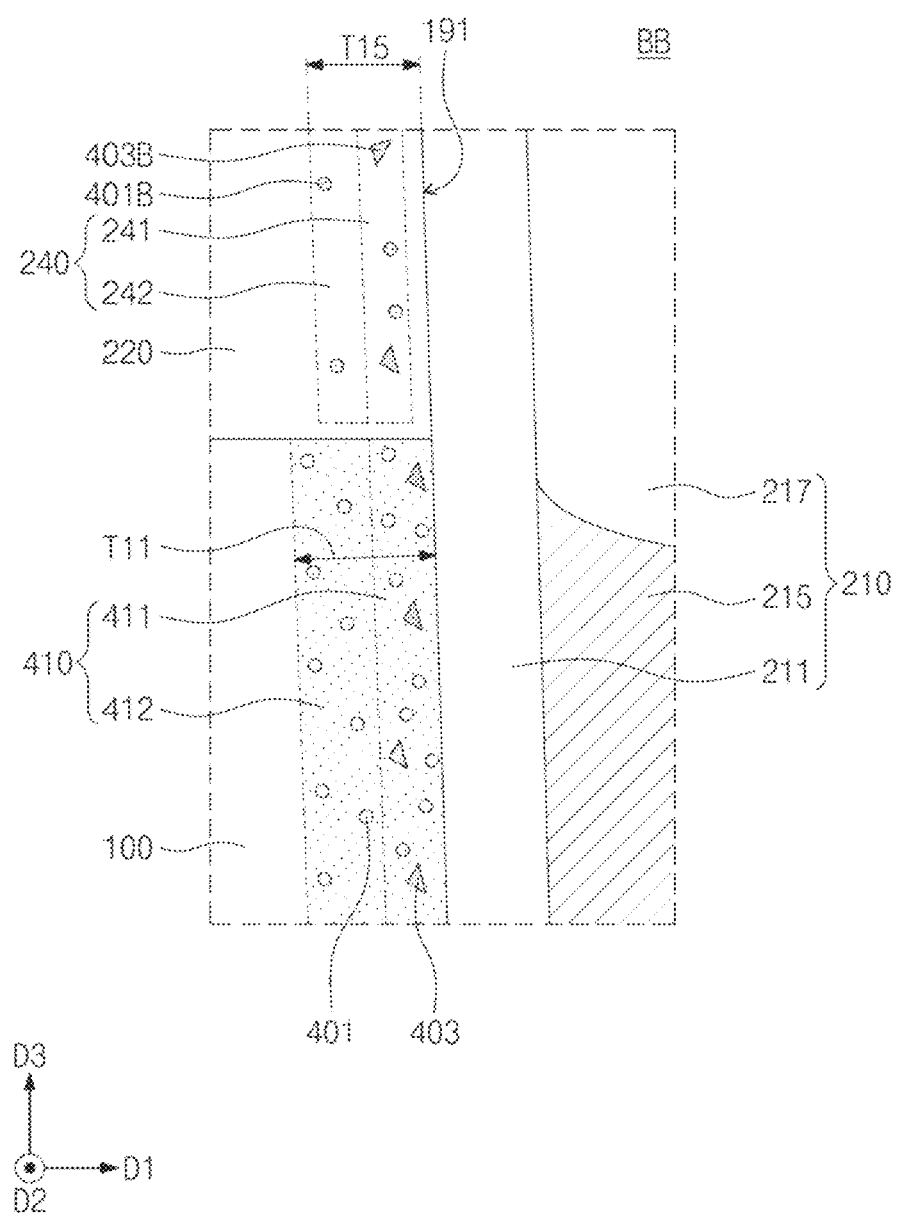
FIG. 7D is an enlarged sectional view illustrating a portion BB of FIG. 7C.

FIG. 7C is a sectional view illustrating a device isolation pattern, a first isolation pattern, and a first doped region according to an embodiment and is an enlarged sectional view illustrating the portion B of FIG. 7A. FIG. 7D is an enlarged sectional view illustrating a portion BB of FIG. 7C.

Referring to FIGS. 7C and 7D, the first doped region 410 may include a first region 411 and a second region 412. The first region 411 and the second region 412 of the first doped region 410 may be provided to have substantially the same features as the first region 41X and the second region 42X of the side portion 40X of the doped region 40 in the embodiment described with reference to FIGS. 4A and 4B. For example, the first region 411 of the first doped region 410 may include dopants and a first auxiliary element. The second region 412 of the first doped region 410 may include the dopant but may omit the first auxiliary element.

The device isolation pattern 220 may include the first additional element region 240. The disposition and the thickness 115 of the first additional element region 240 and the concentration of the second additional element 401B may be the same as the disposition and the thickness T1 of the first additional element region 240 and the concentration of the second additional element 401B in the embodiment of FIG. 7B. However, in an embodiment, the first additional element region 240 may include a first sub-region 241 and a second sub-region 242. The first sub-region 241 may be in contact with the first trench 191. For example, the first sub-region 241 may be disposed on the upper side surface of the first insulating pattern 211. The first sub-region 241 may be interposed between the second sub-region 242 and the first insulating pattern 211. The first sub-region 241 may be an auxiliary element region. The first sub-region 241 may include a third auxiliary element 403B, in addition to the second additional element 401B. The third auxiliary element 403B may be the same element as the first auxiliary element 403 in the first region 411 of the first doped region 410. As an example, the third auxiliary element 403B may be chlorine. As another example, the third auxiliary element 403B may be fluorine or hydrogen. The second sub-region 242 may include the second additional element 401B but may omit the third auxiliary element 403B.

Figure 7E:
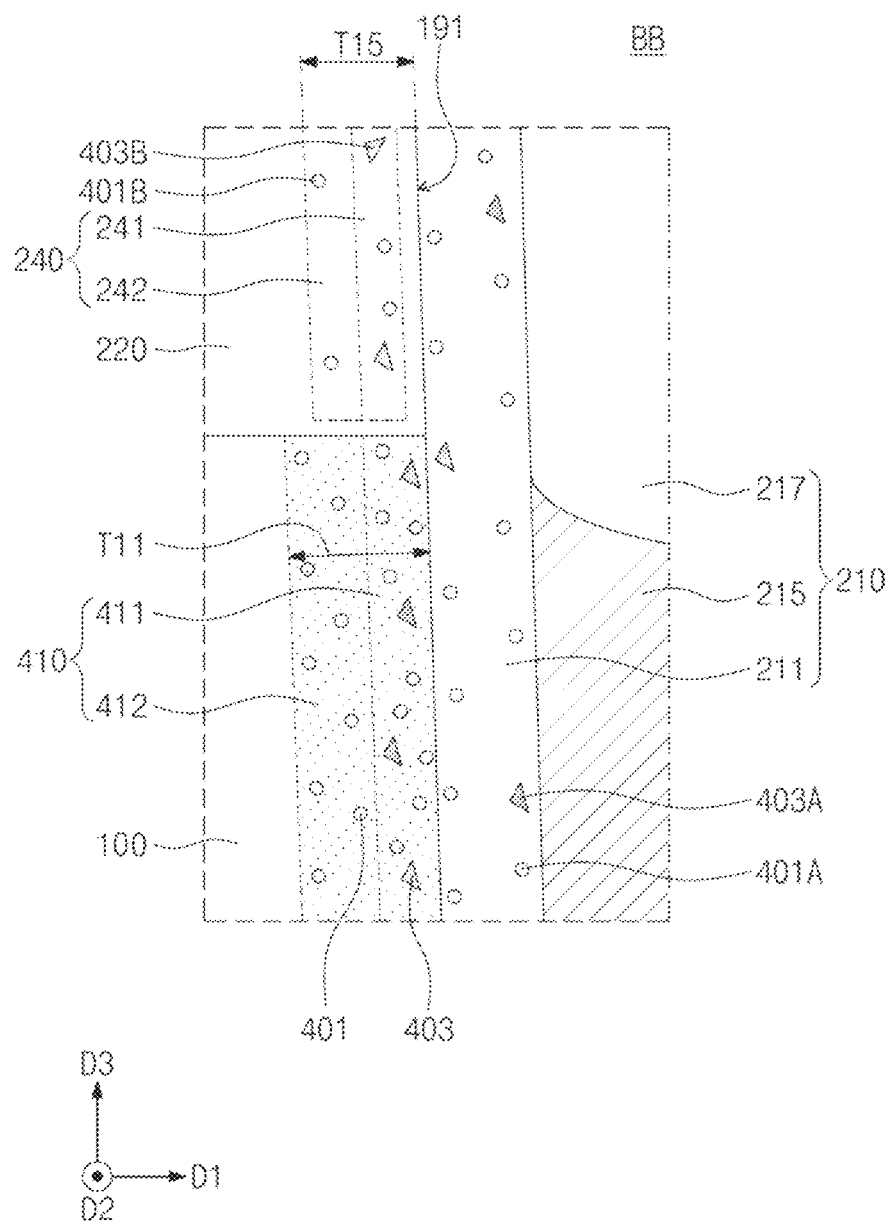
FIG. 7E is a sectional view illustrating a device isolation pattern, a first isolation pattern, and a first doped region according to an embodiment.

FIG. 7E is a sectional view illustrating a device isolation pattern, a first isolation pattern, and a first doped region according to an embodiment and is an enlarged sectional view corresponding to the portion BB of FIG. 7C. The structure according to an embodiment will be described with reference to FIG. 7E, in conjunction with FIGS. 5C and 5D.

Referring to FIG. 7E, the first doped region 410 may include the first region 411 and the second region 412. The device isolation pattern 220 may further include the first additional element region 240. In an embodiment, the first doped region 410, the device isolation pattern 220, the first additional element region 240 may have substantially the same features as those in the embodiments of FIGS. 7C and 7D.

However, in an embodiment, the first insulating pattern 211 may further include the first additional element 401A. The first additional element 401A may be the same element as the dopant 401 in the first doped region 410. The formation of the first doped region 410 and the first insulating pattern 211 may be performed by the method of forming the doped region 40 in the embodiment described with reference to FIGS. 5C and 5D. For example, the first insulating pattern 211 may be formed in the first trench 191. Thereafter, the first doped region 410 may be formed by performing the GPD process on the first insulating pattern 211. The first doped region 410 may be formed by the doping gas, which is supplied into the first substrate 100 through the first insulating pattern 211. Thus, the first insulating pattern 211 may further include the first additional element 401A, as shown in FIG. 7E, and the first additional element 401A may be the same element as the dopant 401 in the first doped region 410.

The first insulating pattern 211 may further include the second auxiliary element 403A. The second auxiliary element 403A may be the same element as the first auxiliary element 403 and the third auxiliary element 403B, in the first insulating pattern 211, the number of the second auxiliary element 403A per unit area may be smaller than the number of the first additional element 401A per unit area. Thus, the characteristics of the image sensor may be improved.

Unlike the illustrated structure, in some embodiments, the first auxiliary element 403, the second auxiliary element 403A, and the third auxiliary element 403B may be omitted. In this case, the first insulating pattern 211 and the first doped region 410 may have substantially the same features as the insulating pattern 21 and the doped region 40 in the embodiments described with reference to FIGS. 5A and 5B.

Figure 7F:
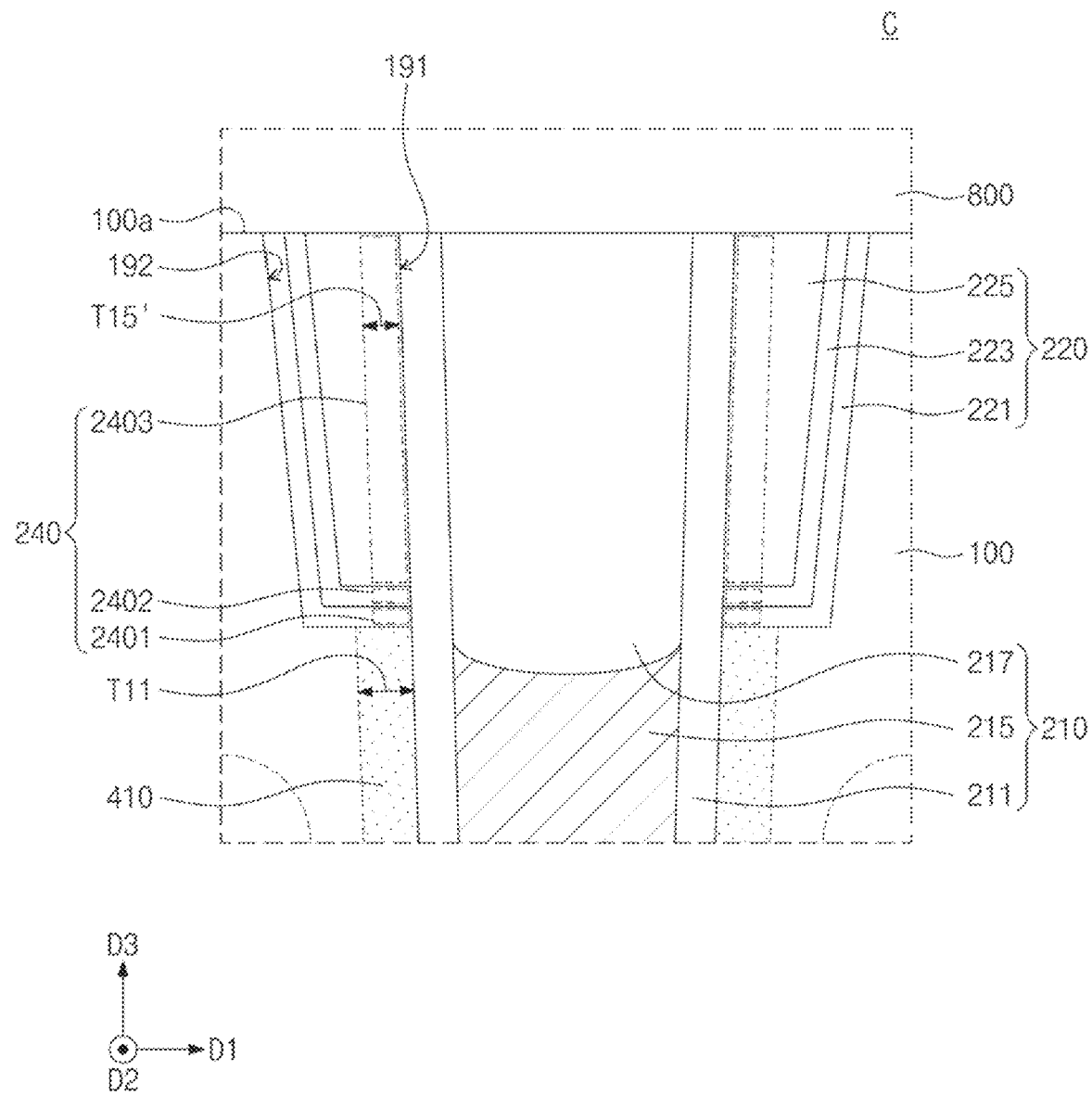
FIG. 7F is an enlarged sectional view illustrating a portion C of FIG. 7A.

FIG. 7F is a sectional view illustrating a device isolation pattern, a first isolation pattern, and a first doped region according to an embodiment and is an enlarged sectional view of a portion C of FIG. 7A.

Referring to FIG. 7F, the device isolation pattern 220 may include a plurality of layers. The device isolation pattern 220 may include a second insulating pattern 221, a third insulating pattern 223, and a buried insulating pattern 225. The second insulating pattern 221 may conformally cover the side and bottom surfaces of the second trench 192. The second insulating pattern 221 may be filmed of or include at least one of silicon-based insulating materials. For example, the second insulating pattern 221 may be formed of or include at least one of oxide materials (e.g., silicon oxide and/or silicon oxynitride). The buried insulating pattern 225 may be disposed on the second insulating pattern 221. The buried insulating pattern 225 may fill the second trench 192. The buried insulating pattern 225 may be formed of or include at least one of silicon-containing insulating materials. For example, the buried insulating pattern 225 may be formed of or include at least one of silicon oxide, tetramethyl orthosilicate (TEOS), and/or silicon oxynitride. The third insulating pattern 223 may be interposed between the second insulating pattern 221 and the buried insulating pattern 225. The third insulating pattern 223 may include a material different from the second insulating pattern 221 and the buried insulating pattern 225. For example, the third insulating pattern 223 may be formed of or include at least one of nitride materials (e.g., silicon nitride, silicon oxynitride, and/or silicon carbonitride). Each of the second insulating pattern 221, the third insulating pattern 223, and the buried insulating pattern 225 may be in physical contact with the device isolation pattern 220.

The device isolation pattern 220 may include the first additional element region 240. The first additional element region 240 may include a first sub-region 2401, a second sub-region 2402, and a third sub-region 2403. The first sub-region 2401 may be provided in the second insulating pattern 221 to be in contact with the side surface of the first trench 191. The second sub-region 2402 may be provided in the third insulating pattern 223 to be in contact with the side surface of the first trench 191. The third sub-region 2403 may be provided in the buried insulating pattern 225 to be in contact with the side surface of the first trench 191.

Each of the first, second, and third sub-regions 2401, 2402, and 2403 may include a second additional element. The second additional element may be the same element as the dopant in the first doped region 410. The concentration of the dopant in the first doped region 410 may be higher than the concentration of the second additional element in the first sub-region 2401, the concentration of the second additional element, in the second sub-region 2402, and the concentration of the second additional element in the third sub-region 2403. The first thickness T11 of the first doped region 410 may be larger than the thickness of the first sub-region 2401, the first thickness T11 of the first doped region 410 may be larger than the thickness of the second sub-region 2402, and the first thickness T11 of the first doped region 410 may be larger than the thickness T15' of the third sub-region 2403. The thickness of the first sub-region 2401, the thickness of the second sub region 2402, and the thickness T15' of the third sub-region 2403 may be the same as or different from each other.

In the case where the first doped region 410 further includes the first auxiliary element, each of the first, second, and third sub-regions 2401, 2402, and 2403 may further include a third auxiliary element. The third auxiliary element may be the same element as the first auxiliary element. For example, the first auxiliary element and the third auxiliary element may be chlorine. As another example, the first auxiliary element and the third auxiliary element may be fluorine or hydrogen. In each of the first to third sub-regions 2401, 2402, and 2403 the concentration of the second additional element may be higher than the concentration of the third auxiliary element.

The first doped region 410 and the first, second, and third sub-regions 2401, 2407, and 2403 may be formed simultaneously by a single process including the GPD process.

In order to reduce complexity in the drawings, the first additional element region 240 is not illustrated in the drawings except for FIGS. 7A to 7F, 9A to 9D, 11A, 11D, and 12A to 12F, but embodiments are not limited to the structures illustrated in such simplified figures.

Figure 8A:
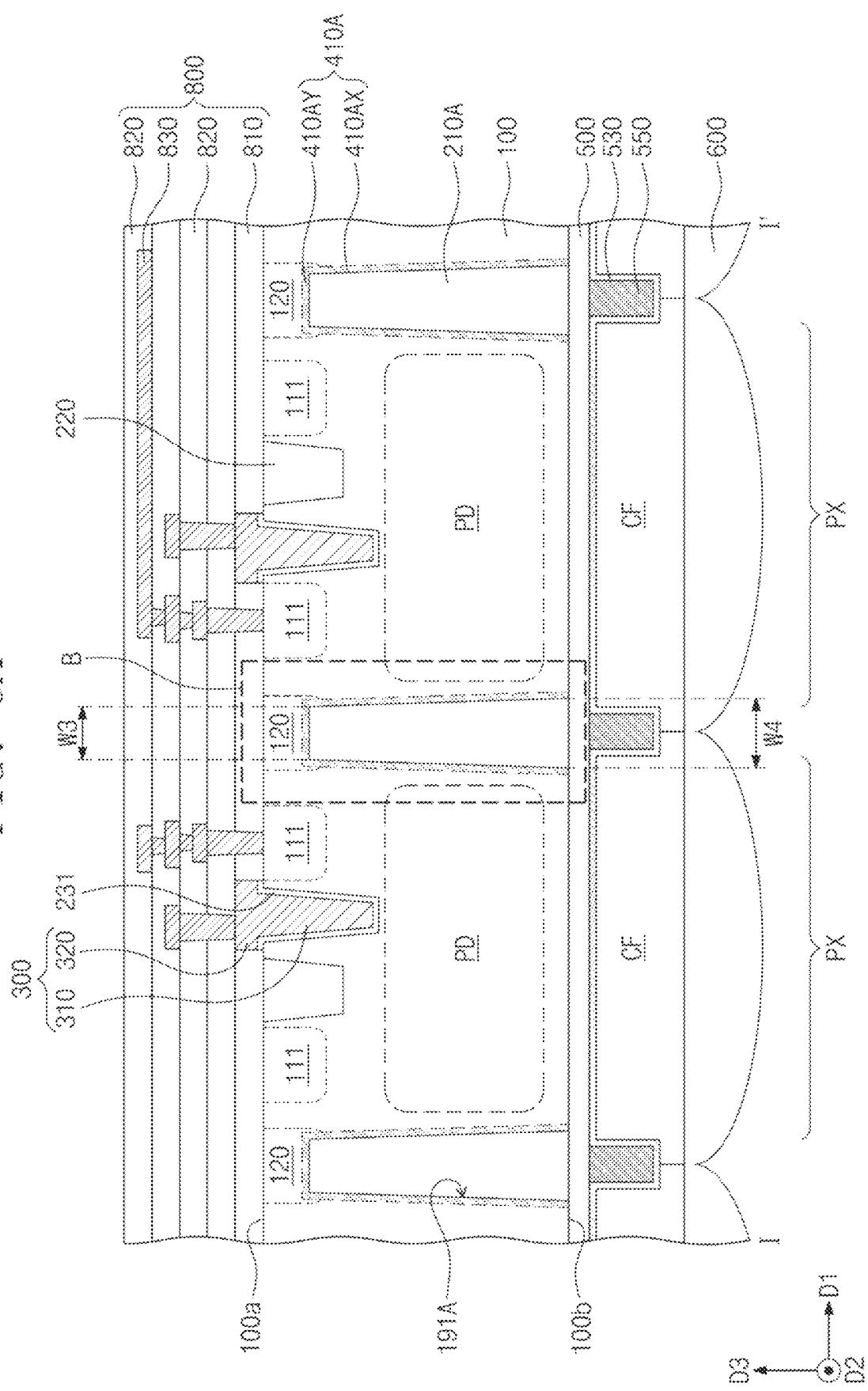
FIG. 8A is a sectional view illustrating a pixel array region of an image sensor according to an embodiment.
Figure 8B:
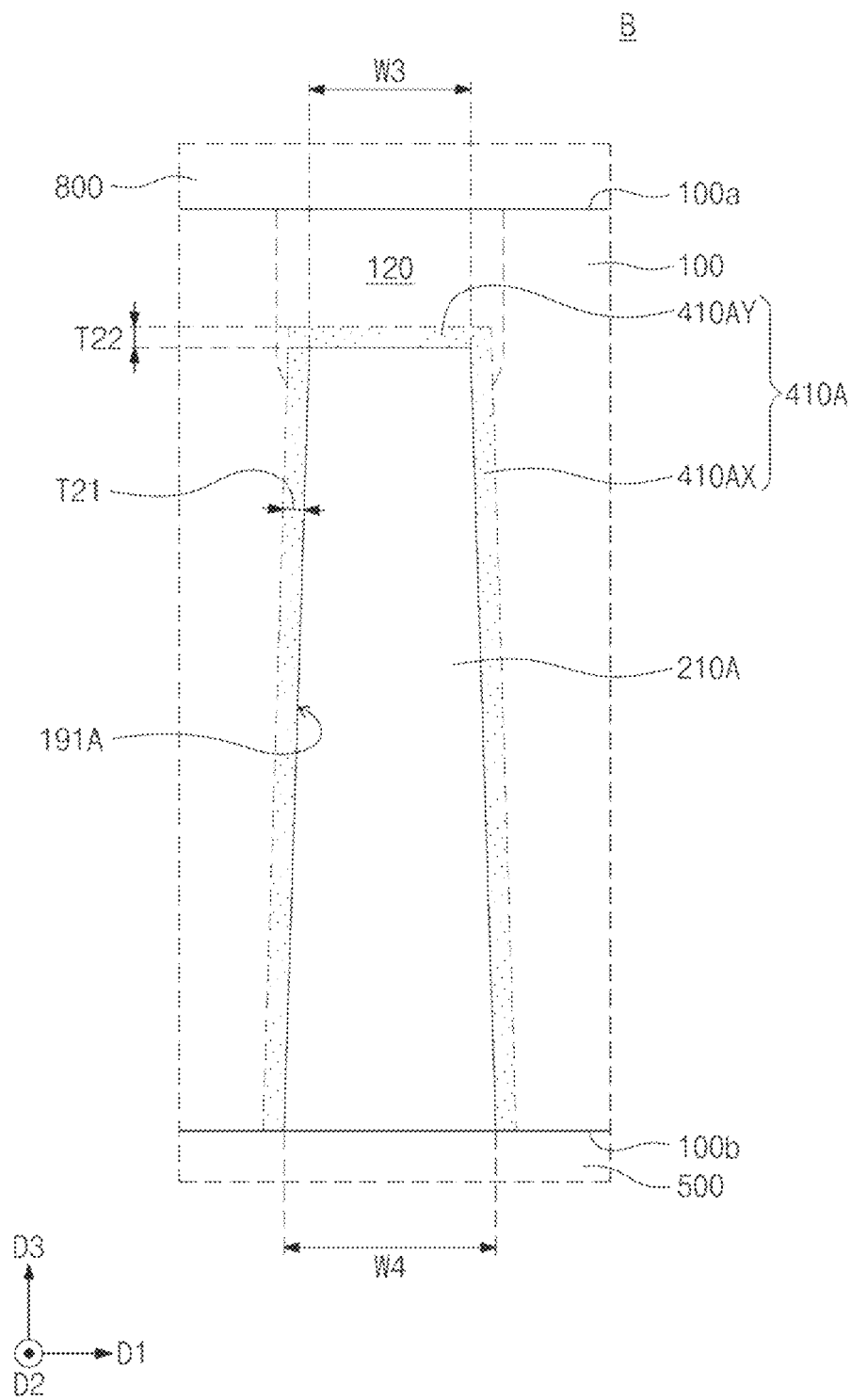
FIG. 8B is an enlarged sectional view illustrating a portion B of FIG. 8A.

FIG. 8A is a sectional view, which is taken along a line I-I' of FIG. 6 to illustrate a pixel array region of an image sensor according to an embodiment. FIG. 8B is an enlarged sectional views illustrating a portion B of FIG. 8A.

Referring to FIGS. 8A and 8B, the image sensor may include the first substrate 100, the first interconnection layer 800, a dopant region 410A, a second isolation pattern 210A, the device isolation pattern 220, the gate pattern 300, the color filters CF, and the micro lens layer 600. The image sensor may further include the insulating layer 500, the protection layer 530, and the fence pattern 550.

The second isolation pattern 210A may be provided in the first substrate 100 to define the pixel regions PX. The second isolation pattern 210A may be similar to the first isolation pattern 210 described with reference to FIG. 7A. For example, the second isolation pattern 210A may be disposed in the first substrate 100 and between the photoelectric conversion regions PD to define the pixel regions PX. However, unlike FIG. 7A, in an embodiment, the second isolation pattern 210A may be provided in a back-side trench 191A, which is formed to penetrate the second surface 100b of the first substrate 100. The back-side trench 191A may have a bottom surface that is located in the flat substrate 100. The top surface of the second isolation pattern 210A may correspond to the bottom surface of the back-side trench 191A. The top surface of the second isolation pattern 210A may be spaced apart from the first surface 100a of the first substrate 100 and may be located at a level lower than the first surface 100a. Alternatively, the back-side trench 191A and the second isolation pattern 210A may be provided to penetrate the flat surface 100a of the first substrate 100. In this case, the bottom surface of the second isolation pattern 210A may be located at substantially the same level as the second surface 100b of the first substrate 100. A width W3 of the top surface of the second isolation pattern 210A may be larger than a width W4 of the bottom surface of the second isolation pattern 210A. The second isolation pattern 210A may omit the conductive isolation pattern 215 and the capping pattern 217 described with reference to FIGS. 7A and 7B and may be formed of or include the same material as the first insulating pattern 211. For example, the second isolation pattern 210A may include a silicon-based insulating material filling the back-side trench 191A.

A pixel isolation region 120 may be further provided in the first substrate 100. The pixel isolation region 120 may be provided between the top surface of the second isolation pattern 210A and the first surface 100a of the first substrate 100. The pixel isolation region 120 may include at least one of group 3 elements. For example, the pixel isolation region 120 may be a region that is doped with impurities of the first conductivity type (e.g., p-type). The pixel isolation region 120, along with the second isolation pattern 210A, may define the pixel regions PX. In an embodiment, the first substrate 100 may omit the pixel isolation region 120.

The dopant region 410A may be provided in the first substrate 100 and may be in physical contact with the side and top surfaces of the second isolation pattern 210A. The dopant region 410A may have a bottom portion 410AY and a side portion 410AX. The dopant region 410A may be formed by the same method as the doped region 40 in the embodiment described with reference to FIGS. 2B and 2C. The bottom portion 410AY and the side portion 410AX of the dopant region 410A may have substantially the same features as the bottom portion 40Y and the side portion 40X of the doped region 40 in the embodiment described with reference to FIGS. 2B and 2C. For example, as shown in FIG. 8B, a first thickness T21 of the side portion 410AX of the dopant region 410A may have a tolerance of 15% or less. The first thickness T21 may range from about 30 μm to about 180 nm. A second thickness T22 of the bottom portion 410AY of the dopant region 410A may have a tolerance of 15% or less. The second thickness 122 may be from 85% to 115% of the first thickness T21. The second thickness T22 may range from about 30 nm to about 180 nm.

A dopant concentration in the side portion 410AX of the dopant region 410A may have a tolerance of 15% or less, and a dopant concentration in the bottom portion 410AY may have a tolerance of 15% or less. The number of dopants per unit area in the side portion 410AX of the dopant region 410A may be from 85% to 115% of the number of dopants per unit area in the bottom portion 410AY. The numbers of dopants per unit area in the side and bottom portions 410AX and 410AY of the dopant region 410A may range from $5.0 \times 10^{11}$ atoms/cm$^2$ to $1.0 \times 10^{14}$ atoms/cm$^2$.

Although not shown, each of the side and bottom portions 410AX and 410AY of the dopant region 410A may include a first region and a second region, and in this case, the first region and the second region may have substantially the same features as the first regions 41X and 41Y and the second regions 42X and 42Y in the embodiment described with reference to FIGS. 4A and 4B. For example, the first region of the dopant region 410A may be in contact with the side and bottom surfaces of the back-side trench 191A and may further include a first auxiliary element (e.g., see 403 of FIG. 4B). The first region of the dopant region 410A may be interposed between the second isolation pattern 210A and the second region. The first auxiliary element may be, for example, chlorine. As another example, the first auxiliary element may include fluorine or hydrogen. The second region of the dopant region 410A may be a peripheral region and may omit the first auxiliary element. The concentration of the first auxiliary element in the first region of the dopant region 410A may be lower than the concentration of the dopant in the first region of the dopant region 410A and the concentration of the dopant in the second region of the dopant region 410A.

Figure 8C:
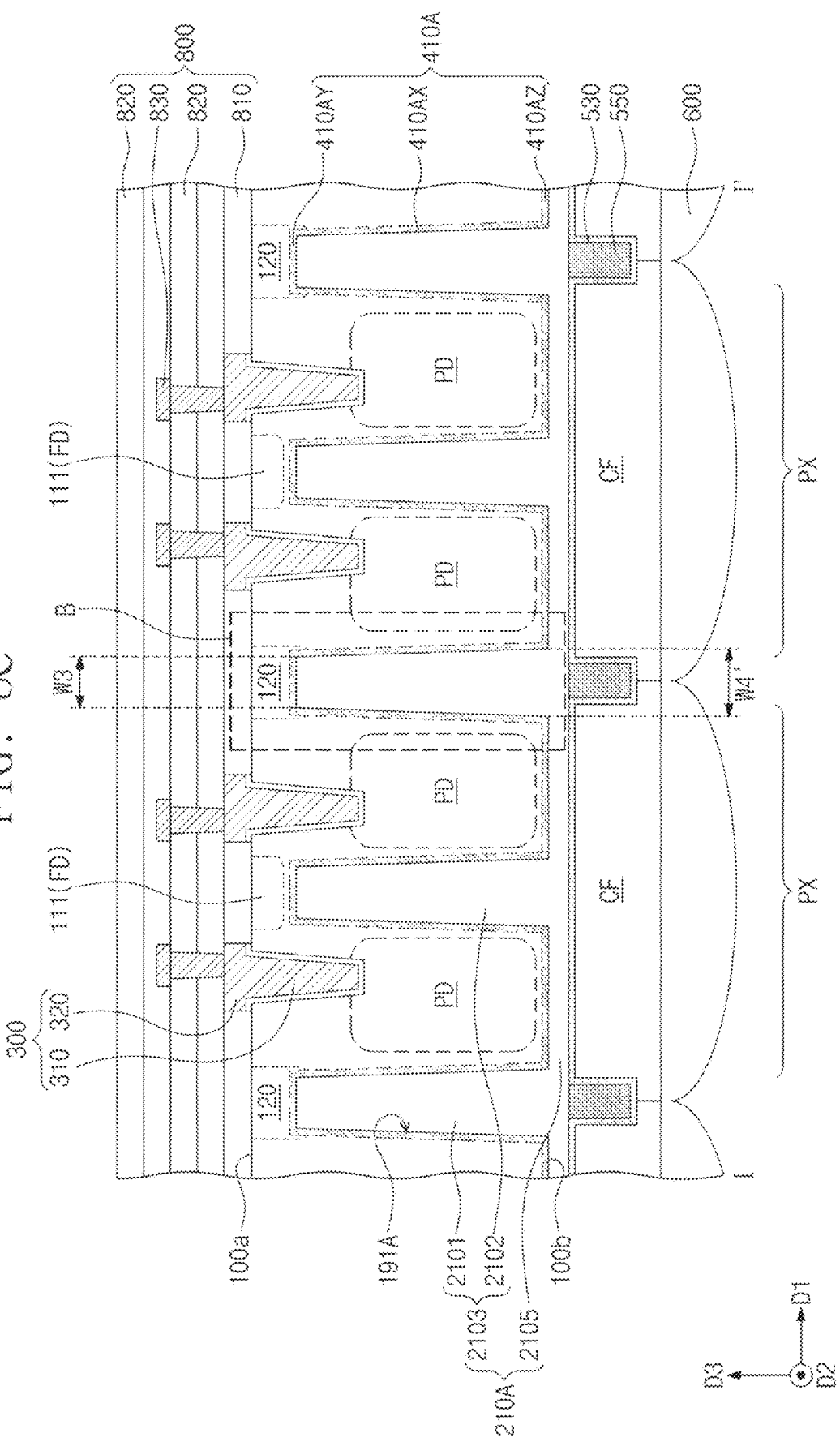
FIG. 8C is a sectional view illustrating a pixel array region of an image sensor according to an embodiment.
Figure 8D:
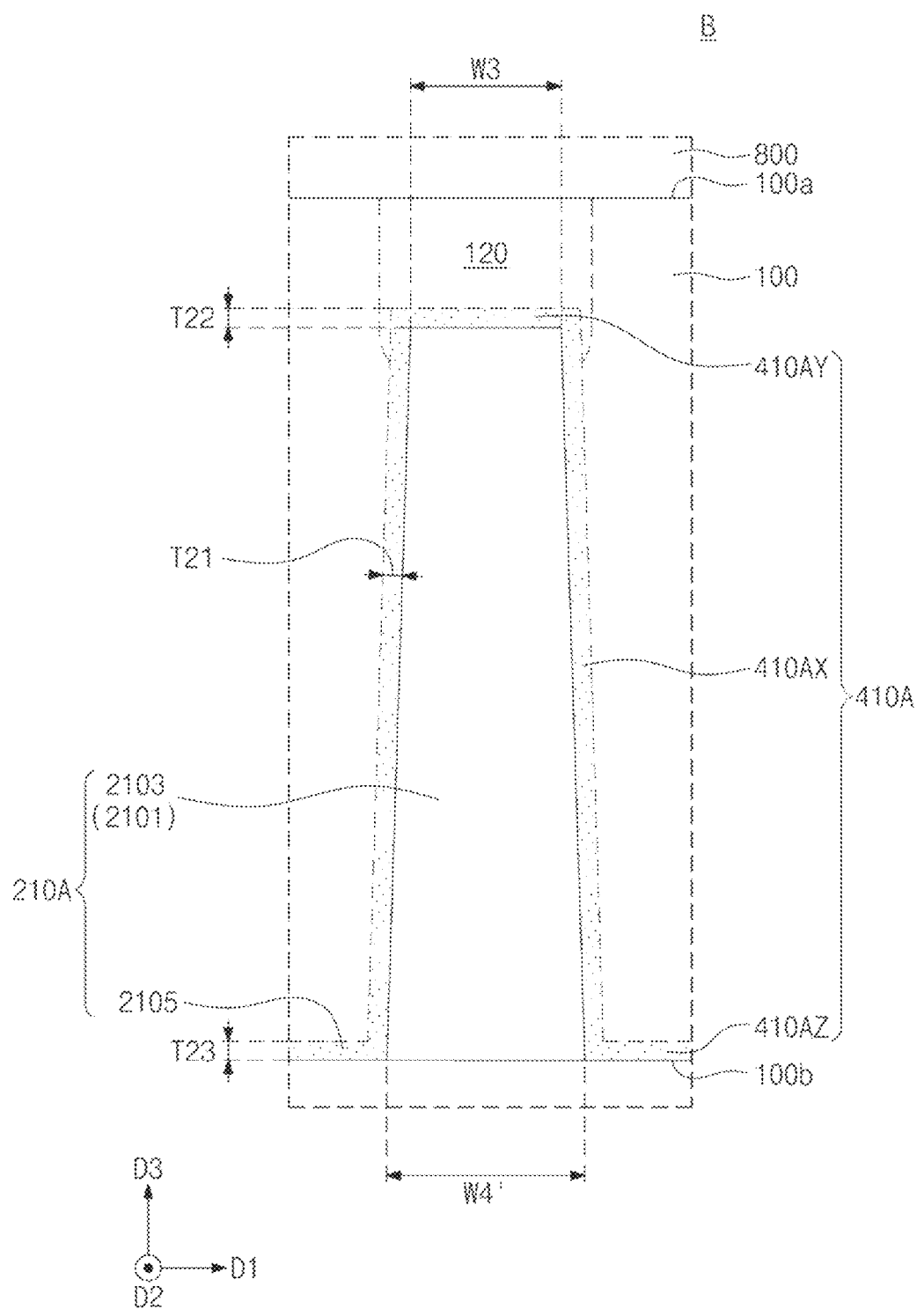
FIG. 8D is an enlarged sectional view illustrating a portion B of FIG. SC.

FIG. 8C is a sectional view, which is taken along a line I-I' of FIG. 6 to illustrate a pixel array region of an image sensor according to an embodiment. FIG. 8D is an enlarged sectional view illustrating a portion B of FIG. 8C.

Referring to FIGS. 8C and 8D, the image sensor may include the first substrate 100, the first interconnection layer 800, the dopant region 410A, the second isolation pattern 210A, the device isolation pattern 220, the gate patterns 300, the color filters CF, and the micro lens layer 600. The photoelectric conversion regions PD may be provided in each pixel region PX of the first substrate 100. A plurality of back-side trenches 191A may be respectively provided between the photoelectric conversion regions PD. Some of the back-side trenches 191A may be formed between the pixel regions PX. Such back-side trenches 191A may be disposed in the same manner as the back-side trench 191A in the embodiment described with reference to FIGS. 8A and 8B. Others of the back-side trenches 191A may be formed in the pixel regions PX to be overlapped with the pixel regions PX.

The second isolation pattern 210A may be provided to have the same or similar features as that in the embodiments described with reference to FIGS. 8A and 8B. However, in an embodiment, the second isolation pattern 210A may include protruding portions 2103 and a planar portion 2105. The protruding portions 2103 of the second isolation pattern 210A may be respectively provided in corresponding ones of the back-side trenches 191A. The protruding portions 2103 of the second isolation pattern 210A may include a first protruding portion 2101 and a second protruding portion 2102. The first protruding portion 2101 of the second isolation pattern 210A may be provided between the pixel regions PX to define the pixel regions PX. The second protruding portion 2102 may be disposed in one of the pixel regions PX. For example, in the corresponpd pixel region PX, the second protruding portion 2102 may be interposed between the photoelectric conversion regions PD. The second protruding portion 2102 may separate the photoelectric conversion regions PD from each other, in the pixel region PX. The width W3 of the top surface of each protruding portion 2103 may be smaller than the width W4' of the bottom surface thereof. Here, the width W4' of the bottom surface of the protruding portion 2103 may correspond to the width of the second isolation pattern 210A measured at the level of the second surface 100b of the first substrate 100.

The gate patterns 300 may be disposed in the pixel regions PX, respectively. The first portions 310 of the gate patterns 300 may be protruding portions that are inserted into or extended toward the photoelectric conversion regions PD. Each of the gate patterns 300 may be the transfer gate TG described with reference to FIG. 1.

At least one of the impurity regions 111 may be used as the floating diffusion region FD. The floating diffusion region FD may be configured to have the same function as the floating diffusion region FD of FIG. 1. The floating diffusion region FD may be disposed between the first portions 310 of the gate patterns 300 of each pixel region PX. The gate patterns 300 of each pixel region PX may share the floating diffusion region FD. The floating diffusion region FD may be vertically overlapped with the second protruding portion 2102 of the second isolation pattern 210A. In the present specification, the term "vertical" may be used to indicate a direction that is parallel or antiparallel to the third direction D3. The floating diffusion region FD may be disposed between the second protruding portion 2102 and the first surface 100a of the first substrate 100.

The planar portion 2105 of the second isolation pattern 210A may be provided on the second surface 100b of the first substrate 100 to cover the second surface 100b of the first substrate 100. The planar portion 2105 of the second isolation pattern 210A may be connected to the protruding portions 2103 without interface therebetween. The second isolation pattern 210A may include at least one of the materials for the insulating layer 500 described with reference to FIGS. 7A and 7B, and the insulating layer 500 may be omitted.

The image sensor may further include the protection layer 530 and the fence pattern 550. The protection layer 530 and the fence pattern 550 may be disposed on a bottom surface of the planar portion 2105 of the second isolation pattern 210A.

The dopant region 410A may have the side portion 410AX, the bottom portion 410AY, and an extended portion 410AZ. The side and bottom portions 410AX and 410AY of the dopant region 410A may be provided to have substantially the same features as those in the embodiments of FIGS. 8A and 8B. For example, the bottom portion 410AY of the dopant region 410A may cover the top surface of the protruding portion 2103 of the second isolation pattern 210A and may be in contact with the bottom surface of the back-side trench 191A. The side portion 410AX of the dopant region 410A may cover the side surface of the protruding portion 2103 of the second isolation pattern 210A and may be in contact with the side surface of the back-side trench 191A.

The extended portion 410AZ of the dopant region 410A may cover the planar portion 2105 of the second isolation pattern 210A. The extended portion 410AZ of the dopant region 410A may be connected to the side portion 410AX without interface therebetween. In an embodiment, the fabrication of the image sensor may include performing a thinning process on the second surface 100b of the first substrate 100, and in this case, an interface defect may be formed on the second surface 100b of the first substrate 100 during the thinning process. During operations of the image sensor, the interface defect may result in a dark current. According to an embodiment, the extended portion 410AZ of the dopant region 410A may be in contact with the second surface 100b of the first substrate 100 and may be used to trap noise electrons, which are produced from the second surface 100b of the first substrate 100. Thus, it may be possible to prevent the dark current from occurring and to further improve the optical characteristics of the image sensor.

The dopant region 410A may have substantially the same thickness. Referring to FIG. 8D, the first and second thicknesses T21 and 122 of the side and bottom portions 410AX and 410AY of the dopant region 410A may be substantially the same as those in FIG. 8B. The extended portion 410AZ of the dopant region 410A may have a third thickness T23; The third thickness T23 may have a tolerance of 15% or less, similar to that in the first and second thicknesses T21 and T22. The third thickness 123 may be from 85% to 115% of the first thickness T21 and may be from 85% to 115% of the second thickness T22. The third thickness T23 may range from about 30 nm to about 180 nm. The concentration of the dopant in the extended portion 410AZ of the dopant region 410A may have a tolerance of 15% or less. The concentration of the dopant in the extended portion 410AZ of the dopant region 410A may be from 85% to 115% of the concentration of the dopant in the side portion 410AX and may be from 85% to 115% of the concentration of the dopant in the bottom portion 410AY. The number of dopants per unit area in the extended portion 410AZ of the dopant region 410A may range from $5.0 \times 10^{11}$ atoms/cm$^2$ to $1.0 \times 10^{14}$ atoms/cm$^2$.

Although not shown, each of the side, bottom, and extended portions 410AX, 410AY, and 410AZ of the dopant region 410A may include a first region and a second region, and in this case, the first region and the second region may have substantially the same features as the first regions 41X and 41Y and the second regions 42X and 42Y of the doped region 40 in the embodiment described with reference to FIGS. 4A and 4B. The first region of the extended portion 410AZ of the dopant region 410A may be in contact with the second surface 100b of the first substrate 100 and may further include a first auxiliary element. The concentration of the first auxiliary element in the first region of the extended portion 410AZ may be lower than the concentration of the dopant in the first region of the extended portion 410AZ and the concentration of the dopant in the second region of the extended portion 410AZ. The first auxiliary element may be, for example, chlorine, fluorine, or hydrogen.

Figure 8E:
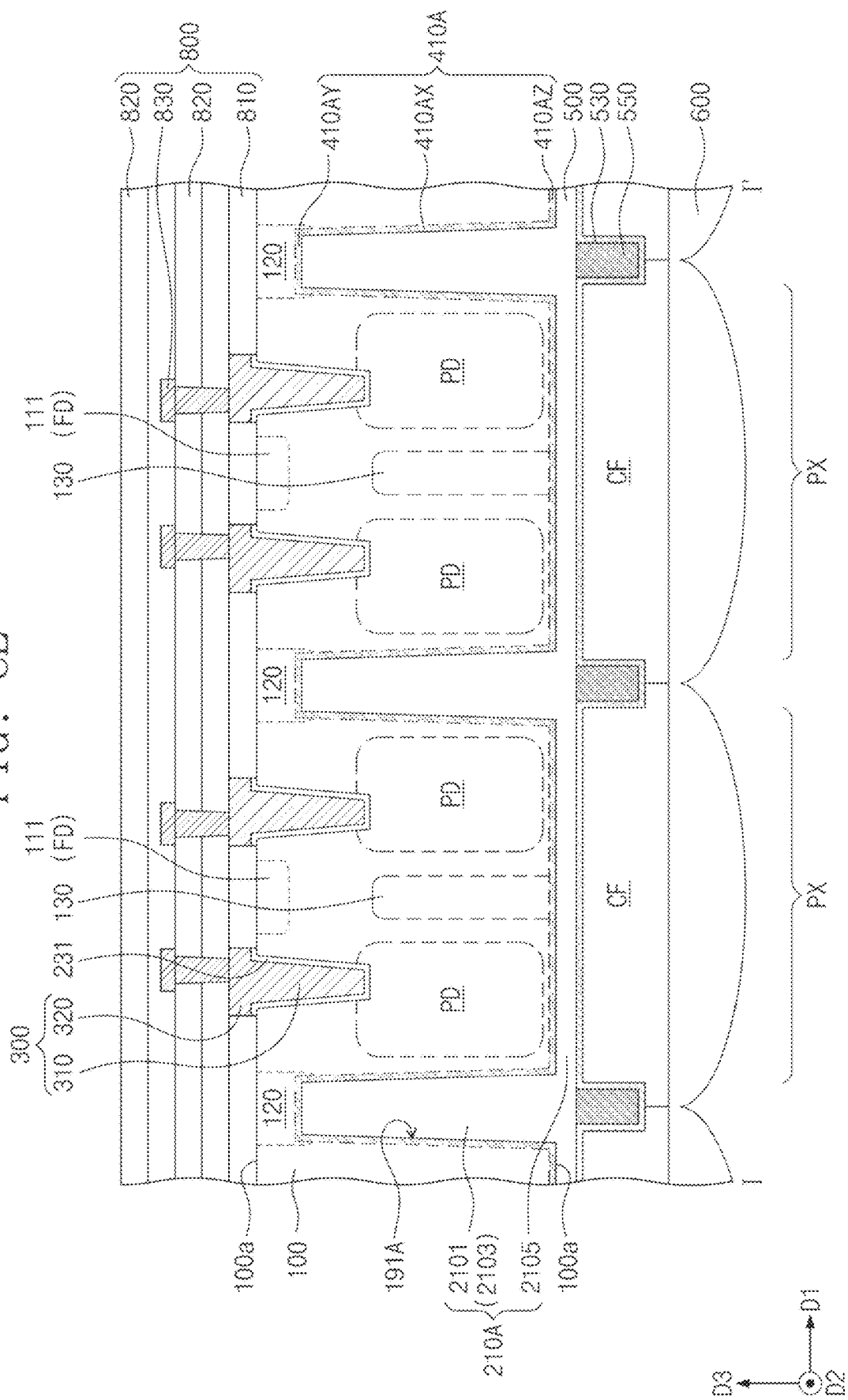
FIG. 8E is a sectional view illustrating a pixel array region of an image sensor according to an embodiment.

FIG. 8E is a sectional view, which is taken along a line I-I' of FIG. 6 to illustrate a pixel array region of an image sensor according to an embodiment.

Referring to FIG. 8E, the image sensor may include the first substrate 100, the first interconnection layer 800, the dopant region 410A, the second isolation pattern 210A the device isolation pattern 220, the gate patterns 300, the color filters CF, and the micro lens layer 600. A plurality of the photoelectric conversion regions PD may be disposed in each pixel region PX.

The dopant region 410A, the second isolation pattern 210A, the floating diffusion region FD, and the gate patterns 300 may be provided to have substantially the same features as those in the embodiments of FIGS. 8C and 8D. However, in an embodiment, the second isolation pattern 210A may include the first protruding portion 2101 and the planar portion 2105 but may omit the second protruding portion 2102 in the embodiment of FIGS. 8C and 8D. The first substrate 100 may include a doped isolation region 130. The doped isolation region 130 may be provided between the photoelectric conversion regions PD, in each pixel region PX. In each pixel region PX, the doped isolation region 130 may separate the photoelectric conversion regions PD optically and electrically from each other. The doped isolation region 130 may be disposed to be adjacent to the second surface 100b of the first substrate 100. The floating diffusion region FD may be vertically overlapped with the doped isolation region 130. A top surface of the doped isolation region 130 may be spaced apart from the bottom surface of the floating diffusion region FD. The doped isolation region 130 may include at least one of group 3 elements. The doped isolation region 130 may be a region that is doped with impurities of the first conductivity type (e.g., p-type).

Figure 9A:
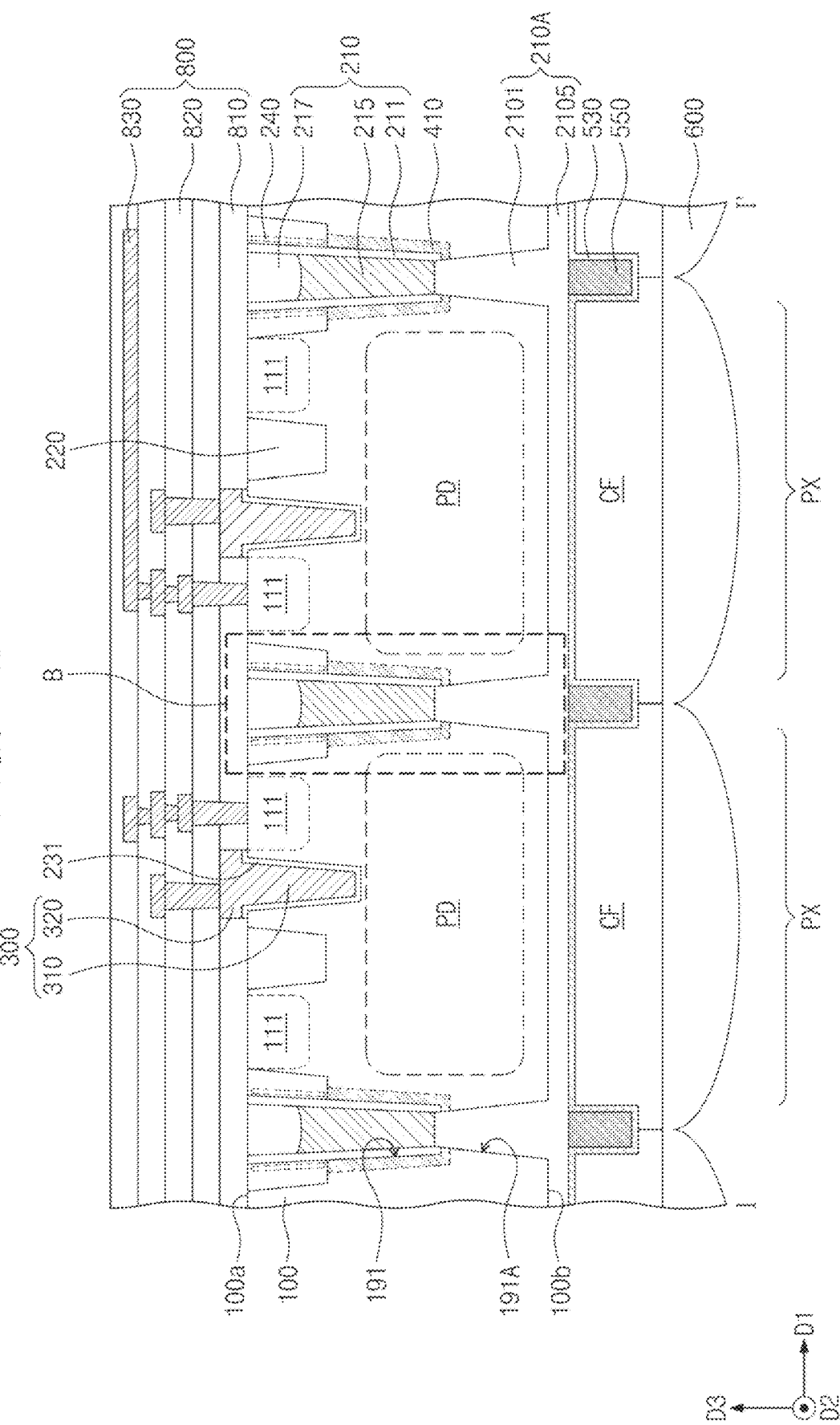
FIG. 9A is a sectional view illustrating a pixel array region of an image sensor according to an embodiment.
Figure 9B:
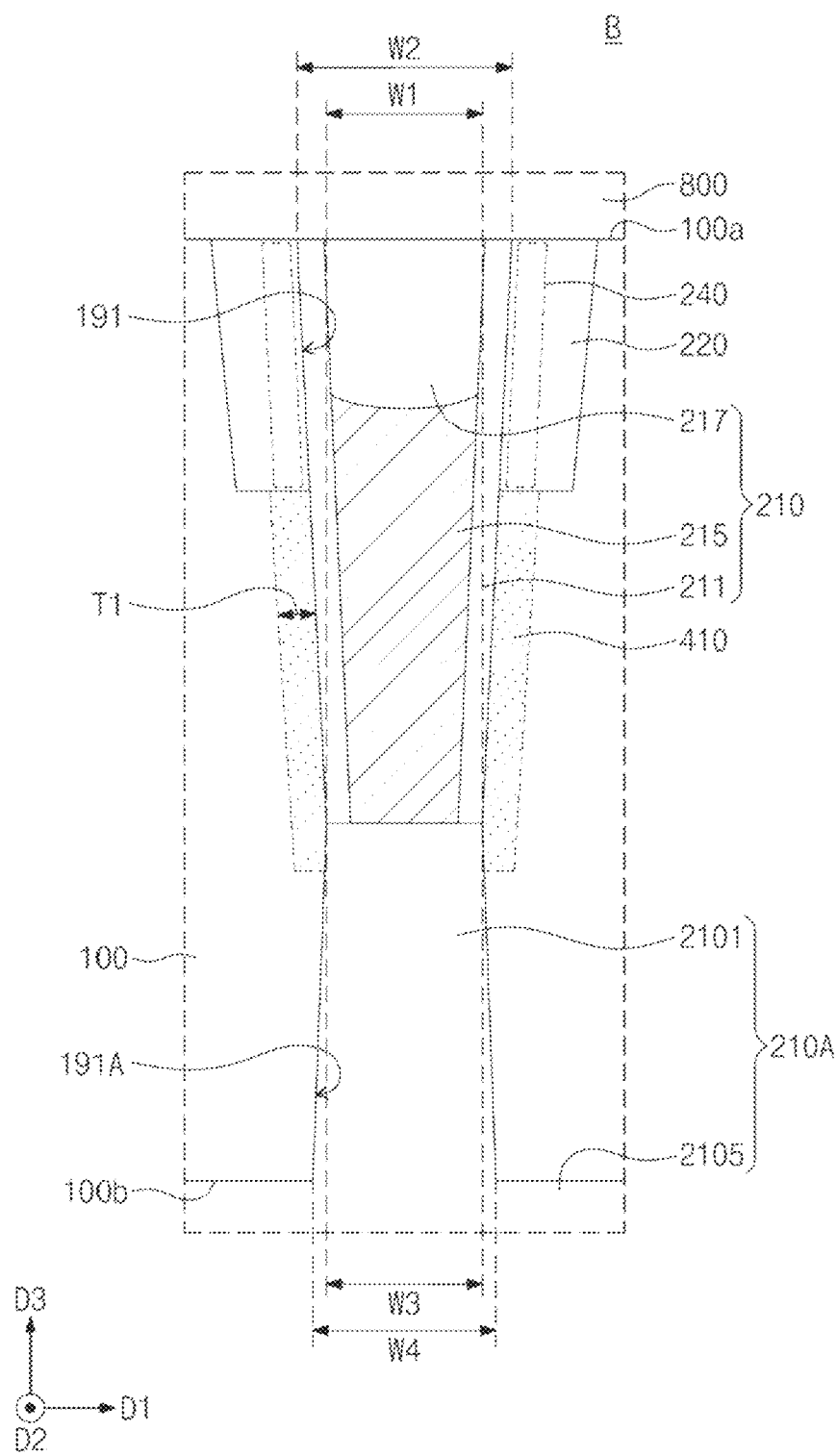
FIG. 9B is an enlarged sectional view illustrating a portion B of FIG. 9A.
Figure 9C:
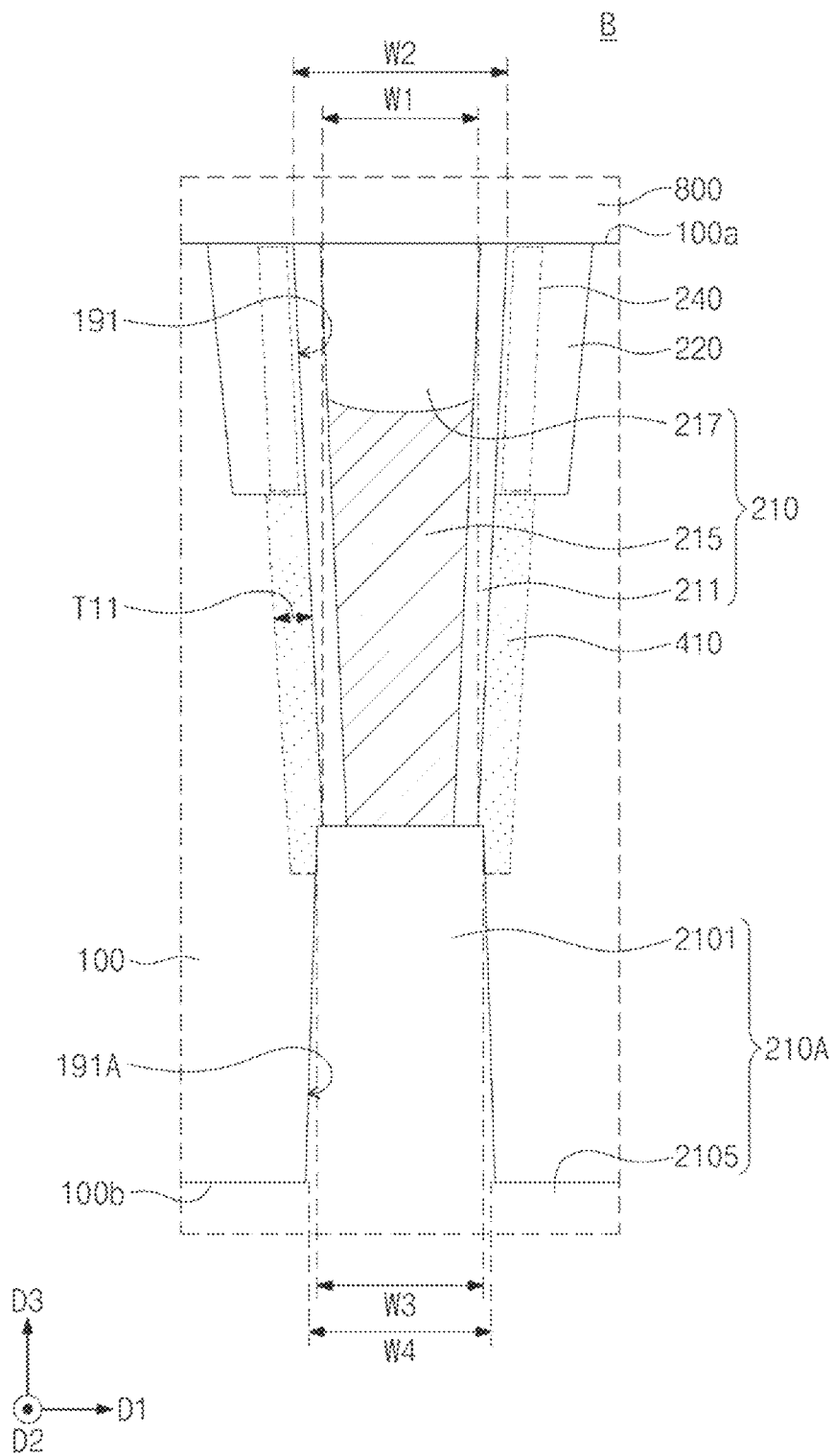
FIG. 9C is a sectional view illustrating a first isolation pattern and a second isolation pattern, according to an embodiment.

FIG. 9A is a sectional view, which is taken along a line I-I' of FIG. 6 to illustrate a pixel array region of an image sensor according to an embodiment. FIG. 9B is an enlarged sectional view illustrating a portion B of FIG. 9A. FIG. 9C is a sectional view illustrating a first isolation pattern and a second isolation pattern according to an embodiment and is an enlarged sectional-view corresponding to the portion B of FIG. 9A.

Referring to FIGS. 9A, 9B, and 9C, the image sensor may include the first substrate 100, the first interconnection layer 800, the first isolation pattern 210, the second isolation pattern 2 WA, the first doped region 410, isolation pattern 220, the gate pattern 300, the color filters CF, and the micro lens layer 600. The image sensor may further include the protection layer 530 and the fence pattern 550.

The second isolation pattern 210A may be disposed between the photoelectric conversion regions PD and in the first substrate 100. The second isolation pattern 210A may be provided to have substantially the same features as those in the embodiment of FIG. 8E. For example, the second isolation pattern 210A may include the first protruding portion 2101 and the planar portion 2105. As another example, in some embodiments, the second isolation pattern 210A may omit the planar portion 2105.

The first isolation pattern 210 may be provided in the first substrate 100 and between the photoelectric conversion regions PD. The first isolation pattern 210 may be provided to have substantially the sale features as those in the embodiments of FIGS. 7A to 7E. However, in an embodiment, the bottom surface of the first isolation pattern 210 may be located at a level higher than the second surface 100b of the first substrate 100. The first isolation pattern 210 may be disposed between the second isolation pattern 210A and the first surface 100a of the first substrate 100. The first isolation pattern 210 may be connected to the second isolation pattern 210A. For example, the bottom surface of the first isolation pattern 210 may be in contact with the top surface of the first protruding portion 2101 of the second isolation pattern 210A. Thus, the first isolation pattern 210 and the second isolation pattern 210A may define the pixel regions PX.

The first doped region 410 may be provided in the first substrate 100 to be in contact with the side surface of the first isolation pattern 210. The first doped region 410 may be provided to have substantially the same features as those in the embodiments of FIGS. 7A to 7E. In an embodiment, at least a portion of the first doped region 410 may be in contact with an upper portion of the side surface of the second isolation pattern 210A. The first thickness T11 of the first doped region 410 may be substantially uniform and may have a tolerance of 15% or less. The first thickness T11 and the dopant concentration of the first doped region 410 may meet the conditions mentioned in the embodiments of FIGS. 7A to 7E. Although not shown, the first insulating pattern 211 may further include the first additional element 401A, similar to the previous embodiment described with reference to FIG. 7E.

As shown in FIGS. 9B and 9C, the width W3 of the top surface of the second isolation pattern 210B may be smaller than the width W4 of the bottom surface of the second isolation pattern 210A. The width W2 of the top surface of the first isolation pattern 210 may be greater than the width W1 of the bottom surface of the first isolation pattern 210.

As shown in FIG. 9B, in some embodiments, the width W3 of the top surface of the second isolation pattern 210A may be substantially equal to the width W1 of the bottom surface of the first isolation pattern 210.

As shown in FIG. 9C, in some embodiments, the width W3 of the top surface of the second isolation pattern 210A may be larger than the width W1 of the bottom surface of the first isolation pattern 210.

Figure 9D:
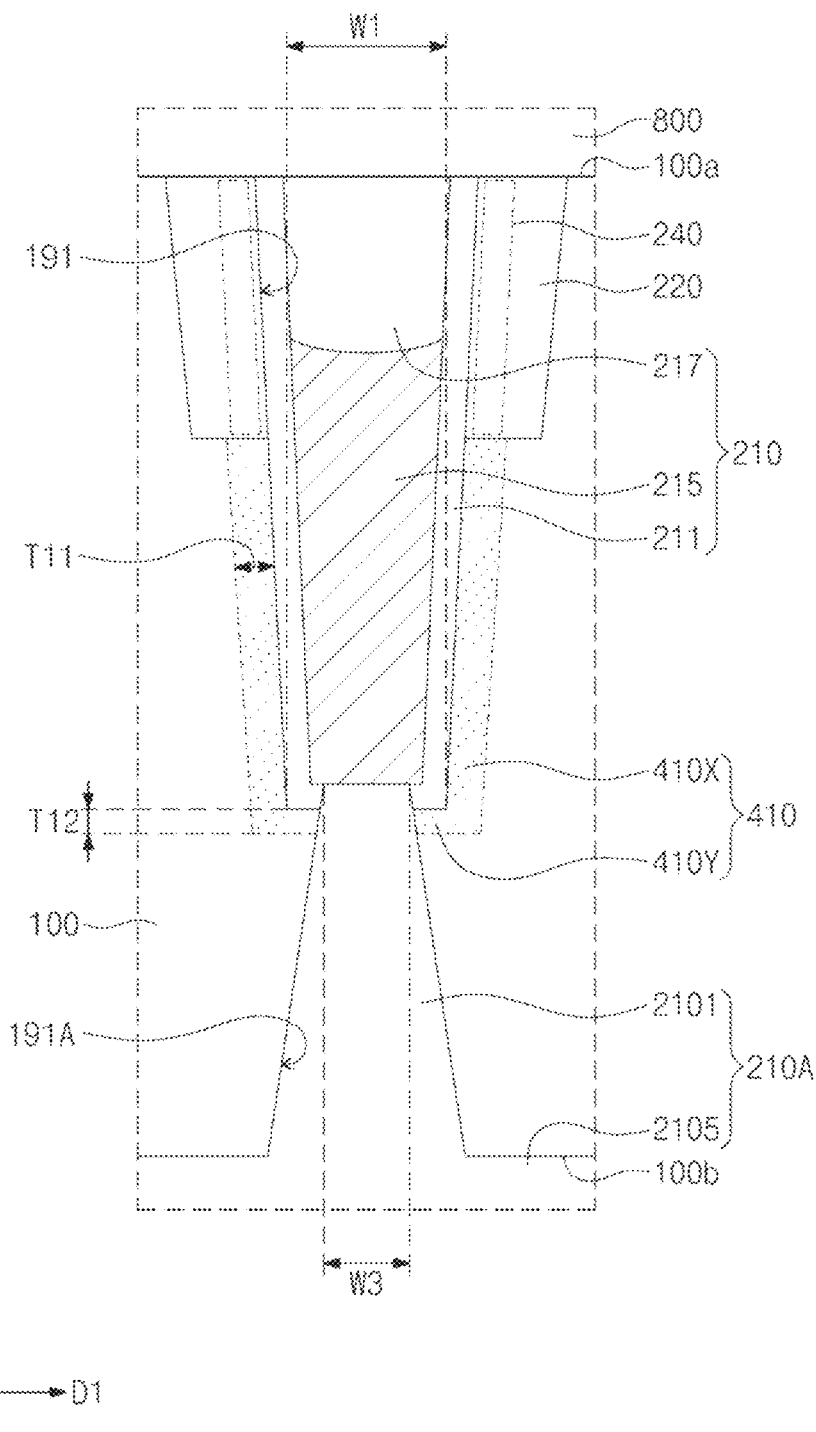
FIG. 9D is a sectional vi illustrating a first isolation pattern, a second isolation pattern, and a first doped region according to an embodiment.

FIG. 9D is a sectional view illustrating a first isolation pattern, a second isolation pattern, and a first doped region according to an embodiment and is an enlarged sectional view corresponding to the portion B of FIG. 9A.

Referring to FIG. 9D, in some embodiments, the width W1 of the bottom surface of the first isolation pattern 210 may be larger than the width W3 of the top surface of the second isolation pattern 210A. The first doped region 410 may include a first side portion 410X and a first bottom portion 410Y. The first side portion 410X and the first bottom portion 410Y of the first doped region 410 may be respectively provided on the side and bottom surfaces of the first isolation pattern 210. The first side portion 410X and the first bottom portion 410Y of the first doped region 410 may have substantially the same features as the side and bottom portions 40X and 40Y of the doped region 40 in the embodiments described with reference to FIGS. 2B and 2C. FIGS. 4A and 4B or FIGS. 5C and 5D. For example, the first thickness T11 of the first side portion 410X may be from 85% to 115% of a second thickness T12 of the first bottom portion 410Y. The concentration of the dopant in the first side portion 410X may be from 85% to 115% of the concentration of the dopant the first bottom portion 410Y. The number of dopants per unit area in each of the first side portion 410X and the first bottom portion 410Y may range from $5.0 \times 10^{11}$ atoms/cm$^2$ to $1.0 \times 10^{14}$ atoms/cm$^2$. However, in an embodiment, the second isolation pattern 210A may penetrate the first bottom portion 410Y of the first doped region 410 and may be in contact with the bottom surface of the first isolation pattern 210.

As another example, the first insulating pattern 211 may further include the first additional element 401A described with reference to FIGS. 5A and 5B.

As another example, each of the first side portion 410X and the first bottom portion 410Y of the first doped region 410 may further include a first region and a second region. The first region and the second region of the first doped region 410 may have substantially the same features as the first regions 41X and 41Y and the second regions 42X and 42Y of the doped region 40 in the embodiments described with reference to FIGS. 4A and 4B or FIGS. 5C and 5D. For example, the first region of the first doped region 410 may further include the first auxiliary element.

As still another example, the first region of the first doped region 410 may further include a first auxiliary element, and the first insulating pattern 211 may further include a first additional element and a second auxiliary element.

Figure 9E:
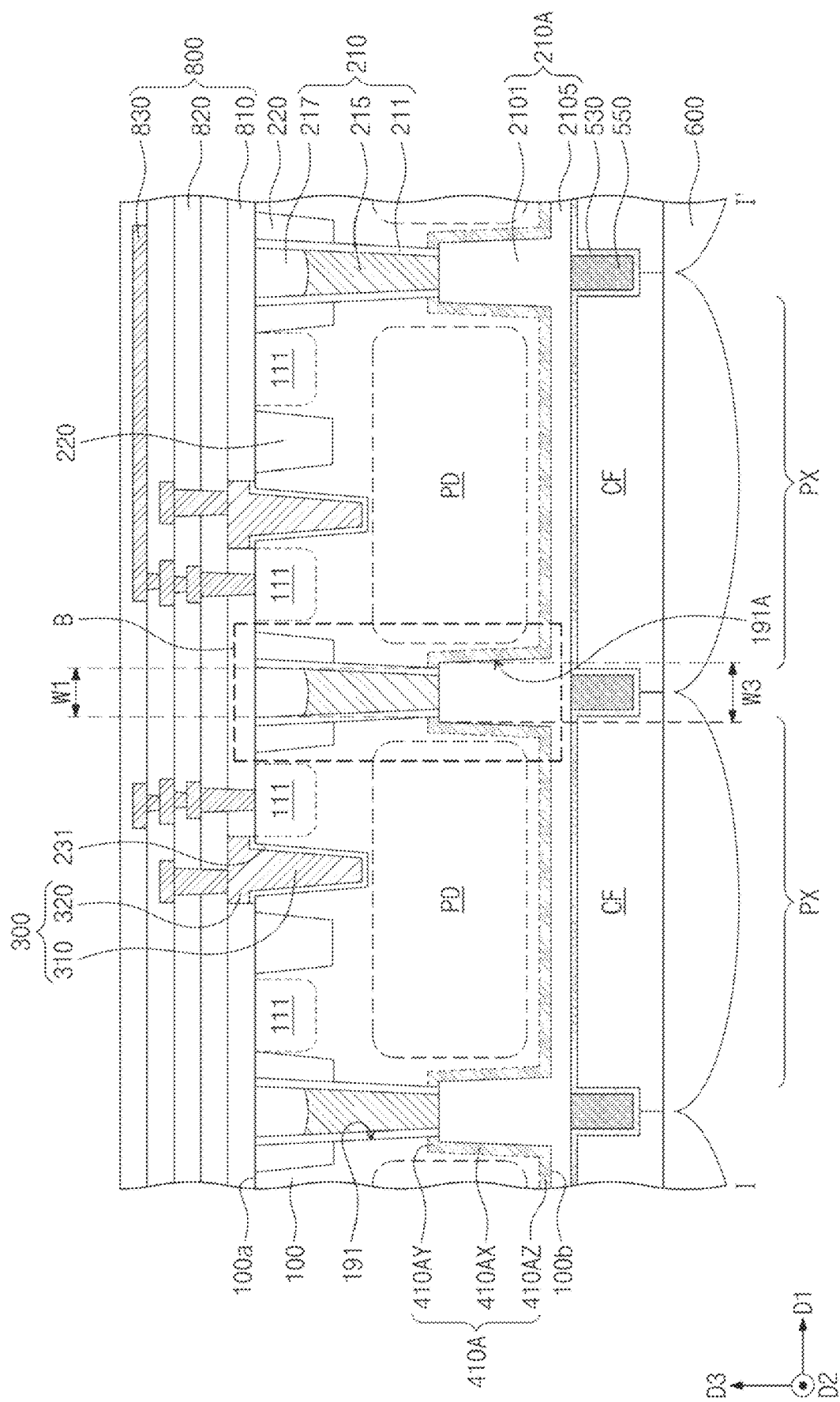
FIG. 9E is a sectional view illustrating a pixel array region of an image sensor according to an embodiment.
Figure 9F:
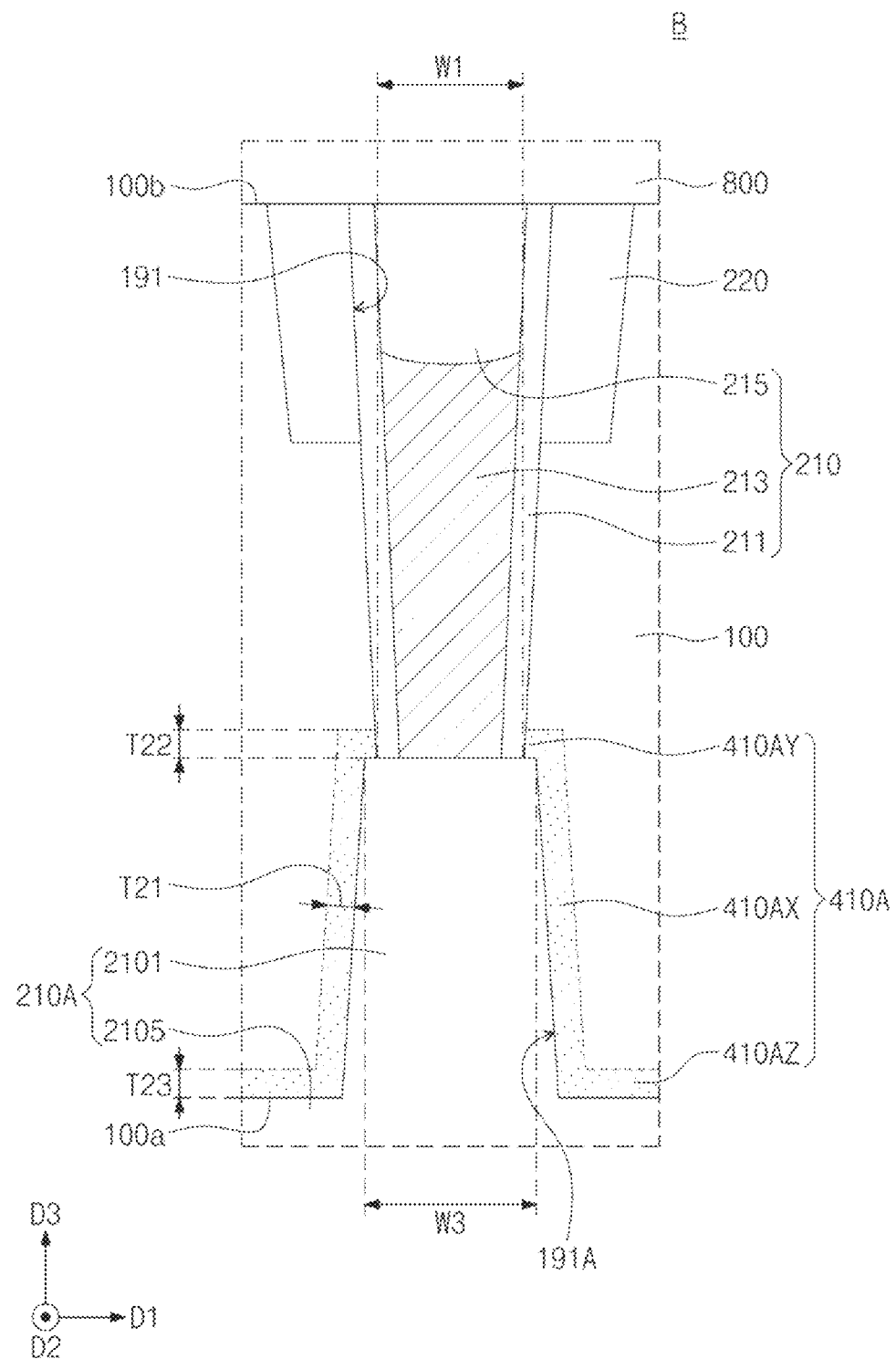
FIG. 9F is an enlarged sectional view illustrating a portion B of FIG. 9E.

FIG. 9E is a sectional view, which is taken along a line I-I' of FIG. 6 to illustrate a pixel array region of an image sensor according to an embodiment. FIG. 9F is an enlarged sectional view illustrating a portion B of FIG. 9E.

Referring to FIGS. 9E and 9F, the image sensor may include the first substrate 100, the first interconnection layer 800, the dopant region 410A, the first isolation pattern 210, the second isolation pattern 210A, the device isolation pattern 220, the gate pattern 300, the color filters CF, and the micro lens layer 600.

The first isolation pattern 210 and the second isolation pattern 210A may be provided to have substantially the same features as those in the embodiment of FIG. 9A or 9C. The width W3 of the top surface of the second isolation pattern 210A may be larger than the width W1 of the bottom surface of the first isolation pattern 210.

The dopant region 410A may be provided in the first substrate 100 to be in contact with the side and bottom surfaces of the back-side trench 191A. The dopant region 410A may include the side and bottom portions 410AX and 410AY, and in this case, the side and bottom portions 410AX and 410AY may be provided to have substantially the same features as those in the embodiments of FIGS. 8A and 8B or in the embodiments of FIGS. 8C and 8D.

The dopant region 410A may further include the extended portion 410AZ, and the extended portion 410AZ may be in contact with the second surface 100b of the first substrate 100. The extended portion 410AZ may be provided to have substantially the same features as that in the embodiment of FIGS. 8C and 8D. For example, the first thickness T21 of the side portion 410AX of the dopant region 410A, the second thickness T22 of the bottom portion 410AY, and the third thickness T23 of the extended portion 410AZ may meet the conditions mentioned in the embodiments of FIGS. 8A to 8D.

Unlike the illustrated structure in FIG. 9E, in some embodiments, the with W3 of the top surface of the second isolation pattern 210A may be equal to or smaller than the width W1 of the bottom surface of the first isolation pattern 210. In this case, the dopant region 410A may omit the bottom portion 410AY.

Figure 9G:
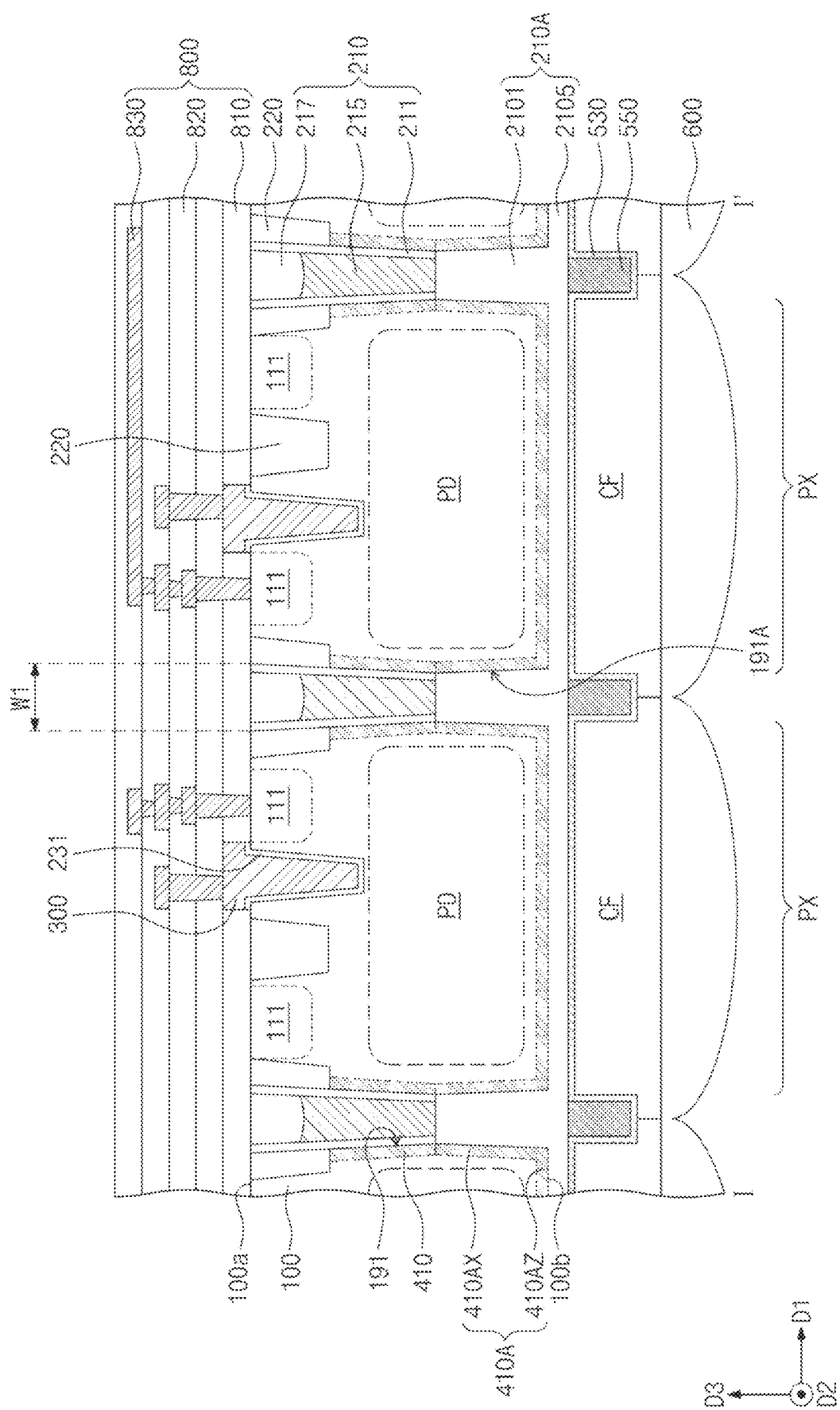
FIG. 9G is a sectional view illustrating a pixel array region of an image sensor according to an embodiment.

FIG. 9G is a sectional view, which is taken along a line I-I' of FIG. 6 to illustrate a pixel array region of an image sensor according to an embodiment.

Referring to FIG. 9G, the image sensor may include the first substrate 100, the Pint interconnection layer 800, the first doped region 410, the dopant region 410A, the first isolation pattern 210, the second isolation pattern 210A, the gate pattern 300, the color filters CF, and the micro lens layer 600. The first isolation pattern 210 and the second isolation pattern 210A may define the pixel region PX in the first substrate 100.

The first doped region 410 may be provided in the first substrate 100 to be in contact with the side surface of the first isolation pattern 210. The first doped region 410 may be provided to have substantially the same features as that in the embodiments of FIGS. 9A to 9D.

The dopant region 410A may be provided in the first substrate 100 and may be in contact with the side surface of the first protruding portion 2101 and the top surface of the planar portion 2105 of the second isolation pattern 210A. The dopant region 410A may include the side portion 410AX and the extended portion 410AZ. The bottom surface of the first isolation pattern 210 may have a width, which is larger than or equal to the top surface of the second isolation pattern 210A, and in this case, the dopant region 410A may omit the bottom portion 410AY. In the case where the bottom surface of the first isolation pattern 210 has a width larger than the top surface of the second isolation pattern 210A, the first doped region 410 may further include the first bottom portion 410Y, as shown in FIG. 9D. As another example, the bottom surface of the first isolation pattern 210 may have a width which is smaller than the top surface of the second isolation pattern 210A, and in this case, the dopant region 410A may further include the bottom portion 410AY, as shown in FIG. 9F.

Figure 9H:
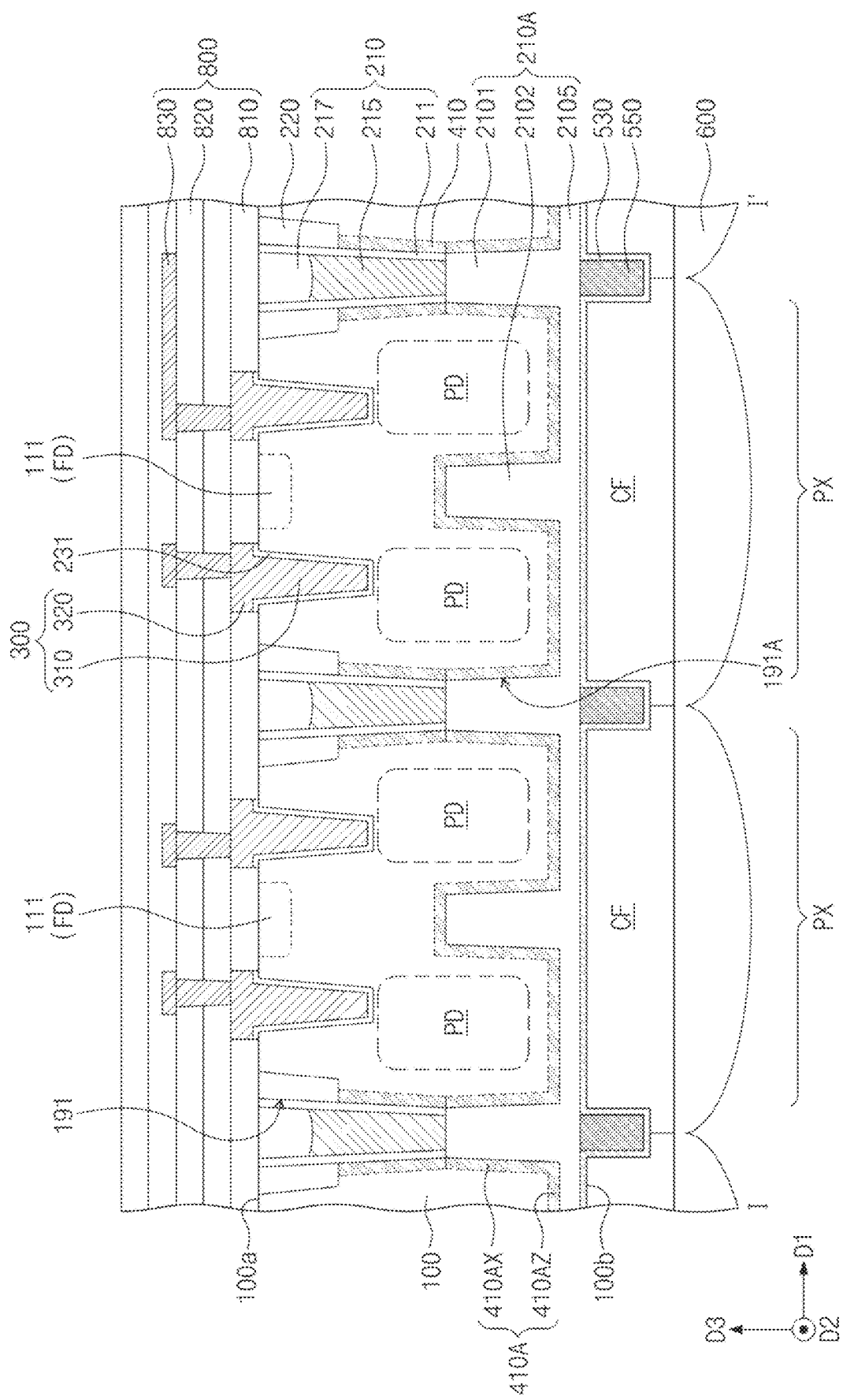
FIG. 9H is a sectional view illustrating a pixel array region of an image sensor according to an embodiment.

FIG. 9H is a sectional view, which is taken along a line I-I' of FIG. 6 to illustrate a pixel array region of an image sensor according to an embodiment.

Referring to FIG. 9H, the image sensor may include the first substrate 100, the first interconnection layer 800, the fit doped region 410, the dopant region 410A, the first isolation pattern 210, the second isolation pattern 210A, the gate patterns 300, the color filters CF, and the micro lens layer 600. A plurality of the photoelectric conversion regions PD may be provided in each pixel region PX.

The second isolation pattern 210A may include the first protruding portion 2101, the second protruding portion 2102, and the planar portion 2105. The disposition of the second protruding portion 2102, the floating diffusion region FD, and the gate patterns 300 may be substantially the same as those in the embodiment of FIGS. 8C and 8D. For example, the second protruding portion 2102 may be disposed between the photoelectric conversion regions PD, in each pixel region PX of the first substrate 100. The second protruding portion 2102 may have a top surface that is located in the first substrate 100 and may not be in physical contact with the first isolation pattern 210. The second protruding portion 2102 may be vertically spaced apart from the floating diffusion region FD. The floating diffusion region FD may be interposed between the first portions 310 of the gate patterns 300 in each pixel region PX.

The dopant region 410A may include the side portion 410AX and the extended portion 410Z. The side portion 410AX of the dopant region 410A may be disposed on the side surfaces of the first and second protruding portions 2101 and 2102 of the second isolation pattern 210A. The extended portion 410AZ may be disposed on top surface of the planar portion 2105 of the second isolation pattern 210A and may be in contact with the second surface 100b of the first substrate 100. As another example, one of the bottom and extended portions 410AY and 410AZ of the dopant region 410A may be omitted. As other example, at least one of the first doped region 410 and the dopant region 410A may be omitted.

Figure 10A:
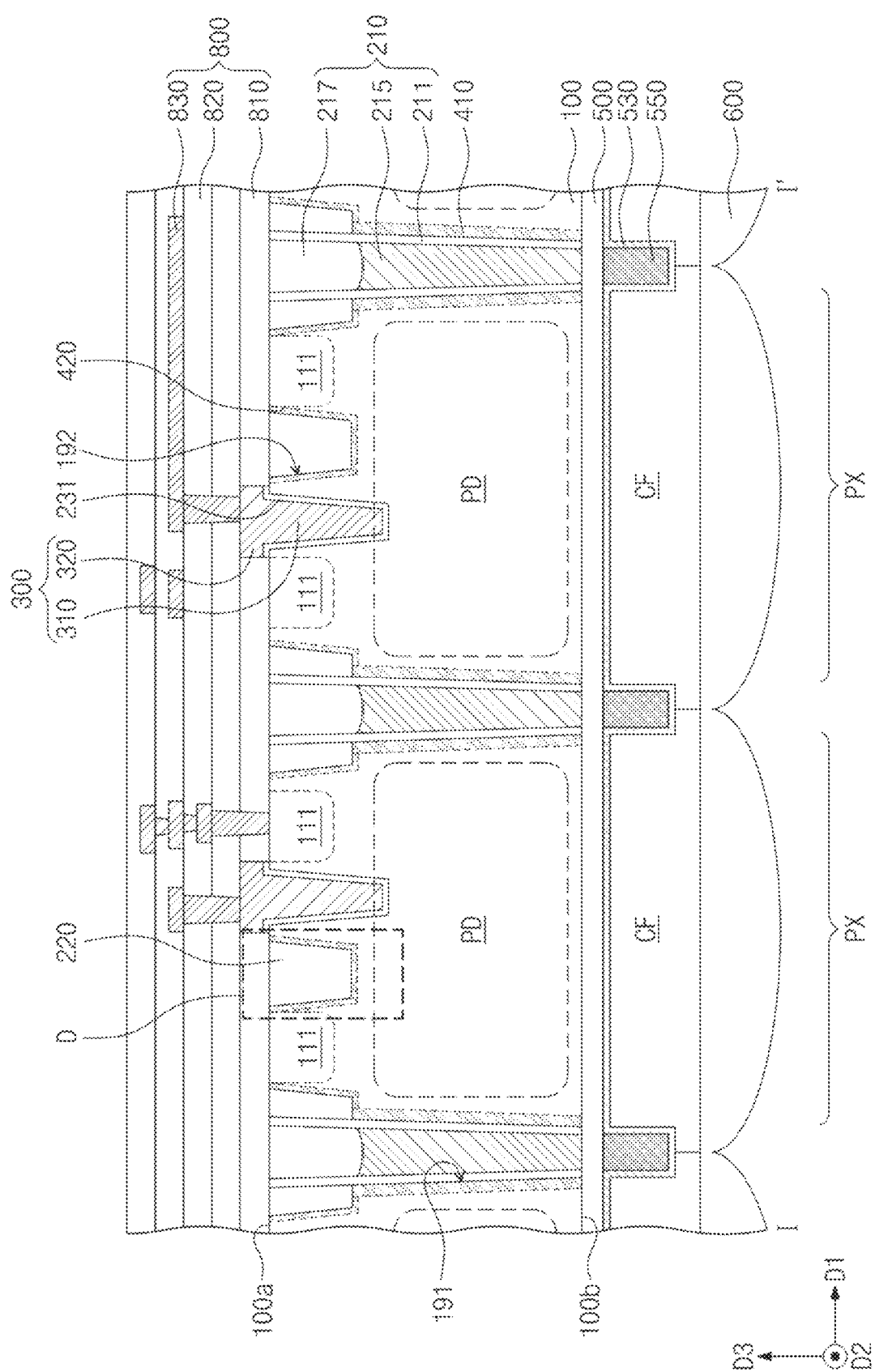
FIG. 10A is a sectional view illustrating a pixel array region of an image sensor according to an embodiment.
Figure 10B:
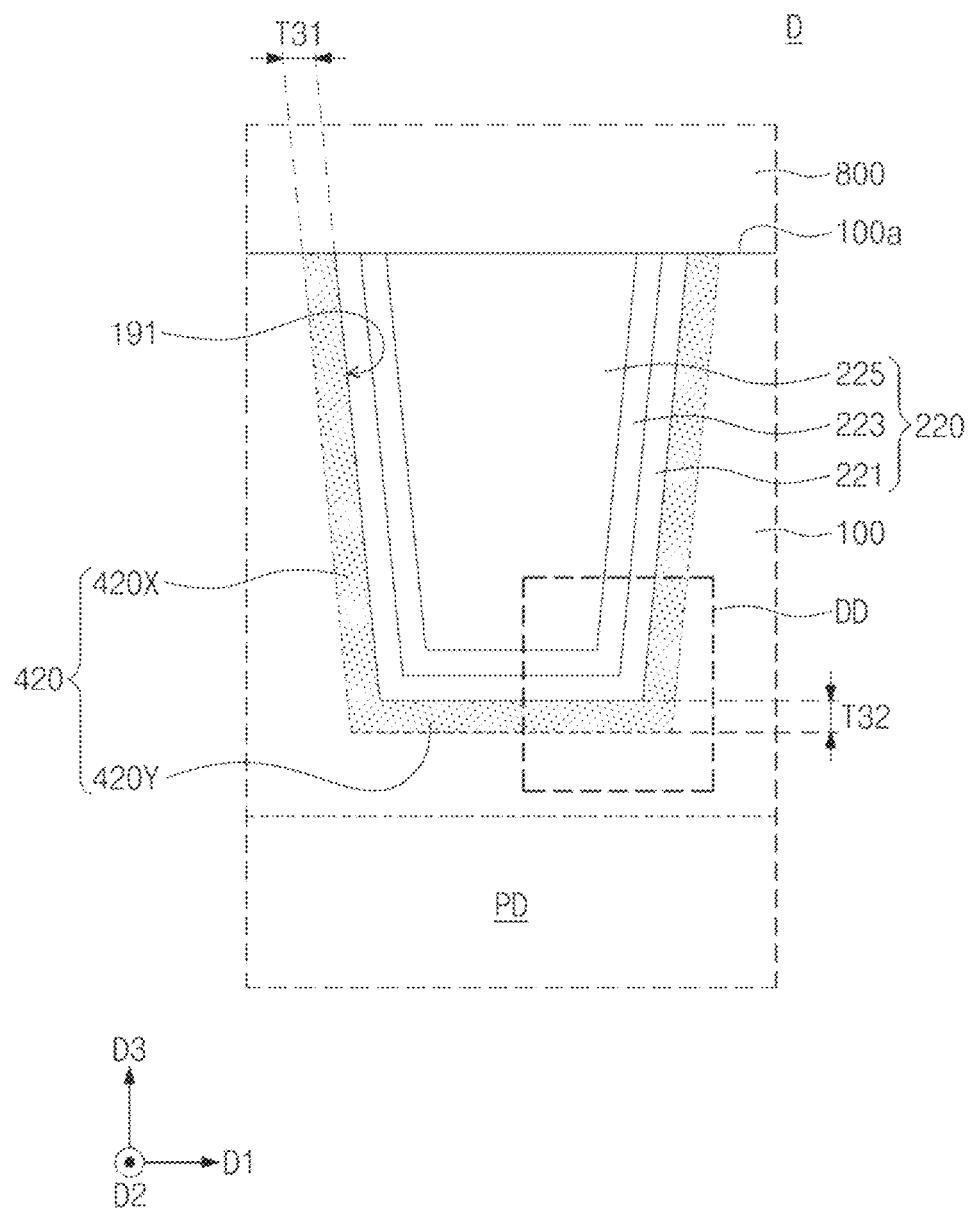
FIG. 10B is an enlarged sectional view illustrating a portion D of FIG. 10A.

FIG. 10A is a sectional view, which is taken along a line I-I' of FIG. 6 to illustrate a pixel array region of an image sensor according to an embodiment. FIG. 10B is an enlarged sectional view illustrating a portion D of FIG. 10A.

Referring to FIGS. 10A and 10B, the image sensor may include the first substrate 100, the first interconnection layer 800, the first isolation pattern 210, the device isolation pattern 220, the first doped region 410, a second doped region 420, the gate pattern 300, the color filters CF, and the micro lens layer 600.

The device isolation pattern 220 may be provided in the second trench 192. In an embodiment, the device isolation pattern 220 may include the second insulating pattern 221, the third insulating pattern 223, and the buried insulating pattern 225, as shown in FIG. 10B. The second insulating pattern 221, the third insulating pattern 223, and the buried insulating pattern 225 may be provided to have substantially the same features as those in the embodiments of FIG. 7F.

The second doped region 420 may be provided in the first substrate 100 to be contact with the side and bottom surfaces of the device isolation pattern 220. The second doped region 420 may be interposed between the device isolation pattern 220 and the first substrate 100. The second doped region 420 may be in contact with the side and bottom surfaces of the second trench 192.

The second doped region 420 may include a second side portion 420X and a second bottom portion 420Y and in this case, the second side portion 420X and the second bottom portion 420Y may have substantially the same features as the side and bottom portions 40X and 40Y in the embodiment described with reference to FIGS. 2B and 2C. For example, the second side portion 420X and the second bottom portion 420Y may be in contact with the side and bottom surfaces of the second trench 192, respectively. In the case where noise electrons are produced by interface defects on the side and bottom surfaces of the second trench 192, the noise electrons may be trapped by the second doped region 420. Thus, it may be possible to more effectively prevent the production of the dark current and to improve the optical characteristics of the image sensor.

A first thickness T31 of the second side portion 420X of the second doped region 420 may be 85% to 115% of a second thickness T32 of the second bottom portion 420Y. The tolerance of the first thickness T31 may be equal to or less than 15%, and the tolerance of the second thickness T32 may be equal to or less than 15%. The first thickness T31 may range from about 30 nm to about 180 nm, and the second thickness T32 may range from about 30 nm to about 180 nm.

The concentration of the dopant in the second side portion 420X of the second doped region 420 may have a tolerance of 15% or less, and the concentration of the dopant in the second bottom portion 420Y may have a tolerance of 15% or less. The number of dopants per unit area in the second side portion 420X may be from 85% to 115% of the number of dopants per unit area in the second bottom portion 4201. The number of dopants per unit area in each of the second side portion 420X and the second bottom portion 420Y may range from $5.0 \times 10^{11}$ atoms/cm$^2$ to $1.0 \times 10^{14}$ atoms/cm$^2$.

Figure 10C:
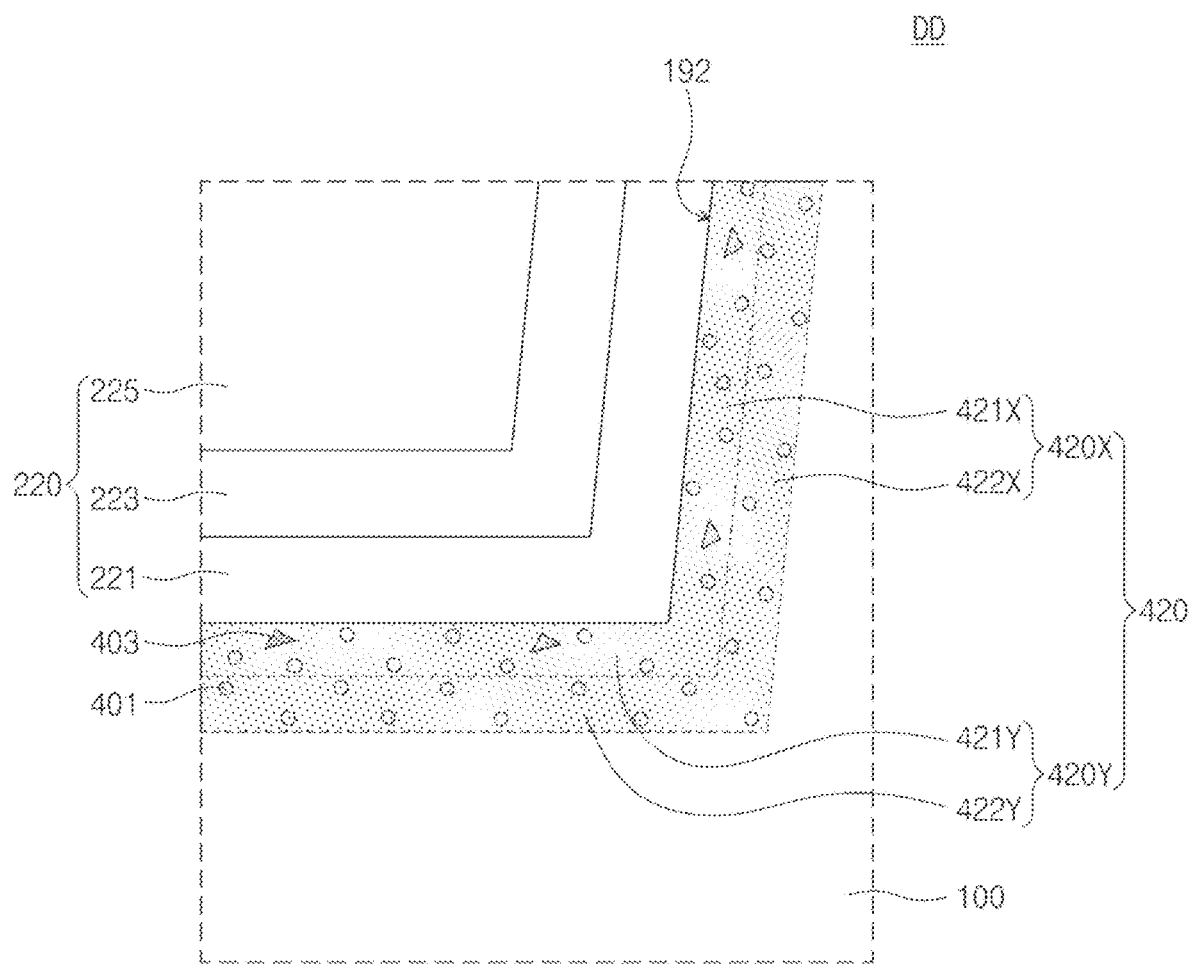
FIGS. 10C, 10D, and 10E are sectional views, each of which illustrates a device isolation pattern and a second doped region according to an embodiment.
Figure 10D:
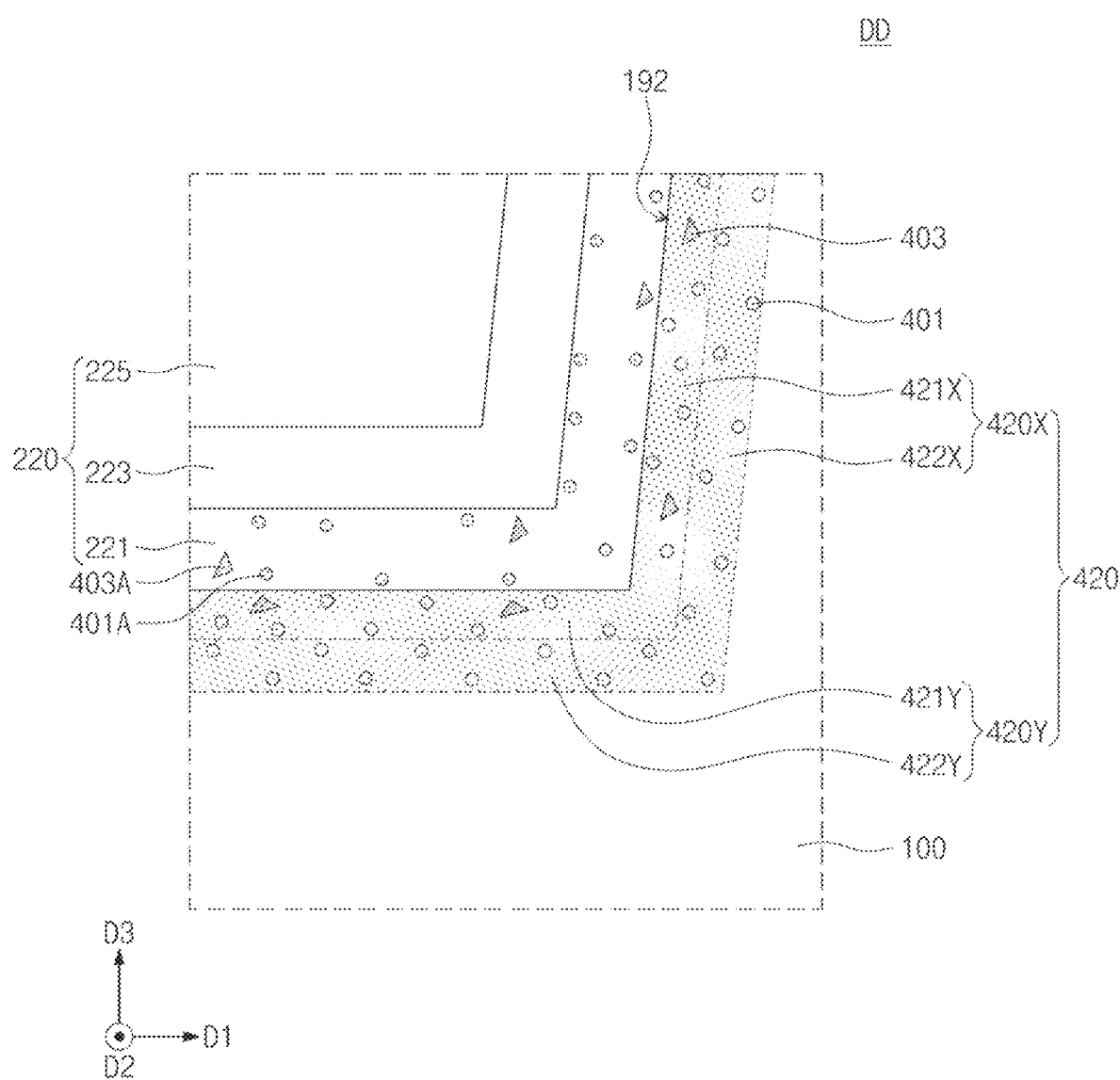
Figure 10E:
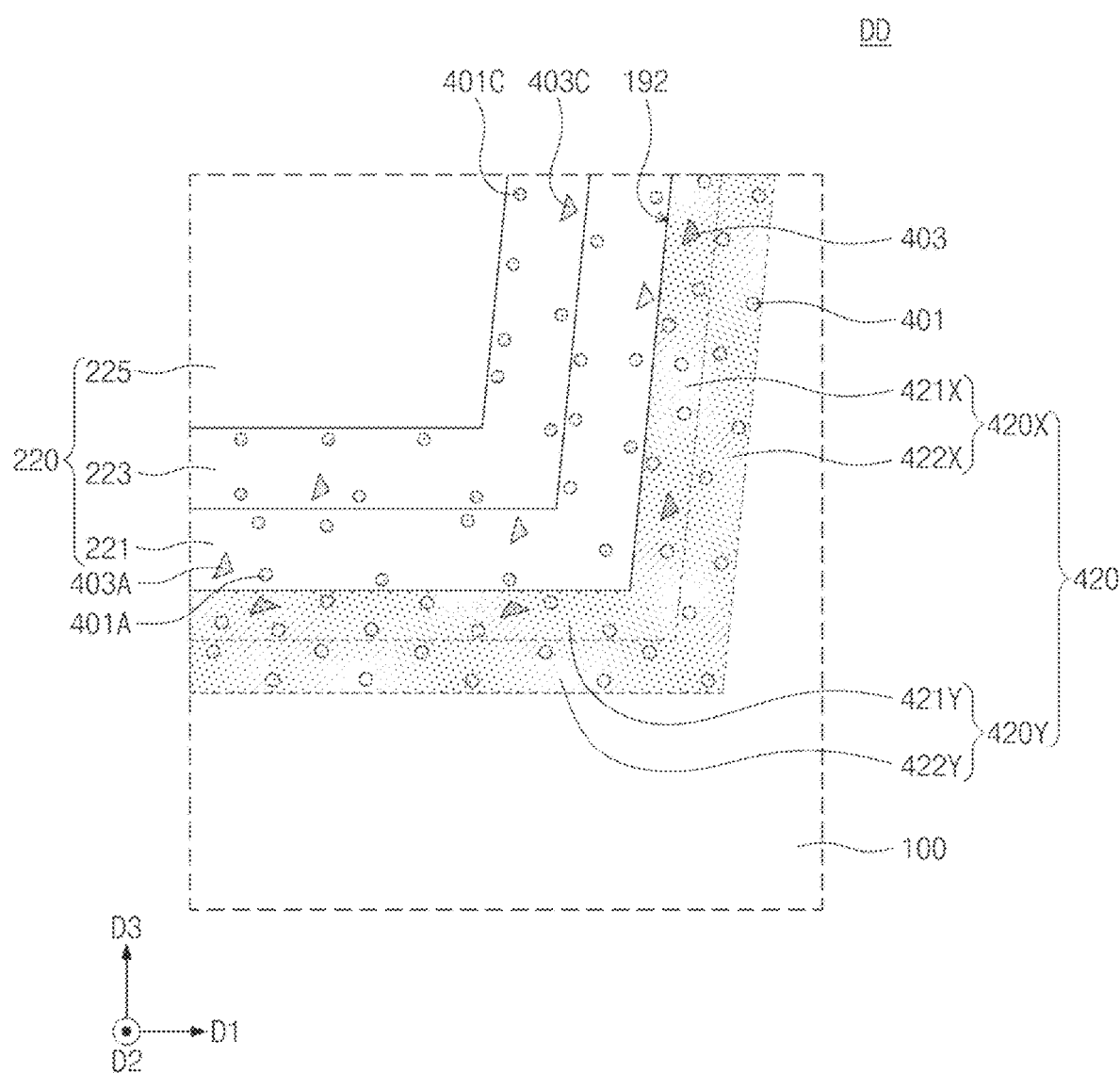

FIGS. 10C, 10D, and 10E are sectional views, each of which illustrates a device isolation pattern and a second doped region according to an embodiment and corresponds to a portion DD of FIG. 10B. The structures according to some embodiments will be described with reference to FIGS. 10C, 10D, and FIG. 10E, in conjunction with FIG. 10A.

Referring to FIGS. 10C, 10D, and 10E, the second side portion 420X of the second doped region 420 may include a first region 421X and a second region 422X. The first region 421X of the second side portion 420X of the second doped region 420 may be in contact with the side surface of the second trench 192 and may be interposed between the first substrate 100 and the second region 422X. The second bottom portion 420Y of the second doped region 420 may include a first region 421Y and a second region 422Y. The first region 421Y of the second bottom portion 420Y of the second doped region 420 may be in contact with the bottom surface of the second trench 192 and may be interposed between the first substrate 100 and the second region 422Y.

The first regions 421X and 421Y and the second regions 422X and 422Y of the second doped region 420 may have substantially the same features as the first regions 41X and 41Y and the second regions 42X and 42Y of the doped region 40 in the embodiments described with reference to FIGS. 4A and 4B. For example, the first regions 421X and 421Y may include the dopant 401 and the first auxiliary element 403. As an example, the first auxiliary element 403 may include chlorine. As another example, the first auxiliary element 403 may include fluorine or hydrogen. The second regions 422X and 422Y of the second doped region 420 may be interposed between the first regions 421X and 421Y and the first substrate 100. The second regions 422X and 422Y may include the dopant 401 but may omit the first auxiliary element 403. As other example, the first regions 421X and 421Y of the second doped region 420 may omit the first auxiliary element 403.

Referring to FIG. 10C, the formation of the second doped region 420 may include performing a GPD process on the side and bottom surfaces of the second trench 192. The GPD process may be performed under the condition described with reference to FIGS. 2B, 2C, and 3. Thereafter, the second insulating pattern 221, the third insulating pattern 223 and the buried insulating pattern 225 may be formed in the second trench 192.

Referring to FIG. 10D, the second insulating pattern 221 may further include the first additional element 401A. The first additional element 401A and the second doped region 420 may be formed by substantially the same method as those in the embodiment of FIGS. 5A and 5B or FIGS. 5C and 5D. According to an embodiment, a GPD process may be performed on the second insulating pattern 221, after the forming of the second insulating pattern 221 in the second trench 192. As a result of the GPD process, the second doped region 420 may be formed by a doping gas, which is supplied into the first substrate 100 through the second insulating pattern 221. Thus, the second doped region 420 may include the dopant 401, and the second insulating pattern 221 may include the first additional element 401A. The first additional element 401A may be the same element as the dopant 401 in the second doped region 420.

The second insulating pattern 221 may further include the second auxiliary element 403A. The second auxiliary element 403A may be the same element as the first auxiliary element 403 in the second doped region 420. In an embodiment, the first auxiliary element 403 and the second auxiliary element 403A may be omitted.

Referring to FIG. 10E, the third insulating pattern 223 may include a third additional element 401C, and the second insulating pattern 221 may include the first additional element 401A. Each of the third additional element 401C and the first additional element 401A maybe the same element as the dopant 401 in the second doped region 420.

According to an embodiment, the second insulating pattern 221 and the third insulating pattern 223 may be sequentially formed in the second trench 192. Next, a GPD process may be performed on the third insulating pattern 223. As a result of the GPD process, the second doped region 420 may be formed by a doping gas, which is supplied into the first substrate 100 through the third insulating pattern 223 and the second insulating pattern 221. Thus, the second doped region 420 may include the dopant 401, and the second insulating pattern 221 and the third insulating pattern 223 may include the first additional element 401A and the third additional element 401C, respectively.

As another example, a first GPD process may be performed on the second insulating pattern 221. After the first GPD process, the third insulating pattern 223 may be formed on the second insulating pattern 221. A second GPD process may be performed on the third insulating pattern 223. The first GPD process and the second GPD process may be performed under the condition described with reference to FIG. 3.

The first regions 411X and 421X of the first doped region 410 may further include the first auxiliary element 403. The third insulating pattern 223 may further include a fourth auxiliary element 4030, and the second insulating pattern 221 may further include the second auxiliary element 403A. The first auxiliary element 403 in the second doped region 420 may be the same element as the second and fourth auxiliary elements 403A and 403C. For example, each of the second and fourth auxiliary elements 403A and 403C may be chlorine, fluorine, or hydrogen.

As another example, the first auxiliary element 403, the second auxiliary element 403A, and the fourth auxiliary element 403C may be omitted.

Figure 11A:
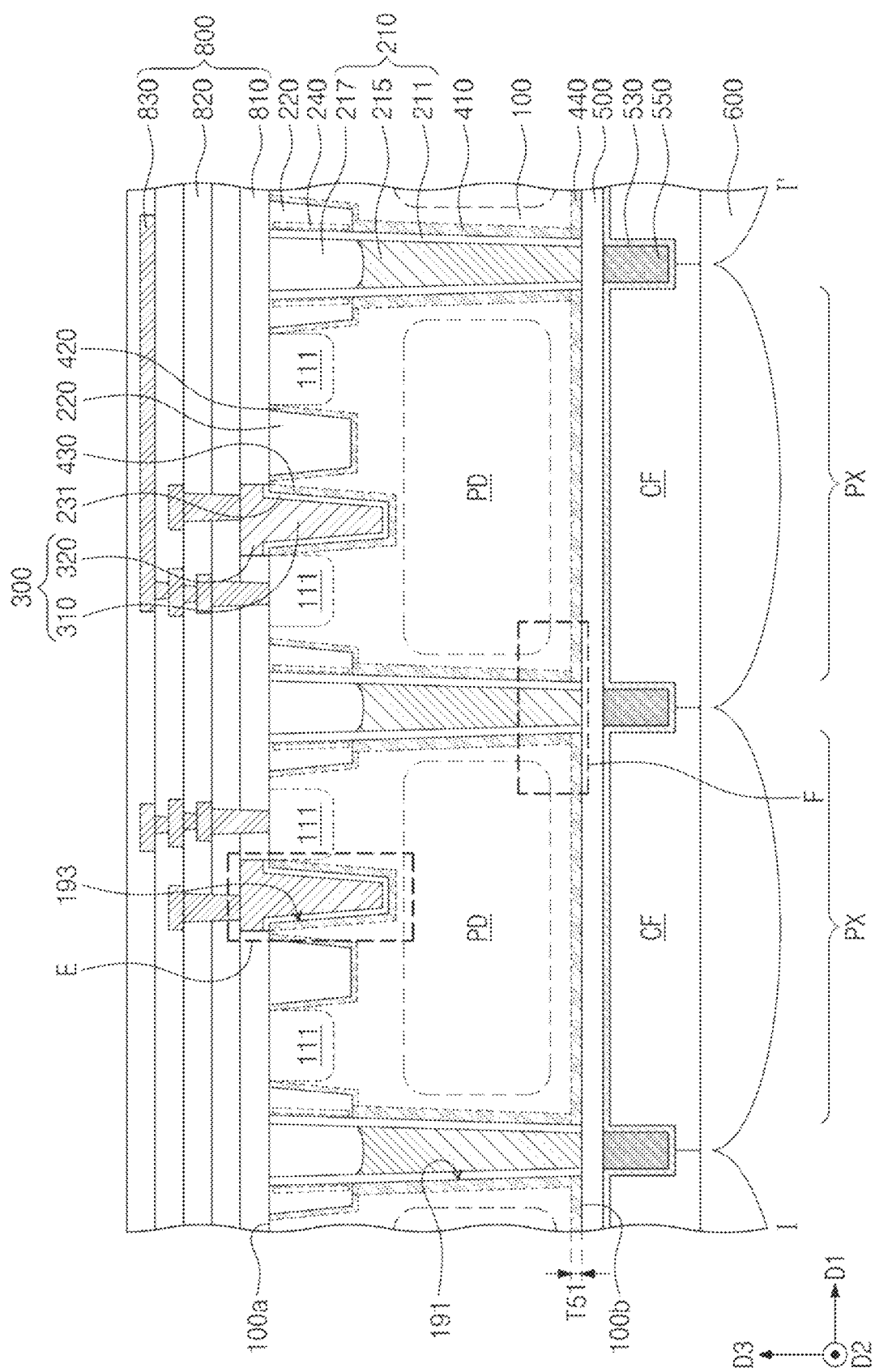
FIG. 11A is a sectional view illustrating a pixel array region of an image sensor according to an embodiment.
Figure 11B:
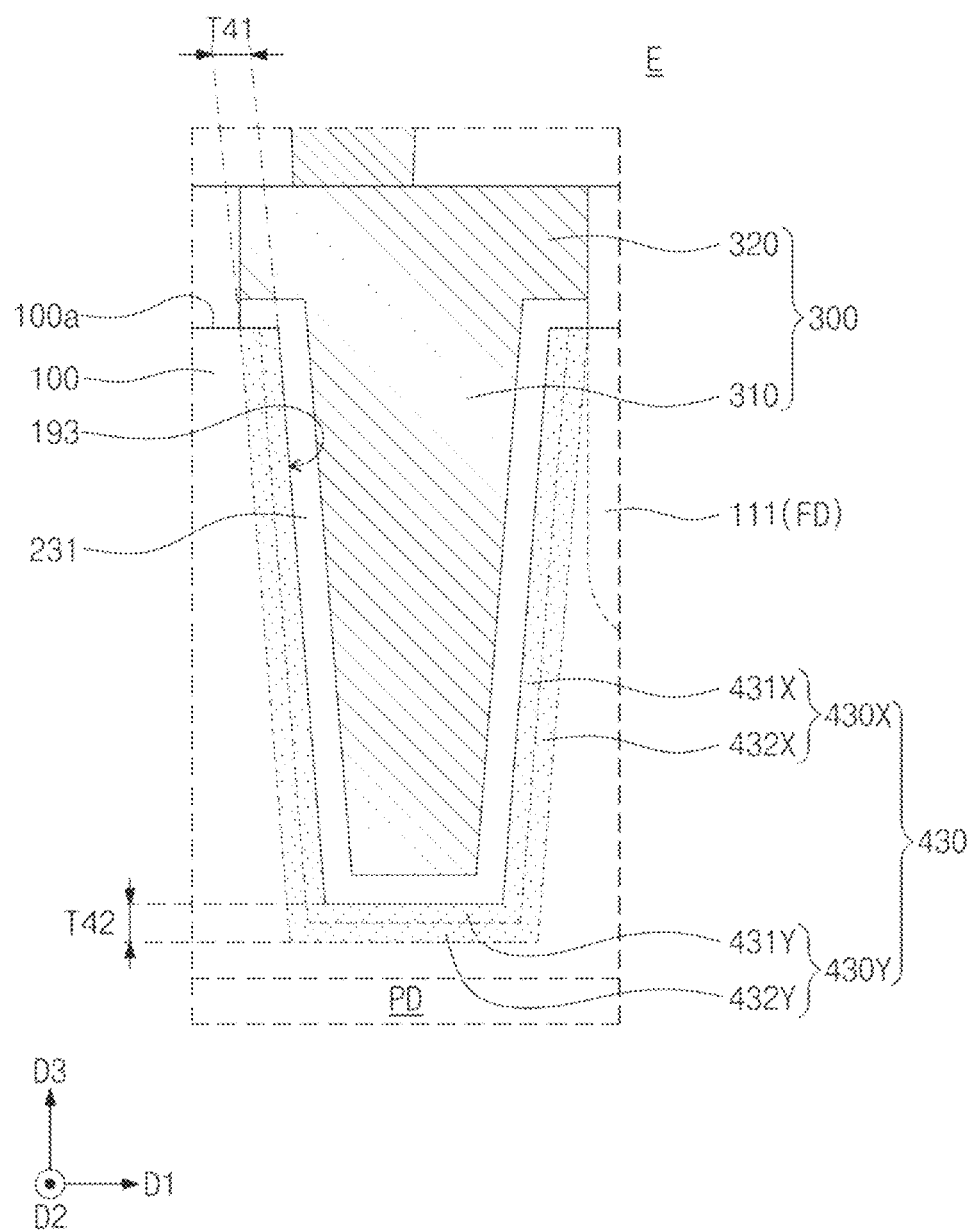
FIG. 11B is an enlarged sectional view illustrating a portion E of FIG. 10A.
Figure 11C:
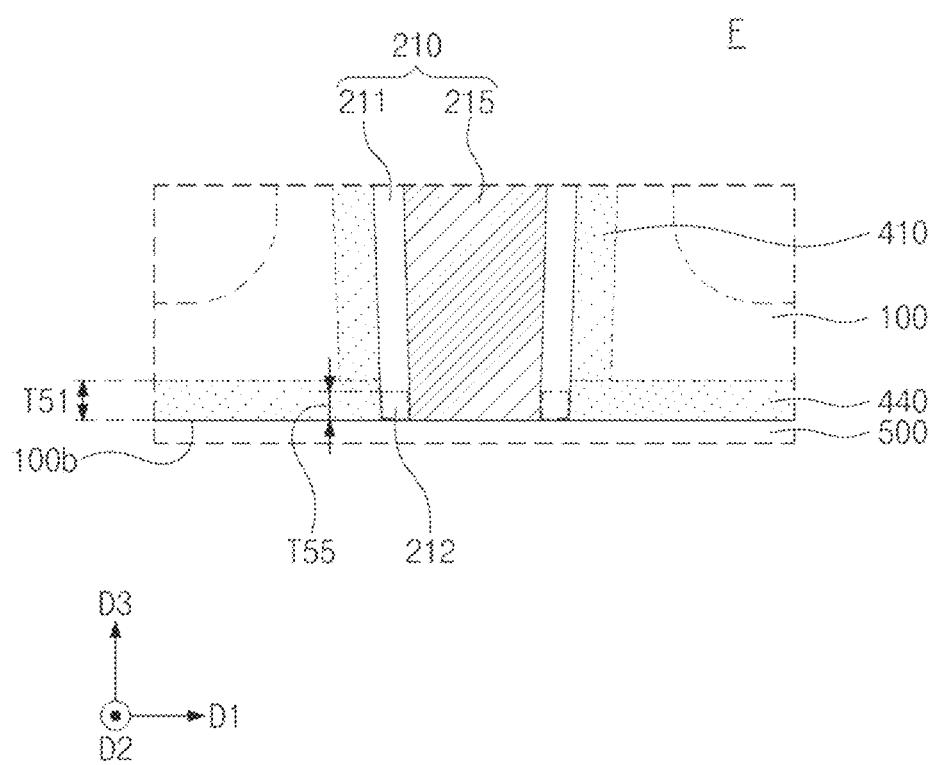
FIG. 11C is an enlarged sectional view illustrating a portion F of FIG. 11A.

FIG. 11A is a sectional view, which is taken along a line I-I' of FIG. 6 to illustrate a pixel array region of an image sensor according to an embodiment. FIG. 11B is an enlarged sectional view of a portion E of FIG. 11A. FIG. 11C is an enlarged sectional view illustrating a portion F of FIG. 11A.

Referring to FIGS. 11A and 11B, the image sensor may include the first substrate 100, the first interconnection layer 800, the first isolation pattern 210, the device isolation pattern 220, the first doped region 410, the second doped region 420, a third doped region 430, a back-side doped region 440, the gate pattern 300, the color filters CF, and the micro lens layer 600. The image sensor may further include at least one of the insulating layer 500, the protection layer 530, and the fence pattern 350. The gate pattern 300 and the gate insulating pattern 231 may be provided in the third trench 193.

The third doped region 430 may be provided in the first substrate 100 and may be in contact with the side and bottom surfaces of the gate insulating pattern 231. The third doped region 430 may be interposed between the gate insulating pattern 231 and the first substrate 100. The third doped region 430 may be a region that is doped with impurities of the first conductivity type (e.g., p-type). The third doped region 430 may be formed by the same method as that for the doped region 40 in the embodiment of FIGS. 2B and 2C. The third doped region 430 may be in contact with a side surface and a bottom surface of the third trench 193. In the case where noise electrons are produced by interface defects on the side and bottom surfaces of the third trench 193, the noise electrons may be trapped by the third doped region 430. Thus, it may be possible to prevent the dark current issue, which may be caused by the noise electrons, and thereby to improve the optical characteristics of the image sensor.

In an embodiment, the gate pattern 300 may be the transfer transistor Tx described with reference to FIG. 1. If a turn-on voltage is applied to the gate pattern 300 during operations of the image sensor, electrons, which are produced from the photoelectric conversion region PD, may be transferred to the floating diffusion region FD. Since the third doped region 430 is provided along the bottom and side surfaces of the gate pattern 300, electrons, which are produced from the photoelectric conversion region PD, may be more quickly transferred to the floating diffusion region FD through the third doped region 430. Thus, it may be possible to improve the optical characteristics and the sensing speed of image sensor.

The third doped region 430 may include a third side portion 430X and a third bottom portion 430Y. The third side portion 430X and the third bottom portion 430Y of the third doped region 430 may be respectively disposed on a side surface and a bottom surface of the first portion 310 of the gate pattern 300. The third side portion 430X and the third bottom portion 430Y may be in contact with the side and bottom surfaces of the third trench 193. The third side portion 430X may be connected to the third bottom portion 430Y. The third side portion 430X and the third bottom portion 4301 of the third doped region 430 may have substantially the same features as the side and bottom portions 40X and 40Y of the doped region 40 in the embodiments described with reference to FIGS. 2B and 2C. For example, as shown in FIG. 11S, a first thickness 141 of the third side portion 430X may be 85% to 115% of a second thickness T42 of the third bottom portion 4301. The first thickness T41 may range from about 30 nm to about 180 nm, and the second thickness T42 may range from about 30 nm to about 180 nm. The concentration of the dopant in the third side portion 430X may have a tolerance of 15% or less. The concentration of the dopant in the third bottom portion 4301 may have a tolerance of 15% or less. The number of dopants per unit area in the third side portion 430X may be from 85% to 115% of the number of dopants per unit area in the third bottom portion 430Y. The number of dopants per unit area in each of the third side portion 430X and the third bottom portion 430Y may range from $5.0 \times 10^{11}$ atoms/cm$^2$ to $1.0 \times 10^{14}$ atoms/cm$^2$.

The third side portion 430X of the third doped region 430 may include a first region 431X and a second region 432X. The first region 431X of the third side portion 430X of the third doped region 430 may be in contact with the side surface of the gate insulating pattern 231 and may be disposed between the second region 432X and the first substrate 100. The third bottom portion 430Y of the third doped region 430 may include a first region 431Y and a second region 432Y. The first region 431Y of the third bottom portion 430Y of the third doped region 430 may be in contact with the bottom surface of the gate insulating pattern 231 and may be disposed between the second region 432Y and the first substrate 100. The first regions 431X and 431Y and the second regions 432X and 432Y of the third doped region 430 may have substantially the same features as the first regions 41X and 41Y and the second regions 42X and 42Y of the doped region 40 in the embodiments described with reference to FIGS. 4A and 4B. For example, the first regions 431X and 431Y may include dopants and a first auxiliary element. The second regions 432X and 432Y of the third doped region 430 may include the dopant but may omit the first auxiliary element. The concentrations of the dopant and the first auxiliary element may be the same as those in the embodiment described with reference to FIGS. 4A and 4B.

Although not shown, the gate insulating pattern 231 may further include a first additional element. The first additional element in the gate insulating pattern 231 may be the same element as the dopant the third doped region 430. In the case where the first regions 431X and 431Y of the third doped region 430 further include the first auxiliary element, the gate insulating pattern 231 may include a second auxiliary element. The second auxiliary element may be or include the same element as the first auxiliary element. For example, the second auxiliary element may be chlorine, hydrogen, or fluorine. The first additional element and the second auxiliary element in the gate insulating pattern 231 may be the same as those in the insulating pattern 21 in the embodiment described with reference to FIG. 5D.

As another example, the third doped region 430 may omit the first auxiliary element.

As shown in FIGS. 11A and 11C, the back-side doped region 440 may be provided in the first substrate 100 and may be in contact with the second surface 100b of the first substrate 100. Interface defects may be produced by a thinning process on the second surface 100b of the first substrate 100, but the back-side doped region 440 may prevent a dark current, which is produced by the interface detects on the second surface 100b of the first substrate 100. Thus, it may be possible to improve the optical characteristics of the image sensor.

The back-side doped region 440 may include dopants. The dopant may include at least one of group 3 elements. As an example, the dopant may include boron (B). As another example, the dopant may include aluminum (Al), indium (In), and/or gallium (Ga). For example, the number of dopants per unit area in the back-side doped region 440 may range from $5.0 \times 10^{11}$ atoms/cm$^2$ to $1.0 \times 10^{14}$ atoms/cm$^2$. Since the number of dopants per unit area in the back-side doped region 440 is larger than $5.0 \times 10^{11}$ atoms/cm$^2$, it may be possible to effectively remove the noise signal. Since the number of dopants per unit area in the back-side doped region 440 is equal to or smaller than $1.0 \times 10^{14}$ atoms/cm$^2$, the full well capacity of the pixel regions PX may be improved. Since the concentration of the dopant in the back-side doped region 440 has a tolerance of 15% or less, the optical characteristics of the image sensor may be further improved.

A thickness T51 of the back-side doped region 440 may have a tolerance of 15% or less. The thickness T51 of the back-side doped region 440 may range from about 30 nm to about 180 nm. Since the first thickness is equal to or smaller than about 180 nm, the full well capacity of the pixel regions PX may be further improved. Since the back-side doped region 440 has the thickness T51 of about 30 nm or thicker, it may be possible to effectively remove a noise signal.

The first insulating pattern 211 may further include a third additional element region 212. The third additional element region 212 may be disposed between the back-side doped region 440 and the conductive isolation pattern 215 and may be in contact with the second surface 100b of the first substrate 100. The third additional element region 212 may include an additional element, which includes the same element as the dopant in the back-side doped region 440. For example, the additional element in the third additional element region 212 may include boron. The number of the additional element per unit area in the third additional element region 212 may be smaller than the number of dopants p unit area in the first doped region 410. A thickness T55 of the third additional element region 212 may be smaller than the thickness T51 of the back-side doped region 440. The third addition element region 212 and the back-side doped region 440 may be formed simultaneously by a single process including the GPD process. In order to reduce complexity in the drawings, the third additional element region 212 is not illustrated in the drawings except for FIG. 11C, but embodiments are not limited to the structures illustrated in such simplified figures.

In an embodiment, at least one of the first doped region 410, the second doped region 420, the third doped region 430, and the back-side doped region 440 may be omitted.

Figure 11D:
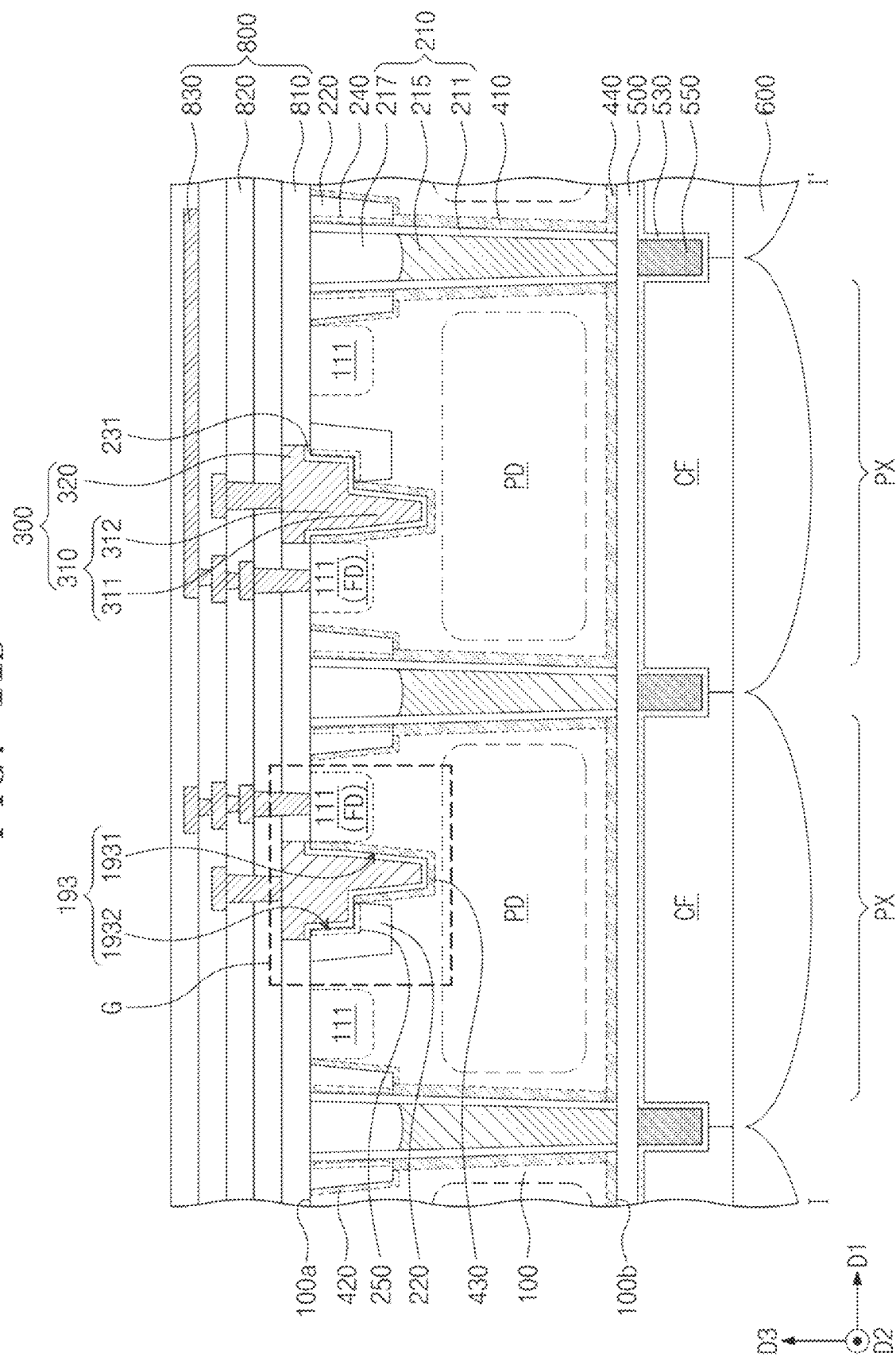
FIG. 11D is a sectional view illustrating a pixel array region of an image sensor according to an embodiment.
Figure 11E:
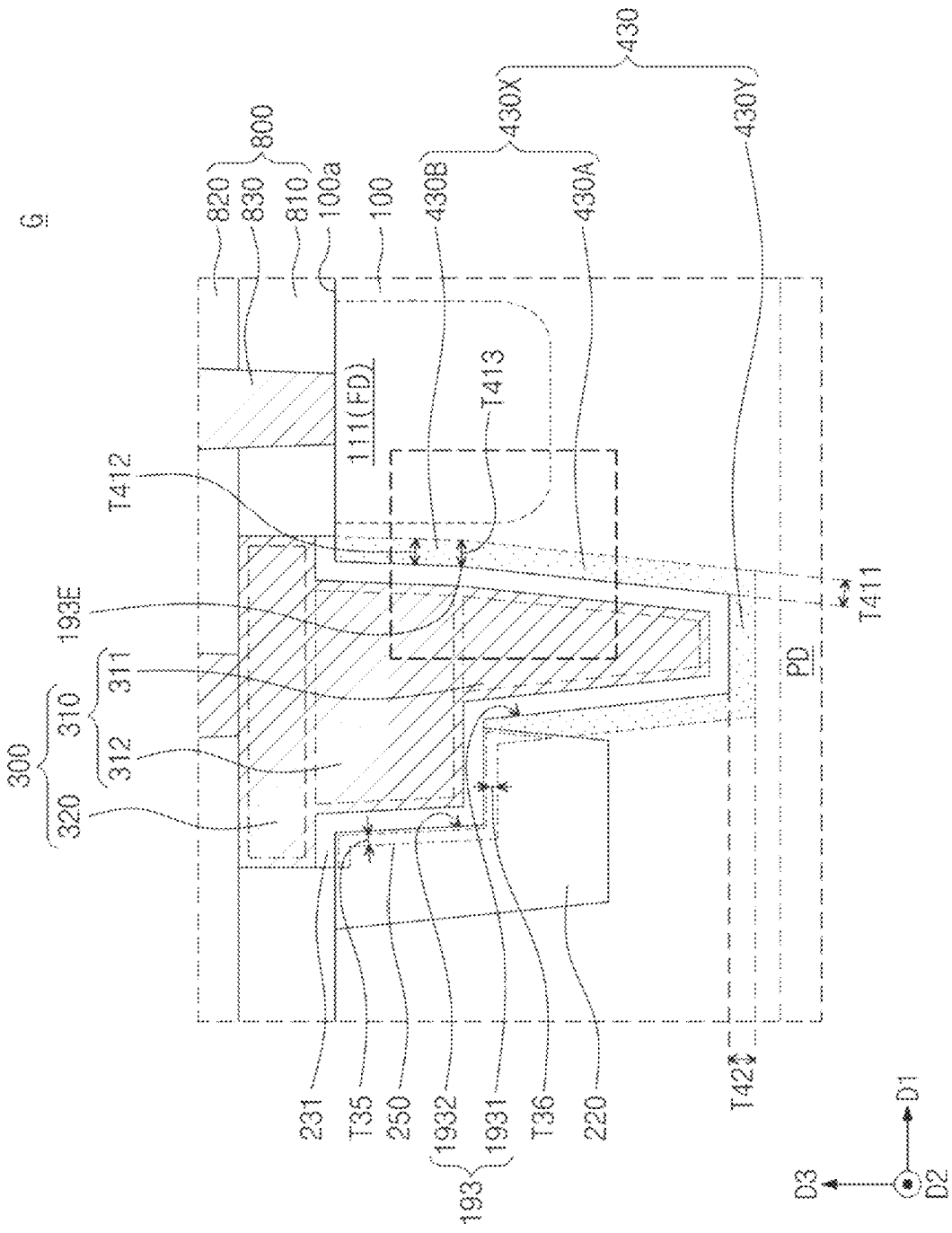
FIG. 11E is an enlarged sectional view illustrating a portion G of FIG. 11D.

FIG. 11D is a sectional view, which is taken along a line I-I' of FIG. 6 to illustrate a pixel array region of an image sensor according to an embodiment. FIG. 11E is an enlarged sectional view illustrating a portion G of FIG. 11D.

Referring to FIGS. 11D and 11E, the image sensor may include the first substrate 100, the first interconnection layer 800, the first isolation pattern 210, the device isolation pattern 220, the first to third doped regions 410, 420, and 430, the back-side doped region 440, the gate pattern 300, the color filters CF, and the micro lens layer 600.

The third trench 193 may include a first sub-trench 1931 and a second sub-trench 1932. The first sub-trench 1931 may be provided in the first substrate 100 and may be laterally spaced apart from the device isolation pattern 220. The second sub-trench 1932 may be disposed on the first sub-trench 1931 and may be connected to the first sub-trench 1931. The second sub-trench 1932 may have a width larger than the first sub-trench 1931. At least a portion of the second sub-trench 1932 may be provided to expose the device isolation pattern 220. For example, a bottom surface of the second sub-trench 1932 may be provided in the device isolation pattern 220. A second side surface of the second sub-trench 1932 may have an inclination angle with respect to the first surface 100a that is different from an inclination angle with respect to the first surface 100a of a first side surface of the first sub-trench 1931. As shown in FIG. 11E, the third trench 193 may further include an edge 193E, which is provided at a position at which the first side surface of the first sub-trench 1931 and the second side surface of the second sub-trench 1932 meet.

The gate pattern 300 may include the first portion 310 and the second portion 320. The first portion 310 of the gate pattern 300 may include a vertical portion 311 and a horizontal portion 312. The vertical portion 311 may be provided in the first sub-trench 1931. The vertical portion 311 may protrude toward the photoelectric conversion regions PD. Unlike the illustrated structure in FIGS. 11D and 11E, the vertical portion 311 may be provided to have a bottom surface that is located in the photoelectric conversion regions PD. The vertical portion 311 of the gate pattern 300 may be placed beside the device isolation pattern 220. In an embodiment, the vertical portion 311 may not be vertically overlapped the device isolation pattern 220.

The horizontal portion 312 of the gate pattern 300 may be disposed between the vertical portion 311 and the second portion 320. The horizontal portion 312 may be provided hi the second sub-trench 1932. The horizontal portion 312 may have a side surface that is inclined at an angle different from that of a side surface of the vertical portion 311. For example, the horizontal portion 312 may be disposed on the vertical portion 311 and may protrude laterally relative to the vertical portion 311. The horizontal portion 312 may include a protruding portion, which is located on and vertically overlapped with the device isolation pattern 220. A width of the horizontal portion 312 of the gate pattern 300 may be larger than a width of the vertical portion 311. Since the gate pattern 300 includes the horizontal portion 312, the elements in the pixel regions PX may be more highly integrated.

The gate pattern 300 may be the transfer gate TG described with reference to FIG. 1. The floating diffusion region FD may be disposed at a side of the gate pattern 300. For example, the first portion 310 of the gate pattern 300 may be disposed between the device isolation pattern 220 and the floating diffusion region FD. The floating diffusion region FD may serve as the drain electrode of the gate pattern 300.

The gate insulating pattern 231 may be interposed between the gate pattern 300 and the device isolation pattern 220 and between the gate pattern 300 and the first substrate 100.

The third doped region 430 may be provided in the first substrate 100 and may be in contact with the gate insulating pattern 231. The third doped region 430 may not be interposed between the gate insulating pattern 231 and the device isolation pattern 220. The third doped region 430 may include the third side portion 430X and the third bottom portion 430Y. The third bottom portion 430Y may be disposed on the bottom surface of the vertical portion 311 of the gate pattern 300 and may be in contact with the bottom surface of the first sub-trench 1931. The third side portion 430X may include a first sub-side portion 430A and a second sub-side portion 430B. The first sub-side portion 430A may be disposed on the side surface of the vertical portion 311 of the gate pattern 300 and may be in contact with the first side surface of the first sub-trench 1931. The first sub-side portion 430A may be connected to the third bottom portion 430Y without interface therebetween. The second sub-side portion 430B may be disposed on the side surface of the horizontal portion 312 of the gate pattern 300 and may be in contact with the second side surface of the second sub-trench 1932. The second sub-side portion 430B may be connected to the first sub-side portion 430A without interface therebetween.

The thickness of the third doped region 430 may be substantially uniform. For example, the second thickness T42 of the third bottom portion 430Y may have a tolerance of 15% or less. A first sub-thickness T411 of the first sub-side portion 430A may have a tolerance of 15% or less. The first sub-thickness T411 may be from 85% to 115% of the second thickness T42. A second sub-thickness 1412 of the second sub-side portion 430B may have a tolerance of 15% or less. The second sub-thickness 1412 may be from 85% to 115% of the second thickness T42 and may be from 85% to 115% of the first sub-thickness T411. Each of the second thickness T42, the first sub-thickness T411, the second sub-thickness T412 may range from about 30 nm to about 180 nm. Thus, the optical characteristics of the image sensor may be improved.

In the case where the doped region is formed by an ion injection process or a plasma injection process as in the related art, a thickness of the doped region near the edge region, at which the first and second side surfaces meet, may be less than 85% of the thicknesses of the doped regions near the first and second side surfaces of the trench. In this case, a dark current may be produced at the edge region.

In an embodiment, a third sub-thickness T413 of the third doped region 430 on the edge 193E of the third trench 193 may be equal or similar to the second thickness 142, the first sub-thickness T411, the second sub-thickness 1412. For example, the third sub-thickness T413 may be from 85% to 115% of the second thickness T42, may be from 85% to 115% of the first sub-thickness T411, and may be from 85% to 115% of the second sub-thickness 1412. The third sub-thickness 1413 may range from about 30 nm to about 180 nm. Thus, the third doped region 430 may improve a dark current issue, which may occur in the edge 193E of the third trench 193.

The third doped region 430 may have a uniform and low dopant concentration. For example, the concentration of the dopant in the third bottom portion 430Y may have tolerance of 15% or less. The concentration of the dopant in the first sub-side portion 430A may have a tolerance of 15% or less. The concentration of the dopant in the first sub-side portion 430A may be from 85% to 115% of the concentration of the dopant in the third bottom portion 430Y. The concentration of the dopant in the second sub-side portion 430B may have a tolerance of 15% or less. The concentration of the dopant in the second sub-side portion 430B may be from 85% to 115% of the concentration of the dopant in the third bottom portion 430Y and may be from 85% to 115% of the concentration of the dopant in the first sub-side portion 430A. For example, in each of the third bottom portion 430Y, the first sub-side portion 430A, and the second sub-side portion 430B, the number of dopants per unit area may range from $5.0 \times 10^{11}$ atoms/cm$^2$ to $1.0 \times 10^{14}$ atoms/cm$^2$. Thus, the optical characteristics of the image sensor may be further improved.

The device isolation pattern 220 may further include a second additional element region 250. The second additional element region 250 may be in contact with the gate insulating pattern 231, in the device isolation pattern 220. The second additional element region 250 may be in contact with the third trench 193. In detail, the second additional element region 250 may be in contact with the side and bottom surfaces of the second sub-trench 1932. The second additional element region 250 may be further extended to at least a portion of the side surface of the first sub-trench 1931. The second additional element region 250 may include a fourth additional element. The fourth additional element may be the same element as the dopant in the third doped region 430. As an example, the fourth additional element may be one of group 3 elements (e.g., boron). The concentration of the fourth additional element in the second additional element region 250 may be lower than the concentration of the dopant in the third doped region 430.

A thickness of the second additional element region 250 may have a tolerance of 15% or less. For example, a third thickness T35 of the second additional element region 250 on the second side surface of the second sub-trench 1932 may be from 85% to 115% of a fourth thickness 136 of the second additional element region 250 on the bottom surface of the second sub-trench 1932. The third thickness 135 of the second additional element region 250 may be smaller than each of the first sub-thickness 1411, the second sub-thickness 1412, and the third sub-thickness 1413. The fourth thickness 136 may be smaller than each of the second thickness 142, the first sub-thickness 1411, the second sub-thickness 1412, and the third sub-thickness 1413.

In an embodiment, the formation of the third trench 193 may include performing an etching process on the first substrate 100 and the device isolation pattern 220 to form the first sub-trench 1931 and the second sub-trench 1932. Thereafter, the GPD process may be performed on the third trench 193 to form the third doped region 430 in the first substrate 100. The second additional element region 250 and the third doped region 430 may be formed simultaneously by a single process including the GPD process. For example, during the GPD process, a portion of the device isolation pattern 220 may be exposed to the doping gas, and in this case, the second additional element region 250 may be formed. However, the formation of the third trench 193, the second additional element region 250, and the third doped region 430 are not limited thereto.

The gate insulating pattern 231 may further include a first additional element. The first additional element may be the same element as the dopant in the third doped region 430 and the fourth additional element in the second additional element region 250. In thin case, the third doped region 430 and the gate insulating pattern 231 may be respectively provided to have the same or similar features as the doped region 40 and the insulating pattern 21 in the embodiment described with reference to FIGS. 5A and 5B.

The device isolation pattern 220 may further include the first additional element region 240, and in this case, the first additional element region 240 may have substantially the same features as that in the embodiment described with reference to FIGS. 7A to 7F. The first additional element region 240 and the first doped region 410 may be formed simultaneously by a single process including the GPD process.

Figure 11F:
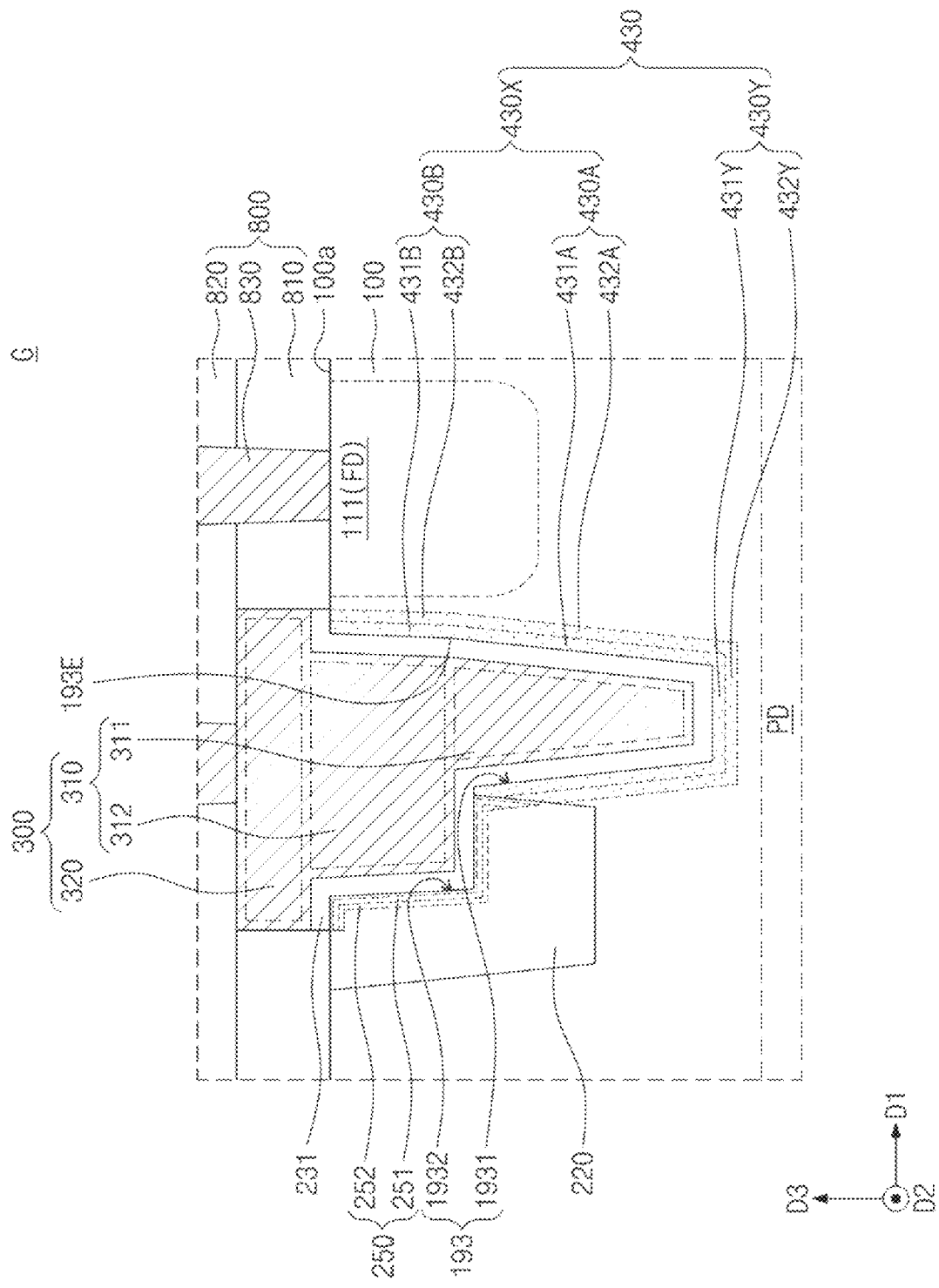
FIG. 11F is a sectional view illustrating a gate insulating pattern a third doped region, and a second additional element region of a device isolation pattern, according to an embodiment.

FIG. 11F is an enlarged sectional view illustrating a portion G of FIG. 11D (in particular, illustrating the gate insulating pattern 231, the third doped region 430 and the second additional element region 250 of the device isolation pattern 220 according to an embodiment).

Referring to FIG. 11F, the third doped region 430 may include the third side portion 430X and the third bottom portion 430Y. The third side portion 430X of the second doped region 420 may include the first sub-side portion 430A and the second sub-side portion 430B. The first sub-side portion 430A, the second sub-side portion 430B, and the third bottom portion 430Y of the third doped region 430 may be provided to have substantially the same features as those in the embodiment of FIGS. 11D and 11E.

However, in an embodiment, the third bottom portion 430Y of the third doped region 430 may include the first region 431Y and the second region 432Y. The first region 431Y of the third bottom portion 430Y may be disposed on the bottom surface of the vertical portion 311 of the gate pattern 300 and may be in contact with the bottom surface of the first sub-trench 1931. The second region 432Y of the third bottom portion 430Y may be disposed between the first region 431Y and the first substrate 100.

The first sub-side portion 430A of the third doped region 430 may include a first region 431A and a second region 432A. The first region 431A of the first sub-side portion 430A may be disposed on the side surface of the vertical portion 311 of the gate pattern 300 and may be in contact with the first side surface of the first sub-trench 1931. The second region 432A of the first sub-side portion 430A may be disposed between the first region 431A and the first substrate 100. The first region 431A and the second region 432A of the first sub-side portion 430A may be respectively connected to the first region 431Y and the second region 432Y of the third bottom portion 430Y.

The second sub-side portion 430B of the third doped region 430 may include a first region 431B and a second region 432B. The first region 431B of the second sub-side portion 430B may be disposed on the side surface of the horizontal portion 312 of the gate pattern 300 and may be in contact with the second side surface of the second sub-trench 1932. The second region 432 of the second sub-side portion 430B may be disposed between the first region 431B and the first substrate 100. The first region 431B and the second region 432B of the second sub-side portion 430B may be respectively connected to the first region 431A and the second region 432B of the first sub-side portion 430A.

The first regions 431A, 431B, and 431Y and the second regions 432A, 432B, and 432Y of the third doped region 430 may be provided to have substantially the same or similar features as those of the first regions 41X and 41Y and the second regions 42X and 42Y de FIGS. 4A and 4B or FIG. 5D. For example, the first region 431A of the first sub-side portion 430A, the first region 431B of the second sub-side portion 430B, the first region 431Y of the third bottom portion 430Y may include dopants and a first auxiliary element. The first auxiliary element may be, for example, chlorine, fluorine, or hydrogen. The second region 432A of the first sub-side portion 430A, the second region 432B of the second sub-side portion 430B, and the second region 432Y of the third bottom portion 430Y may include dopants but may omit the first auxiliary element. The concentration of the first auxiliary element in the first regions 431A, 431B, and 431Y of the third doped region 430 may be lower than the concentrations of the dopant in the first regions 431A, 431B, and 431Y and the concentrations of the dopant in the second regions 432A, 432B, and 432Y. Thus, the reliability of the image sensor may be improved.

The second additional element region 250 may include a first region 251 and a second region 252. The first region 251 of the second additional element region 250 may be disposed between the second region 252 and the gate insulating pattern 231. The first region 251 of the second additional element region 250 may be in contact with the bottom surface and the second side surface of the second sub-trench 1932. The first region 251 of the second additional element region 250 may further include a fifth auxiliary element, in addition to the first additional element. The fifth auxiliary element may be the same element as the flat auxiliary element in the first regions 431A, 431B, and 431Y of the third doped region 430. For example, the fifth auxiliary element may include chlorine, fluorine, or hydrogen.

As an example, the gate insulating pattern 231 may omit the first additional element. As another example, the gate insulating pattern 231 may further include a second auxiliary element, in addition to the first additional element. The second auxiliary element in the gate insulating pattern 231 may be the same element as the first auxiliary element in the third doped region 430 and the fifth auxiliary element in the second additional element region 250.

The gate pattern 300 and the third trench 193 may be provided to have substantially the same features as those in the embodiment of FIGS. 11C and 11D.

FIGS. 12A to 12I are sectional views illustrating a method of fabricating an image sensor, according to an embodiment. For concise description, a previously described element may be identified by the same reference number without repeating an overlapping description thereof. In the following description of the method of forming the image sensor, a pixel region should be understood to include not only a region, in which the pixel described with reference to FIG. 1 is formed, but also a region, which is used to form the pixel.

Figure 12A:
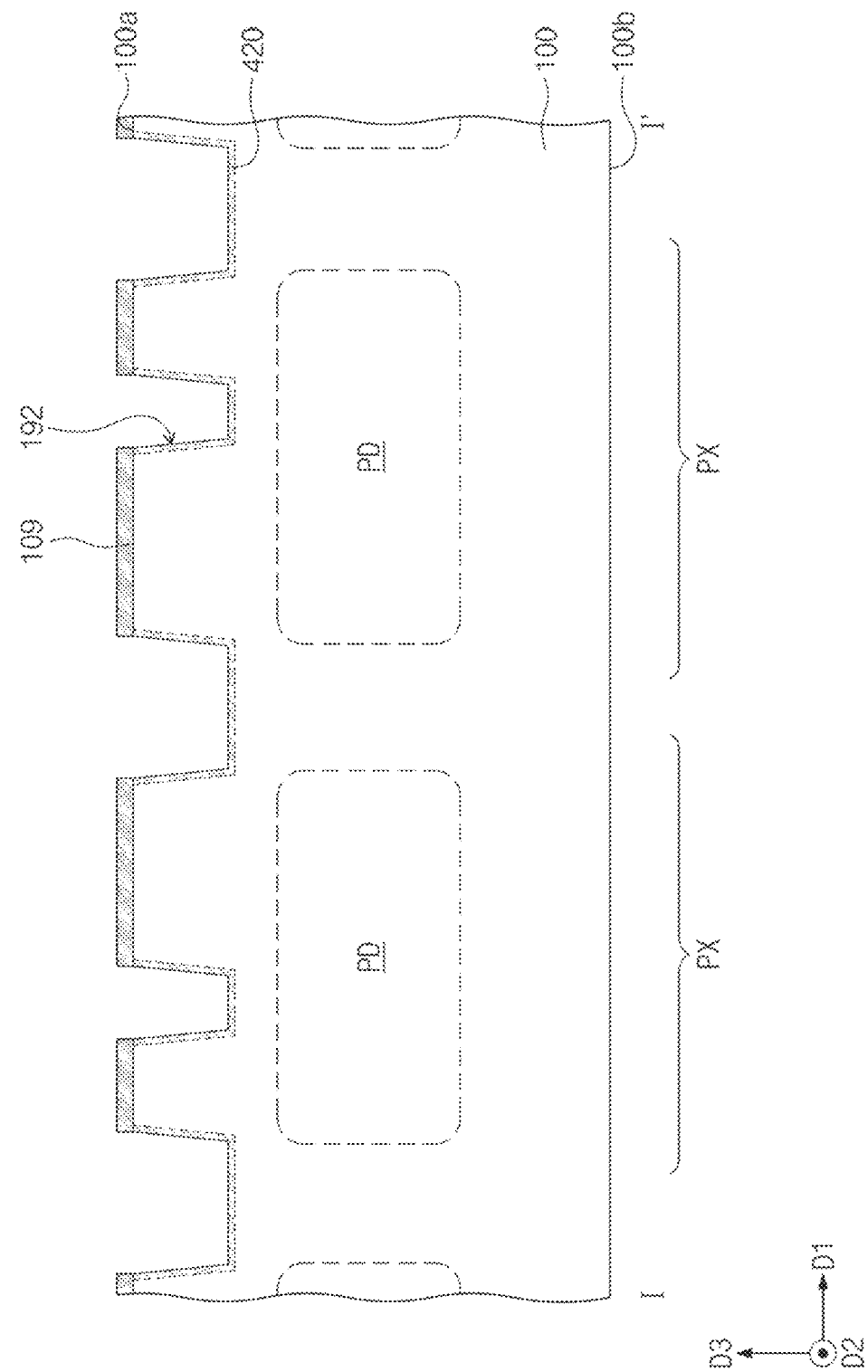
FIGS. 12A to 12I are sectional views illustrating a method of fabricating an image sensor, according to an embodiment.

Referring to FIG. 12A, the first substrate 100, which has the flat surface 100a and the second surface 100b opposite to each other, may be prepared. The photoelectric conversion regions PD may be formed in the first substrate 100 and in the pixel regions PX, respectively. A mask layer 109 may be formed on the first surface 100a of the first substrate 100. The mask layer 109 may be formed of or include at least one of silicon nitride, silicon oxide, or combinations thereof. The second trench 192 may be formed on the first surface 100a of the first substrate 100. The second trench 192 may be formed by etching the first substrate 100 using the mask layer 109. During the etching process, an interface defect may be formed on the bottom and side surfaces of the second trench 192.

The second doped region 420 may be formed in the first substrate 100. The formation of the second doped region 420 may include performing the first purge process (in S10), the GPD process (in S20), and the second purge process (in S30), which were described with reference to FIG. 3. The second doped region 420 may be formed to have substantially the same features as the doped region 40 in the embodiment of FIGS. 2A and 2B or the second doped region 420 in the embodiment of FIGS. 10A to 10C. The mask layer 109 may be removed.

Figure 12B:
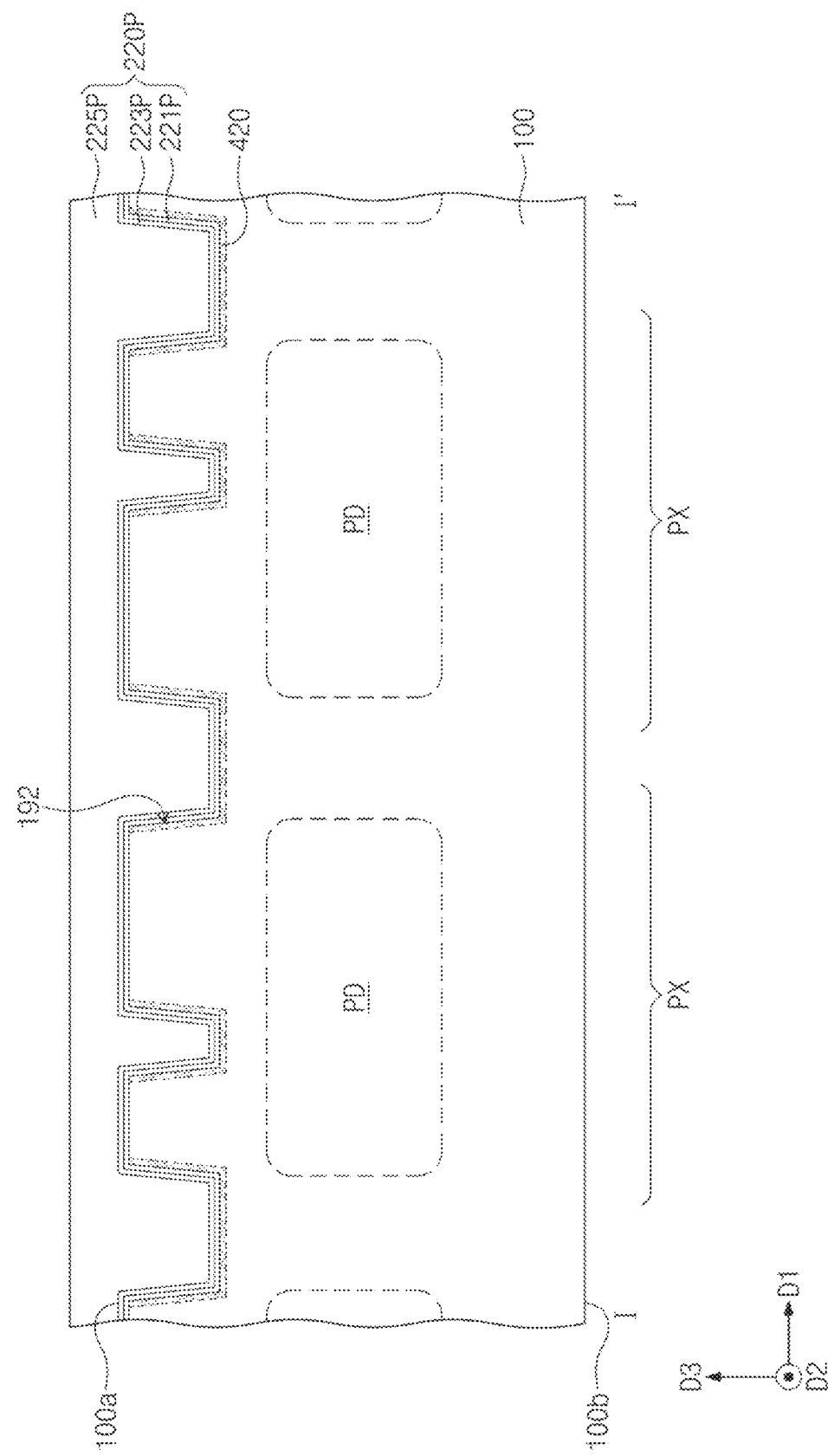

Referring to FIG. 12B, a second preliminary insulating pattern 221P, a third preliminary insulating pattern 223P, and a preliminary buried insulating pattern 225P may be sequentially formed on the first substrate 100 provided with the second trench 192 to form a preliminary device isolation pattern 220P. The second preliminary insulating pattern 221P may conformally cover the side and bottom surfaces of the second trench 192 and may be extended onto the first surface 100a of the first substrate 100. The third preliminary insulating pattern 223P may be formed in the second trench 192 and on the first surface 100a of the first substrate 100 to conformally cover the second preliminary insulating pattern 221P. The preliminary buried insulating pattern 225P may be formed on the third preliminary insulating pattern 223P to fill the second trench 192 provided with the second and third preliminary insulating patterns 221P and 221P.

Unlike the method described with reference to FIG. 12A, the second doped region 420 may be formed after the formation of the second preliminary insulating pattern 221P. In this case, the device isolation pattern 220 and the second doped region 420 may be formed to have substantially the same structure as those, in the embodiment of FIG. 10D. As another example, the second doped region 420 may be formed after the formation of the third preliminary insulating pattern 223P. In this case, the device isolation pattern 220 and the second doped region 420 may be formed to have substantially the same structure as those in the embodiment of FIG. 10E.

Figure 12C:
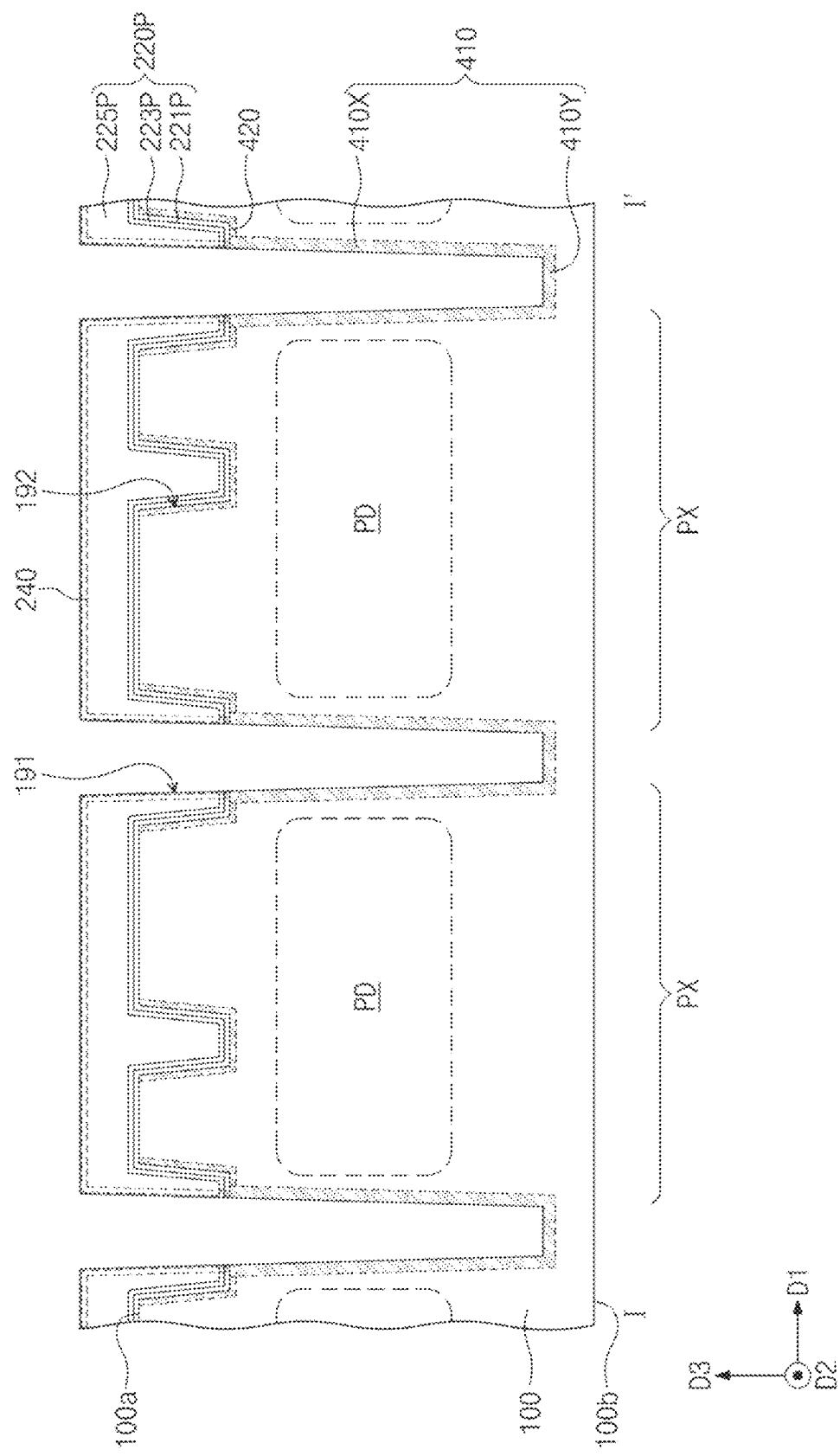

Referring to FIG. 12C, the first trench 191 may be formed in the first substrate 100 and between the pixel regions PX. The first trench 191 may be formed by etching the first surface 100a of the first substrate 100. The first trench 191 may be formed to have depth that is larger than that of the second trench 192. For example, the first trench 191 may be formed to have a bottom surface that is located at a level lower than the bottom surface of the second trench 192. A portion of the first trench 191 may penetrate the preliminary device isolation pattern 220P. In this case, a lower portion of the side surface of the first trench 191 may expose the first substrate 100, and an upper portion of the side surface of the first trench 191 may expose the preliminary device isolation pattern 220P. During the etching process, an interface defect may be formed on the bottom and side surfaces of the first trench 191.

The first doped region 410 may be formed in the first substrate 100 and along the side and bottom surfaces of the first trench 191. The formation of the first doped region 410 may include performing the first purge process (in S10), the GPD process (in S20), and the second purge process (in S30), which were described with reference to FIG. 3. The first doped region 410 may include the first side portion 410X and the first bottom portion 410Y. The first side portion 410X may be formed along the side surface of the first trench 191. The first bottom portion 410Y may be formed along the bottom surface of the first trench 191 and may be connected to the first side portion 410X.

During the formation of the first doped region 410, the preliminary device isolation pattern 220P may be exposed to a doping gas. Thus, the first additional element region 240 may be further thrilled in the preliminary device isolation pattern 220P. The preliminary device isolation pattern 220P and the first doped region 410 may be formed simultaneously by a single process including the GPD process once. The first additional element region 240 may be in contact with the side surface of the first trench 191 and the top surface of the preliminary device isolation pattern 220P. The first additional element region 240 may be conformally formed along the side surface of the first trench 191 and the top surface of the preliminary device isolation pattern 220P. The first additional element region 240 may include a second additional element. The second additional element may be the same element as the dopant in the first doped region 410. A thickness of the first additional element region 240 may be smaller than the thickness of the first doped region 410.

Figure 12D:
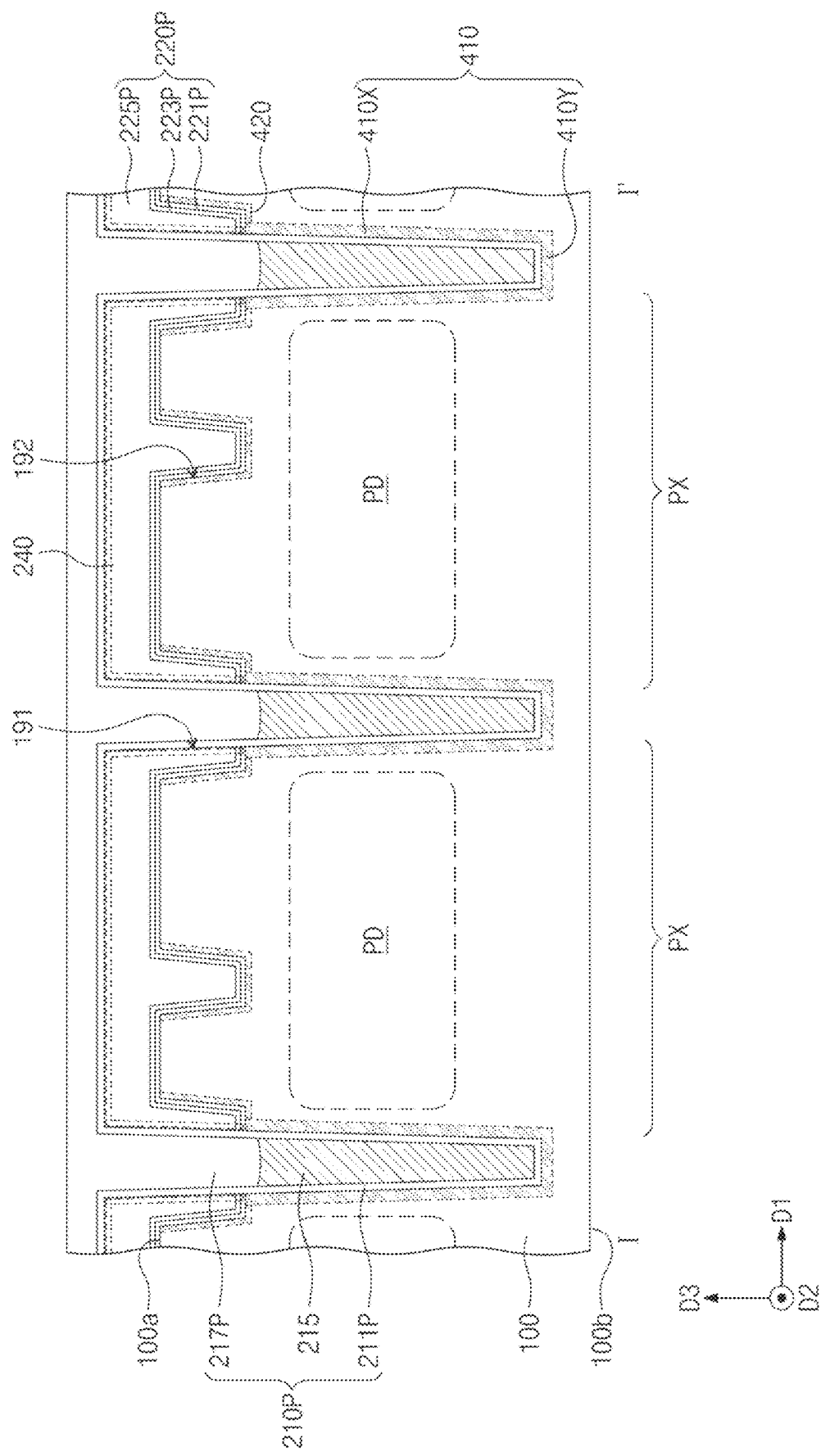

Referring to FIG. 12D, a first preliminary insulating pattern 211P, the conductive isolation pattern 215, and the preliminary capping pattern 217P may be formed in the first trench 191 to form a preliminary isolation pattern 210P. The first preliminary insulating pattern 211P may be formed by depositing a silicon-based insulating material. The first preliminary insulating pattern 211P may be conformally formed on the side and bottom surfaces of the first trench 191 and the preliminary device isolation pattern 220P. The first preliminary insulating pattern 211P may be in contact with the first doped region 410 and the first additional element region 240 of the preliminary device isolation pattern 220P.

The conductive isolation pattern 215 may be formed on the first preliminary insulating pattern 211P to fill a lower portion of the first trench 191. The conductive isolation pattern 215 may not fill an upper portion of the first trench 191. An upper inner side surface and a top surface of the first preliminary insulating pattern 211P may not be covered with the conductive isolation pattern 215 and may be exposed to the outside. The formation of the conductive isolation pattern 215 may include depositing a crystalline semiconductor material and doping the crystalline semiconductor material.

The preliminary capping pattern 217P may be formed on the top surface of the conductive isolation pattern 215 to fill the first trench 191. The preliminary capping pattern 217P may cover the exposed surfaces of the first preliminary insulating pattern 211P. For example, the preliminary capping pattern 217P may be extended to a region on the first surface 100a of the first substrate 100 to cover the first preliminary insulating pattern 211P.

Unlike the structure shown in FIG. 12C, the formation of the first doped region 410 may be performed after the formation of the first preliminary insulating pattern 211P. In this case, the first insulating pattern 211 and the first doped region 410 may be formed to have substantially the same structure as those in the embodiment of FIG. 7E.

Figure 12E:
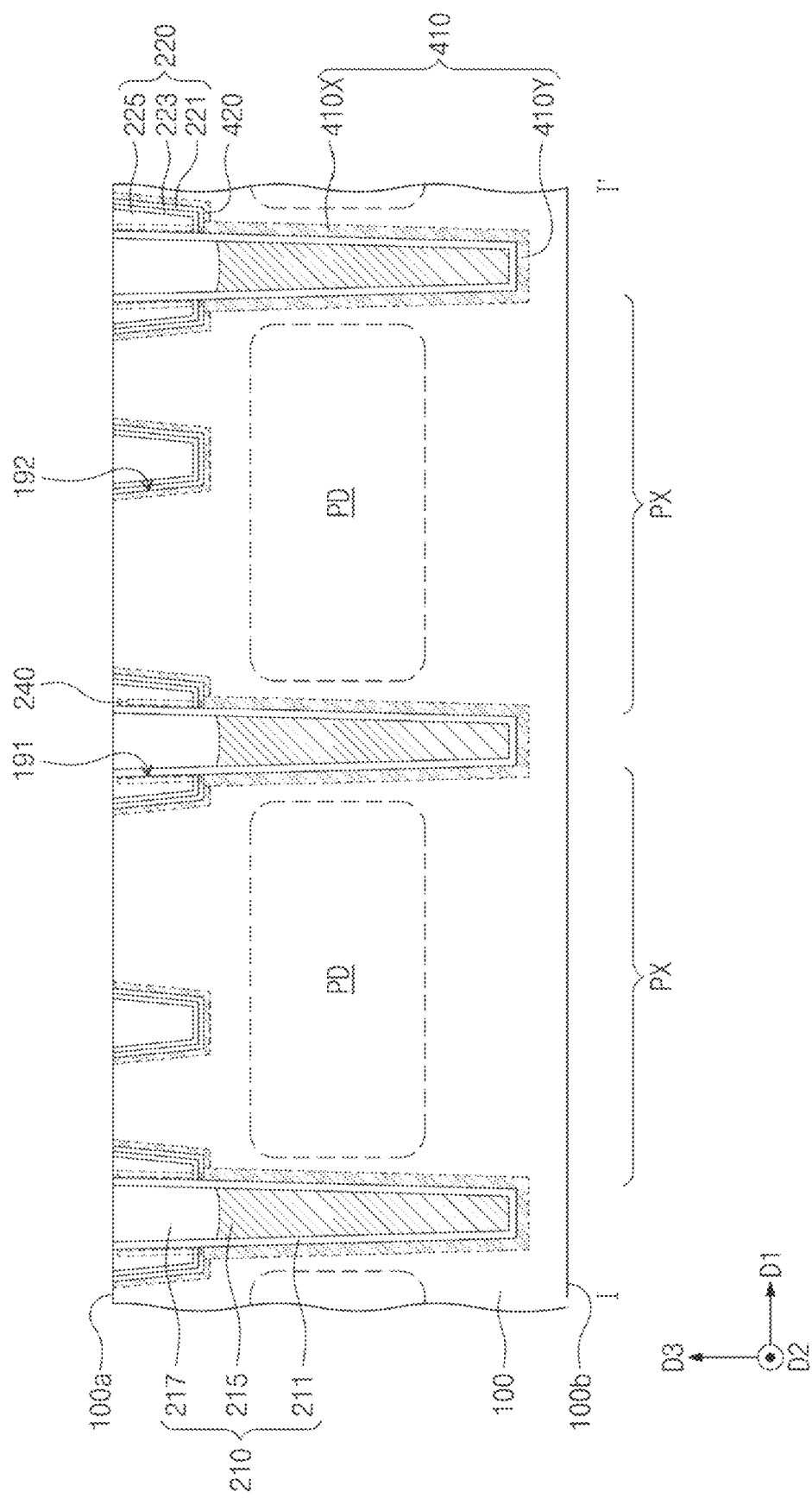

Referring to FIG. 12E, a recess process may be performed to form the device isolation pattern 220 and the first isolation pattern 210. The recess process may include an etch-back process or a planarization process. The recess process may be performed to expose the first surface 100a of the first substrate 100.

As a result of the recess process, the preliminary capping pattern 217P and the first preliminary insulating pattern 211P on the first surface 100a of the first substrate 100 may be removed to form the capping pattern 217 and the first insulating pattern 211, respectively. Thus, the first isolation pattern 210 may be formed. The first isolation pattern 210 may include the first insulating pattern 211, the conductive isolation pattern 215, and the capping pattern 217.

As a result of the recess process, the second preliminary insulating pattern 221P, the third preliminary insulating pattern 223P, and the preliminary buried insulating pattern 225P on the first surface 100a of the first substrate 100 may be removed to form the second insulating pattern 221, the third insulating pattern 223, and the buried insulating pattern 225. That is, the device isolation pattern 220 may be formed as a result of the recess process, and the device isolation pattern 220 may include the second insulating pattern 221, the third insulating pattern 223, and the buried insulating pattern 225. Here, the first additional element region 240 on the top surface of the preliminary device isolation pattern 220P may be partially removed. The first additional element region 240 may be in contact with the first trench 191, in the device isolation pattern 220. The first additional element region 240 may include the first, second, and third sub-regions 2401, 2402, and 2403, similar to the previous embodiment described with reference to FIG. 7F.

Hereinafter, in order to reduce complexity in the drawings, the second insulating pattern 221, the third insulating pattern 223, the buried insulating pattern 225, and the first additional element region 240 are not illustrated as distinct elements in FIGS. 12F to 12I, but embodiments are not limited to this example.

Figure 12F:
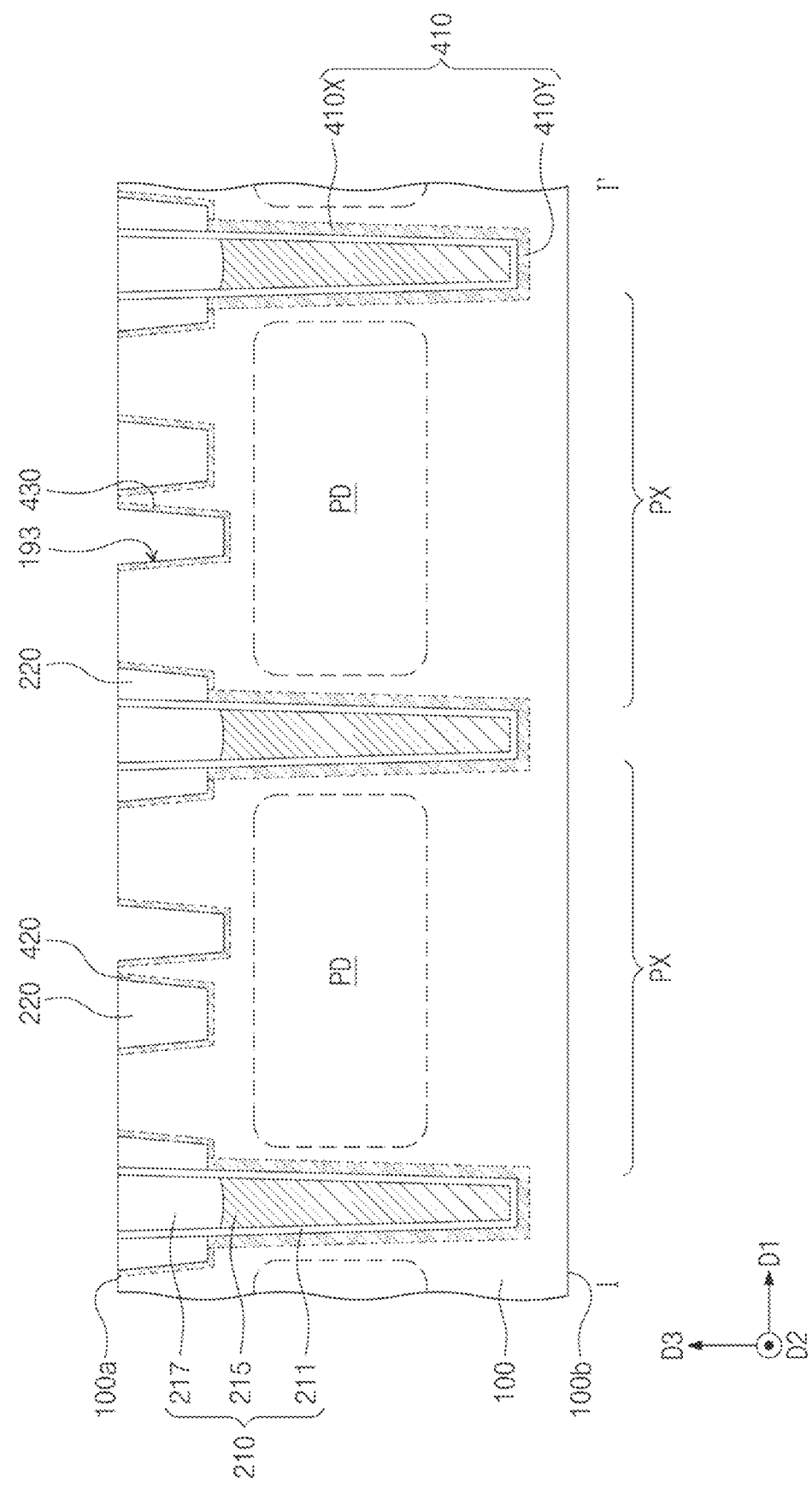

Referring to FIG. 12F, the third trench 193 may be formed on the first surface 100a of the first substrate 100 by an etching process. During the etching process, an interface defect may be formed on the bottom and side surfaces of the third trench 193. The formation of the third doped region 430 may include performing the first purge process (in S10), the GPD process (in S20), and the second purge process (in S30), which were described with reference to FIG. 3. The third doped region 430 may be in contact with the side and bottom surfaces of the third trench 193.

Figure 12G:
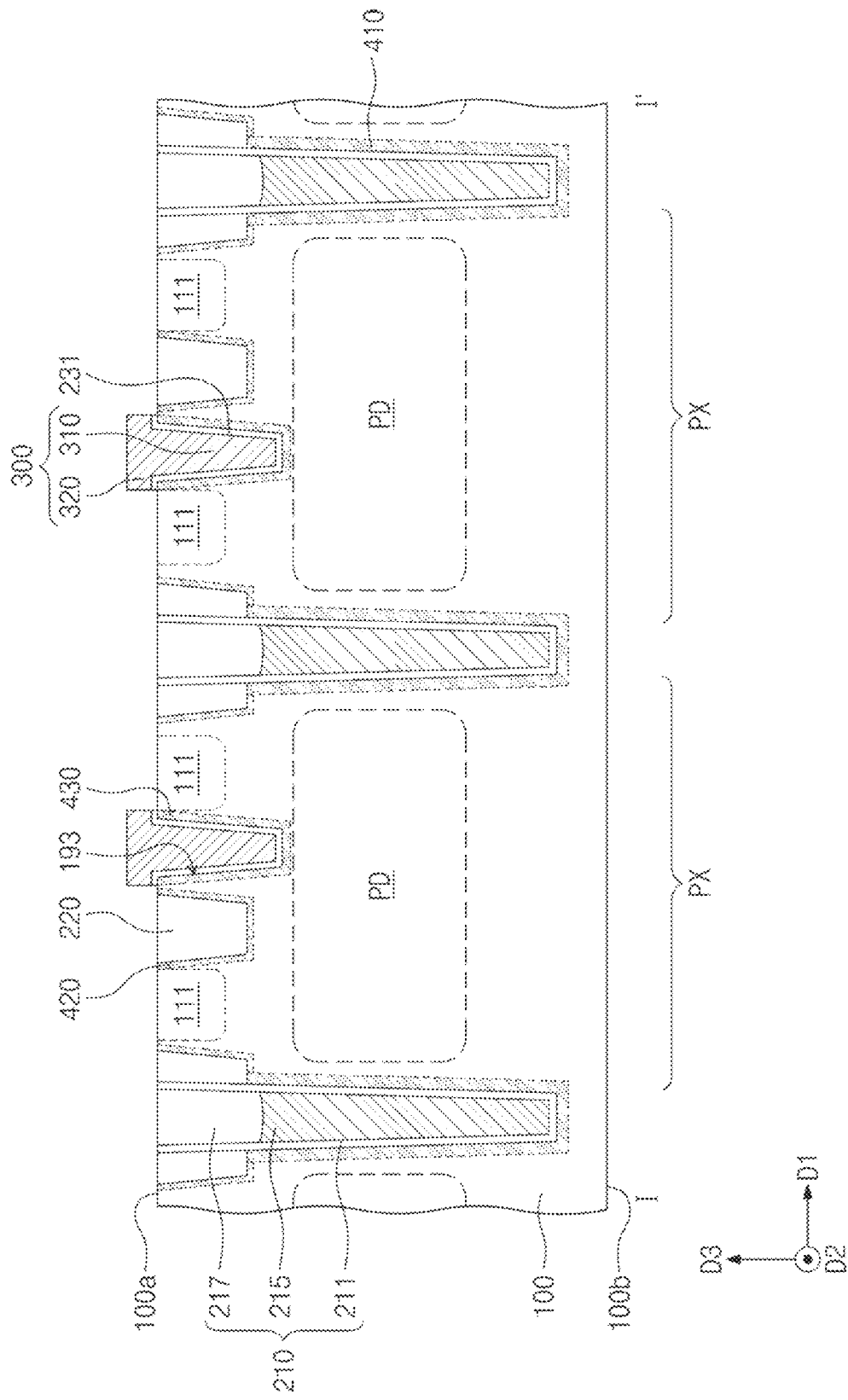

Referring to FIG. 12G, the gate insulating pattern 231 and the gate pattern 300 may be formed in the third trench 193. The gate insulating pattern 231 may be conformally formed on the side and bottom surfaces of the third trench 193 and may be in contact with the third doped region 430. Unlike the embodiment of FIG. 12F, the formation of the third doped region 430 may be performed after the formation of the gate insulating pattern 231. In this case the gate insulating pattern 231 may further include a first additional element. The first additional element may be the same element as the dopant in the third doped region 430.

The gate pattern 300 may be formed, on the gate insulating pattern 231. The gate pattern 300 may fill the third trench 193. The gate pattern 300 may be extended to a region on the first surface 100a of the first substrate 100. The gate pattern 300 may include the first portion 310, which is provided in the third trench 193, and the second portion 320, which is provided on the first surface 100a of the first substrate 100. Although not shown, a gate spacer may be formed on the first surface 100a of the first substrate 100 and on side surfaces of the second portion 320 of the gate pattern 300. Impurities of the second conductivity type may be injected into the first substrate 100 to form the impurity regions 111.

Figure 12H:
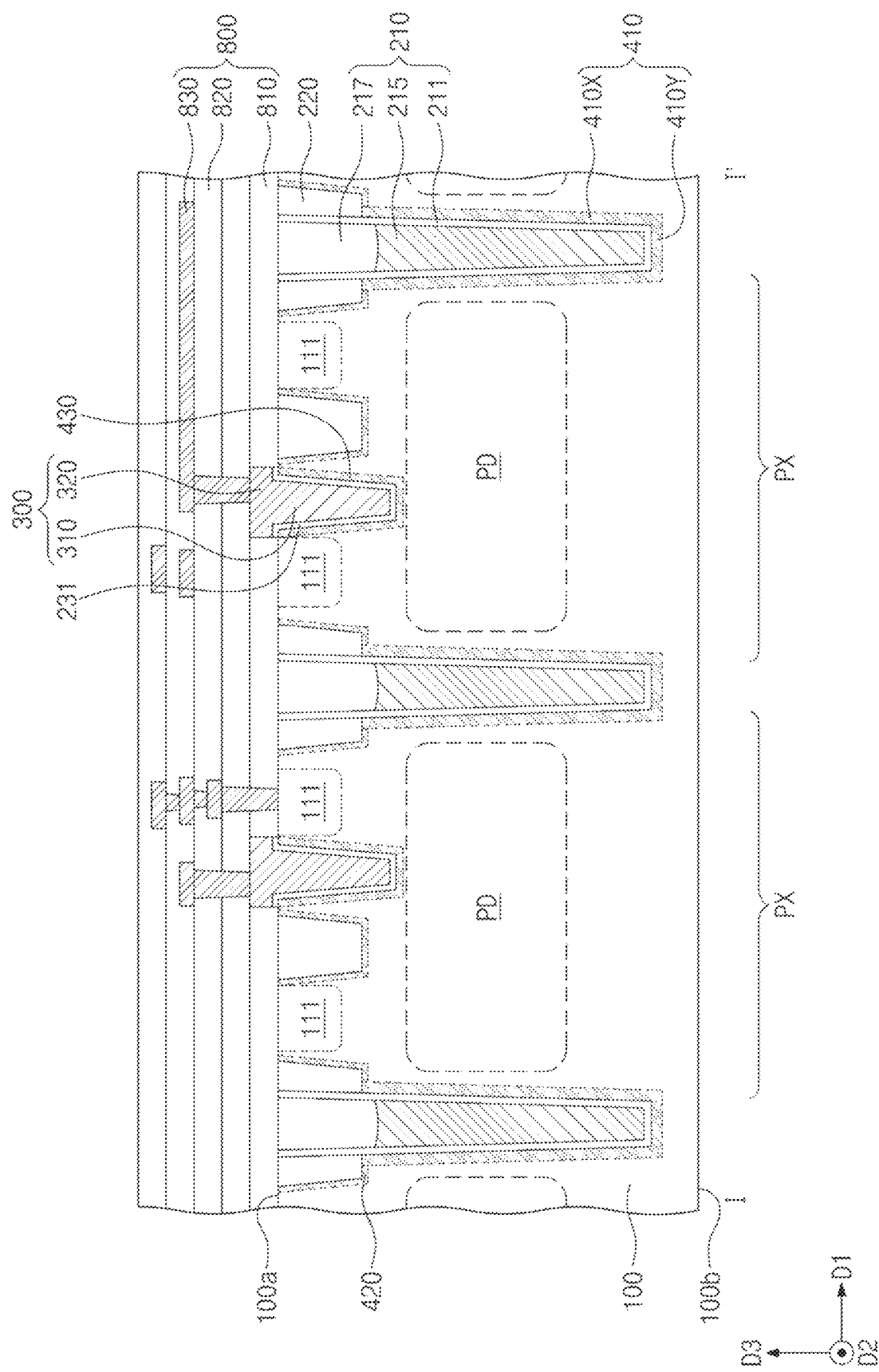

Referring to FIG. 12H, the first insulating layer 810, the second insulating layers 820, and the first conductive structures 830 may be formed on the first surface 100a of the first substrate 100 to form the first interconnection layer 800. One of the first conductive structures 830 may be electrically connected to the impurity region 111, and another of the lint conductive structures 830 may be electrically connected to the gate pattern 300.

Figure 12I:
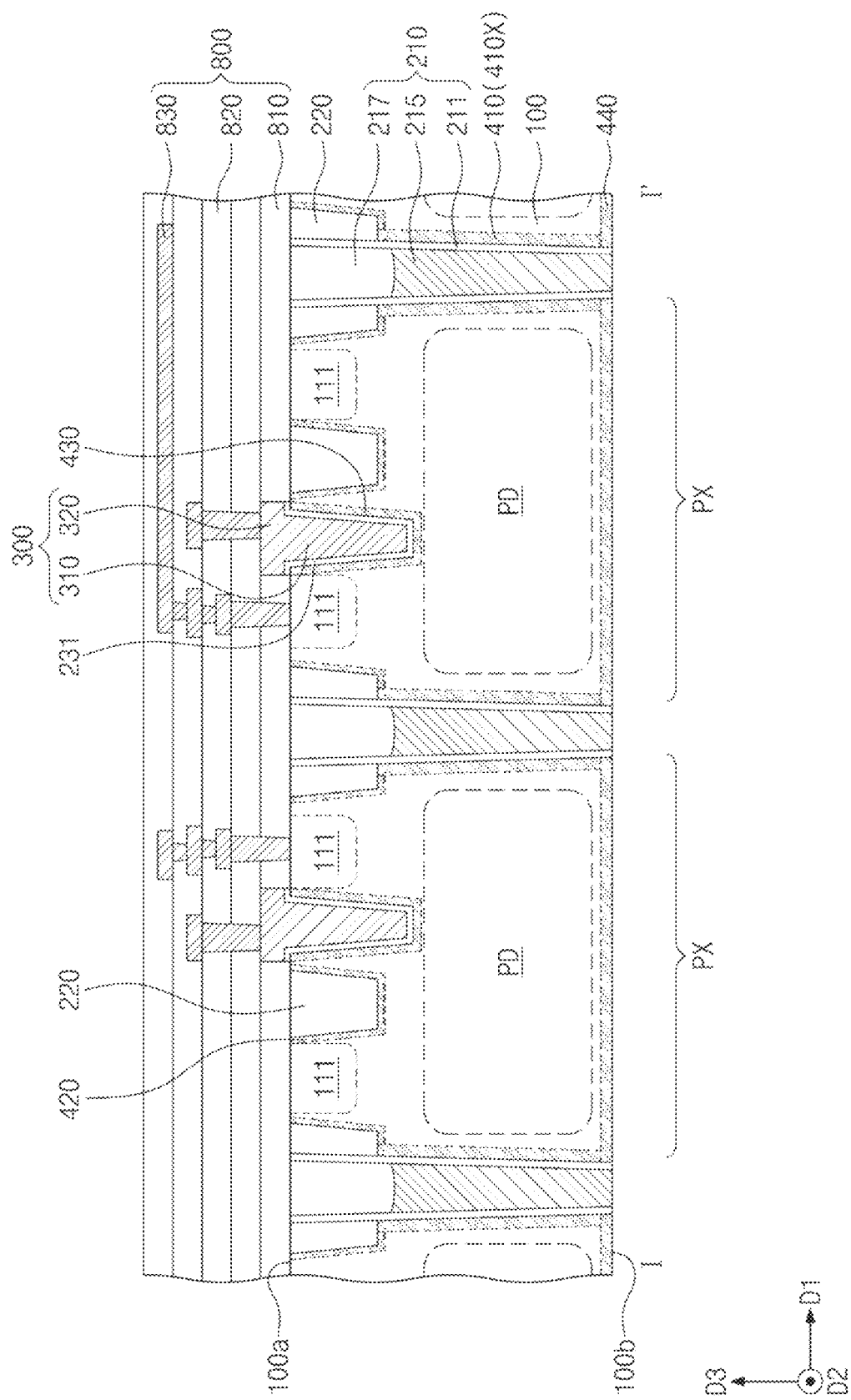

Referring to FIG. 12I, a thinning process may be performed on the second surface 100b of the first substrate 100 to expose the first isolation pattern 210 through the second surface 100b of the first substrate 100. The thinning process may include an etch-back process or a chemical mechanical polishing process. The thinning process may be performed in such a way that the bottom surface of the conductive isolation pattern 215 is exposed through the second surface 100b of the first substrate 100. The first bottom portion 410Y of the first doped region 410 may be removed by the thinning process. The first side portion 410X of the first doped region 410 may be left, even after the thinning process. As a result of the thinning process, an interface defect may be further formed on the second surface 100b of the first substrate 100.

After the thinning process, the back-side doped region 440 may be further formed on the second surface 100b of the first substrate 100. The formation of the hack-side doped region 440 may include performing the first purge process (in S10), the GPD process (in S20), and the second purge process (in S30), which were described h reference to FIG. 3. During the process of forming the back-side doped region 440, the bottom surface of the first insulating pattern 211 may be exposed to a doping gas. Thus, a third additional element region may be further formed in the first insulating pattern 211. The third additional element region of the first insulating pattern 211 may be the same as the third additional element region 212 in the embodiment of FIG. 11C.

Referring to FIG. 11A, the insulating layer 500, the color filters CF, the fence pattern 550, the protection layer 530, and the micro lens layer 600 may be formed on the second surface 100b of the first substrate 100. The image sensor of FIG. 11A may be fabricated as a result of the afore-described processes. In an embodiment, at least one of the first doped region 410, the second doped region 420, the third doped region 430, and the hack-side doped region 440 may not be formed.

Figure 13A:
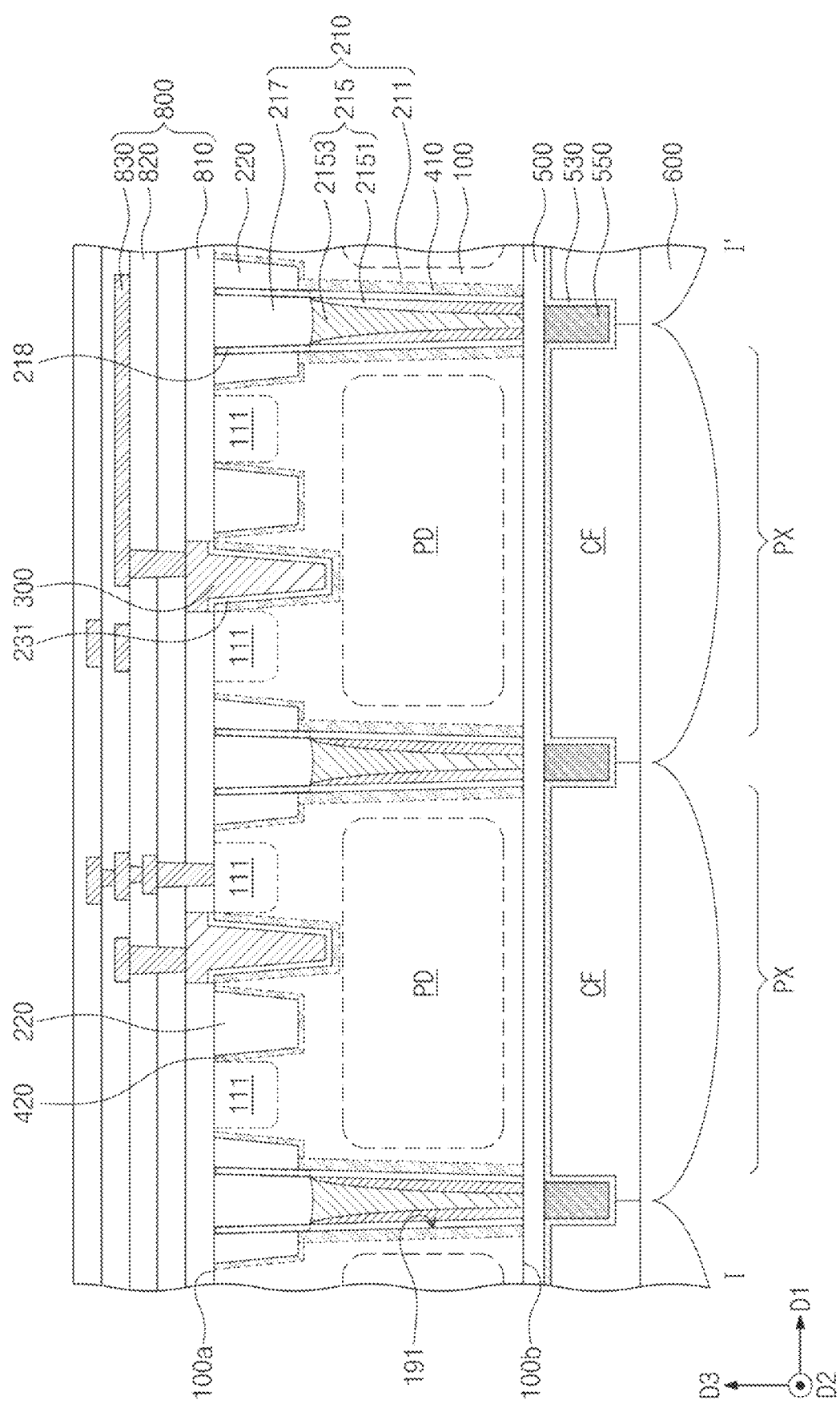
FIG. 13A is a sectional view illustrating a pixel array region of an image sensor according to an embodiment.

FIG. 13A is a sectional view, which is taken along a line I-I' of FIG. 6 to illustrate a pixel array region of an image sensor according to an embodiment.

Referring to FIG. 13A, the image sensor may include the first substrate 100, the first interconnection layer 800, the first doped region 410, the first isolation pattern 210, the device isolation pattern 220, the gate pattern 300, the color filters CF, and the micro lens layer 600. The image sensor nay further include the second doped region 420.

The first isolation pattern 210 may include the first insulating pattern 211, the conductive isolation pattern 215, and the capping pattern 217. The conductive isolation pattern 215 may include conductive liner pattern 2151 and a conductive gapfill pattern 2153. The conductive liner pattern 2151 may be provided on the side surface of the first insulating pattern 211. The bottom surface of the conductive liner pattern 2151 may be located at substantially the same level as the second surface 100b of the first substrate 100. The conductive liner pattern 2151 may include a crystalline semiconductor material and do pants. As an example, the conductive liner pattern 2151 may be formed of or include a doped polysilicon. The dopant may include at least one of group 3 elements. As an example, the dopant may include boron (B). As another example, the dopant may include aluminum (Al), indium (In), and/or gallium (Ga). The dopant may be provided in the conductive liner pattern 2151 to have a uniform dopant concentration. For example, the concentration of the dopant in the conductive liner pattern 2151 may have a tolerance of 15% or less. The number of dopants per unit area in the conductive liner pattern 2151 may range from $5.0 \times 10^{11}$ atoms/cm$^2$ to $1.0 \times 10^{14}$ atoms/cm$^2$. As an example, the conductive liner pattern 2151 may further include an auxiliary element. The auxiliary element may include, for example, chlorine. As another example, the auxiliary element may include hydrogen or fluorine. The auxiliary element may be provided in the conductive liner pattern 2151 to have a uniform dopant concentration. For example, the concentration of the auxiliary element in the conductive liner pattern 2151 may have a tolerance of 15% or less. However, in the conductive liner pattern 2151, the concentration of the auxiliary element may be lower than the concentration of the dopant. Thus, the electric characteristics of the conductive isolation pattern 215 may be improved.

The conductive gapfill pattern 2153 may be disposed on the conductive liner pattern 2151 and may be spaced apart from the first insulating pattern 211. The side surface of the conductive gapfill pattern 2153 may be enclosed by the conductive liner pattern 2151. The conductive liner pattern 2151 may be interposed between the conductive gapfill pattern 2153 and the first insulating pattern 211. The conductive gapfill pattern 2153 may be in physical contact with the conductive liner pattern 2151 and may be electrically connected to the conductive liner pattern 2151. The conductive gapfill pattern 2153 may include a crystalline semiconductor material and dopants. The conductive gapfill pattern 2153 may be formed of or include the same material as the conductive liner pattern 2151. For example, the crystalline semiconductor material of the conductive gapfill pattern 2153 may be the same material as the crystalline semiconductor material of the conductive liner pattern 2151. The dopant in the conductive gapfill pattern 2153 may be the same element as the dopant in the conductive liner pattern 2151. The dopant in the conductive gapfill pattern 2153 may include at least one of group 3 elements (e.g., boron). The conductive gapfill pattern 2153 may be formed of or include doped poly silicon.

The conductive gapfill pattern 2153 may have a uniform dopant concentration. For example, the concentration of the dopant in the conductive gapfill pattern 2153 may have a tolerance of 15% or less. The number of dopants per unit area in the conductive gapfill pattern 2153 may range from $5.0 \times 10^{11}$ atoms/cm$^2$ to $1.0 \times 10^{14}$ atoms/cm$^2$. The concentration of the dopant in the conductive gapfill pattern 2153 may be substantially equal to the concentration of the dopant in the conductive liner pattern 2151. For example, the concentration of the dopant in the conductive gapfill pattern 2153 may be from 85% to 115% of the concentration of the dopant in the conductive liner pattern 2151.

As an example, the conductive gapfill pattern 2153 may further include an auxiliary element. The auxiliary element may include, for example, chlorine, hydrogen, or fluorine. The concentration of the auxiliary element in the conductive gapfill pattern 2153 may have a tolerance of 15% or less. However, in an embodiment, the concentration of the auxiliary element in the conductive gapfill pattern 2153 may be lower than the concentration of the dopant in the conductive gapfill pattern 2153. Thus, the electric characteristics of the conductive isolation pattern 215 may be improved. The concentration of the auxiliary element in the conductive gapfill pattern 2153 may be from 85% to 115% of the concentration of the auxiliary element in the conductive liner pattern 2151. As another example, at least one of the conductive liner pattern 2151 and the conductive gapfill pattern 2153 may omit the auxiliary element.

During operations of the image sensor, a first voltage may be applied to the conductive isolation pattern 215. The first voltage may be a negative bias voltage. Thus, it may be possible to prevent a dark current from being formed between the first isolation pattern 210 and the first substrate 100, during operations of the image sensor. The dark current may be produced by an interface defect on the side surface of the first trench 191. The image sensor may exhibit an improved property.

Since the concentration of the dopant in the conductive gapfill pattern 2153 is from 85% to 115% of the concentration of the dopant in the conductive liner pattern 2151, it may be possible to more effectively apply the first voltage to the conductive isolation pattern 215. Thus, it may be possible to more effectively prevent the dark current from being produced. Since the concentration of the dopant in the conductive liner pattern 2151 has a tolerance of 15% or less and the concentration of the dopant in the conductive gapfill pattern 2153 has a tolerance of 15% or less, it may be possible to more effectively prevent the dark current from being produced. Although not shown, an oxide layer may be further provided between the conductive liner pattern 2151 and the conductive gapfill pattern 2153.

The first insulating pattern 211 may further include an additional element region 218. The additional element region 218 may be interposed between the capping pattern 217 and the device isolation pattern 220. The additional element region 218 may further include a first additional element, and in an embodiment, the first additional element may be the same element as the dopant in the conductive liner pattern 2151 and the dopant in the conductive gapfill pattern 2153. The concentration of the first additional element in the additional element region 218 may have a tolerance of 15% or less.

In the case where the conductive liner pattern 2151 or the conductive gapfill pattern 2153 further includes an auxiliary element, the additional element region 218 may further include an auxiliary element. The auxiliary element in the additional element region 218 may be the same element as the auxiliary element in the conductive liner pattern 2151 or the auxiliary element in the conductive gapfill pattern 2153. In the additional element region 218, a concentration of the auxiliary element may be lower than a concentration of the first additional element.

Although not shown, the image sensor may further include at least one of the third doped region 430 and the back-side doped region 440 described with reference to FIGS. 11A and 11B. Alternatively, at least one of the first doped region 410 and the second doped region 420 may not be formed.

Figure 13B:
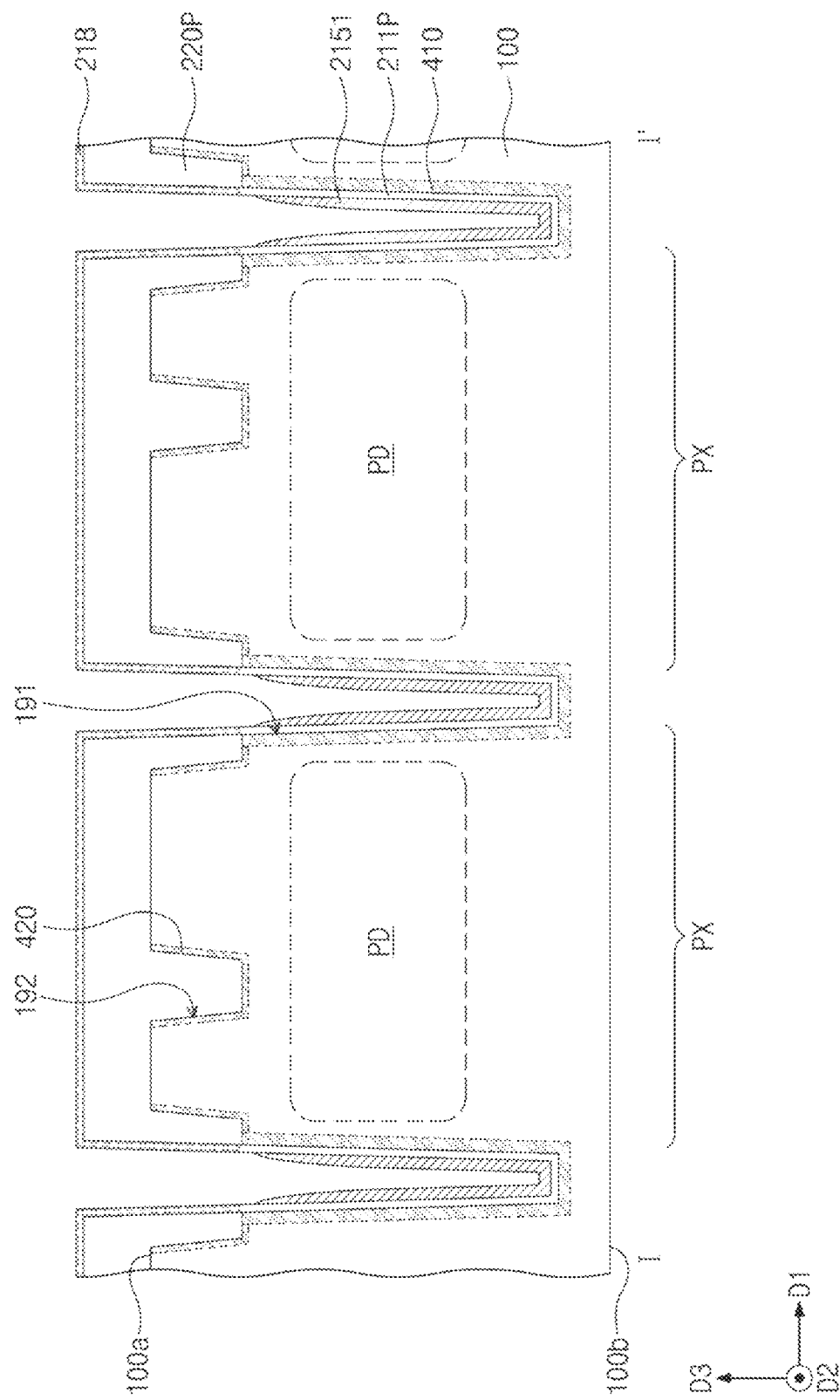
FIGS. 13B and 13C are sectional views illustrating a method of forming a conductive isolation pattern, according to an embodiment.
Figure 13C:
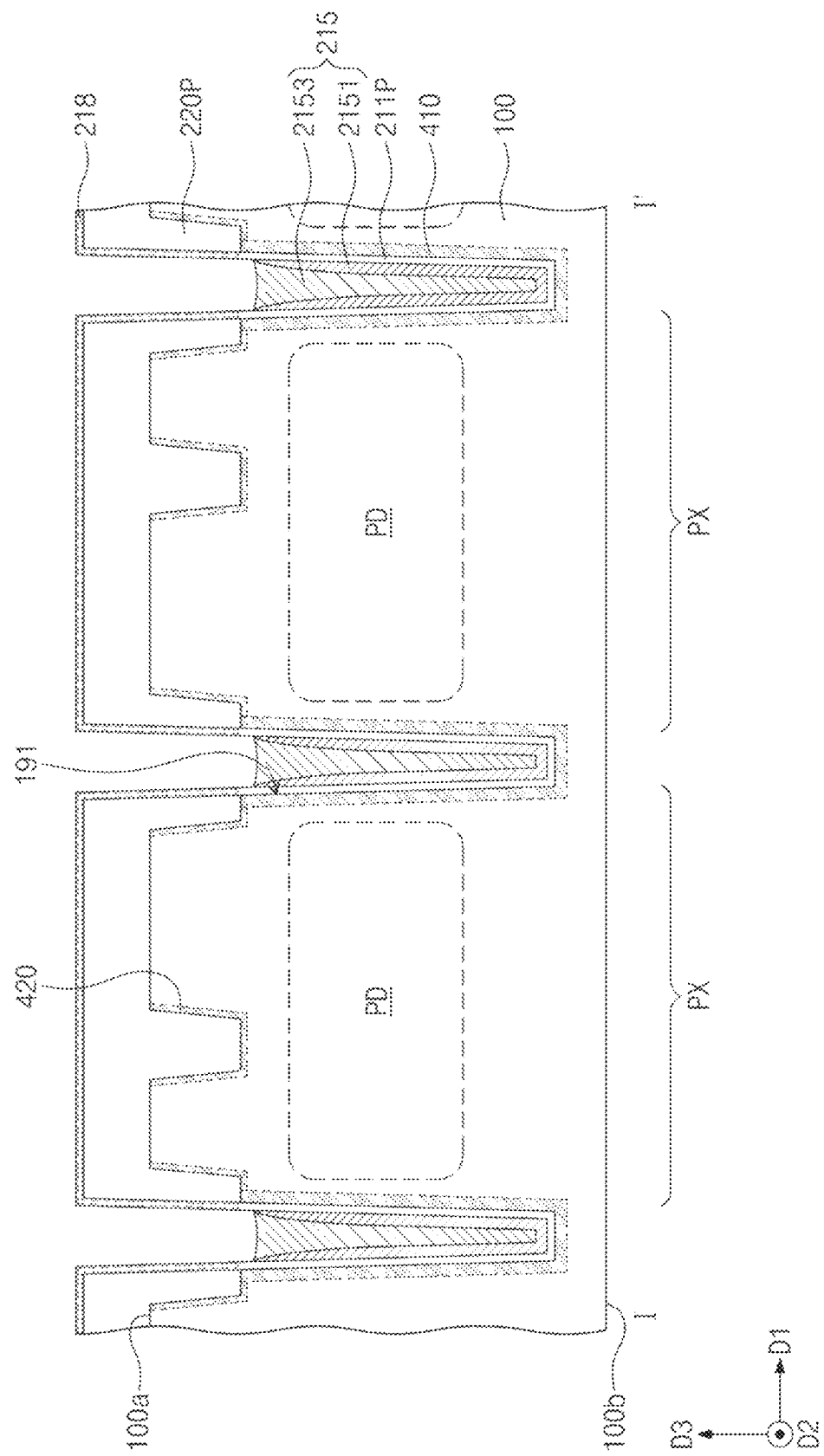

FIGS. 13B and 13C are sectional views illustrating a method of forming a conductive isolation pattern, according to an embodiment. For concise description, a previously described element may be identified by the same reference number without repeating an overlapping description thereof.

Referring to FIG. 13B, the second trench 192, the second doped region 420, the preliminary device isolation pattern 220P, the first doped region 410, and the first trench 191 may be formed in the first substrate 100 by the same method as that in the embodiment described with reference to FIGS. 12A to 12B. The first preliminary insulating pattern 211P may be formed in the first trench 191.

The conductive liner pattern 2151 may be formed in the flat trench 191 to cover the bottom and side surfaces of the first trench 191. The first trench 191 may have a first side surface and a second side surface, which are opposite to each other. The conductive liner pattern 2151 may include, a first portion, a second portion, and a third portion. The first and second portions of the conductive liner pattern 2151 may be disposed on the first and second side surfaces of the first trench 191. In the conductive liner pattern 2151, the first and second portions may have opposite side surfaces facing each other. The third portion of the conductive liner pattern 2151 may be disposed on the bottom surface of the first trench 191 and may be connected to the first and second portions.

The formation of the conductive liner pattern 2151 may include depositing a crystalline semiconductor material to cover the first trench 191 and doping the crystalline semiconductor material. The doping of the crystalline semiconductor material may include performing the first purge process (in S10), the GPD process (in S20), and the second purge process (in S30), which were described with reference to FIG. 3. As a result of the GPD process, a doping gas may be uniformly supplied to the side surface of the first portion, the side surface of the second portion, and the top surface of the third portion of the conductive liner pattern 2151, and thus, the conductive liner pattern 2151 may be doped with the dopant. As a result of the use of the GPD process, the conductive liner pattern 2151 may be formed such that the concentration of the dopant therein is the same as that described with reference to FIG. 13A. In an embodiment, an auxiliary element, along with the dopant, may be further injected into the conductive liner pattern 2151.

A portion of the first preliminary insulating pattern 211P may be exposed to the GPD process, and in this case, the fourth additional element region 218 may be formed in the first preliminary insulating pattern 211P. Thus, the element in the fourth additional element region 218 may be the same element as the dopant in the conductive liner pattern 2151. The fourth additional element region 218 may be formed in a portion of the first preliminary insulating pattern 211P that is not covered with the conductive liner pattern 2151.

Referring to FIG. 13C, the conductive gapfill pattern 2153 may be formed on the conductive liner pattern 2151 to fill a lower portion of the first trench 191. The conductive gapfill pattern 2153 may not fill an upper portion of the first trench 191. The formation of the conductive gapfill pattern 2153 may include depositing a crystalline semiconductor material to cover the first trench 191 and doping the crystalline semiconductor material. The doping step may be performed using the method described with reference to FIG. 3. Thus, a doping gas may be uniformly supplied onto the top surface of the conductive gapfill pattern 2153, and dopants may be provided into the conductive gapfill pattern 2153. Since the doping process is performed using the GPD process, the concentration of the dopant in the conductive gapfill pattern 2153 may meet the condition described with reference to FIG. 13A. An auxiliary element, along with the dopant, may be further injected into the conductive gapfill pattern 2153.

Thereafter, an annealing process may be further performed. As a result of the annealing process, the dopants may be uniformly diffused in the conductive liner pattern 2151, and the dopants may be diffused in the conductive gapfill pattern 2153.

Referring back to FIG. 12D, the preliminary capping pattern 217P may be formed on the conductive isolation pattern 215. Next, the processes described with reference to FIGS. 12E to 12I and FIG. 7A may be further performed to fabricate the image sensor of FIG. 13A. Here, a portion of the fourth additional element region 218 may be removed by the recess process of the first preliminary insulating pattern 211P, and another portion of the fourth additional element region 218 may be left in the first insulating pattern 211.

Figure 13D:
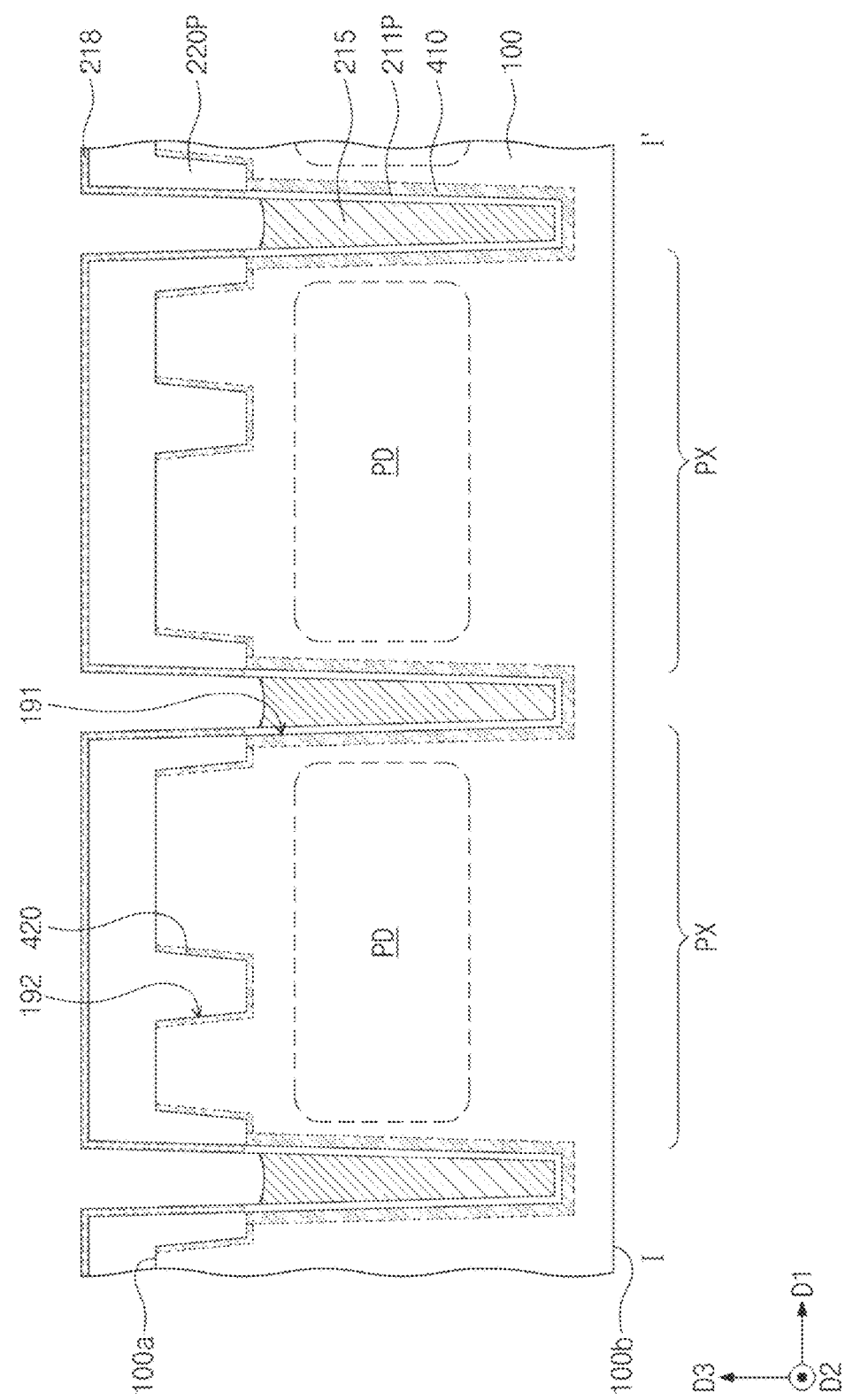
FIG. 13D is a sectional view illustrating a method of forming a conductive isolation pattern, according to an embodiment.

FIG. 13D is a sectional view illustrating a method of forming a conductive isolation pattern, according to an embodiment. For concise description, a previously described element may be identified by the same reference number without repeating an overlapping description thereof.

Referring to FIG. 13D, the second trench 192, the preliminary device isolation pattern 220P, the second doped region 420, the first doped region 410, and the first trench 191 may be formed in the first substrate 100.

The conductive isolation pattern 215 may be formed on the first preliminary insulating pattern 211P to fill a lower portion of the first trench 191. Here, a process of forming the conductive liner pattern 2151 of FIG. 13A may not be performed. The formation of the conductive isolation pattern 215 may include depositing a crystalline semiconductor material to cover the first trench 191 and doping the crystalline semiconductor material. The crystalline semiconductor material may be omitted in an upper portion of the first trench 191. The doping step may be performed using the method described with reference to FIG. 3. Thus, a doping gas may be uniformly supplied onto the top surface of the conductive isolation pattern 215, and dopants may be provided in the conductive isolation pattern 215. Since the doping process is performed using the GPD process, the concentration of the dopant may meet the condition described with reference to FIGS. 7A and 7B. In an embodiment, an auxiliary element may be farther injected into the conductive isolation pattern 215, during the GPD process. The auxiliary element in the conductive isolation pattern 215 may be the same embodiment as that described with reference to FIG. 7A. A portion of the first preliminary insulating pattern 211P may be exposed to the GPD process, and in this case, the fourth additional element region 218 may be formed in the first preliminary insulating pattern 211P.

Referring back to FIG. 12D, the preliminary capping pattern 217P may be formed on the conductive isolation pattern 215. Next, the processes described with reference to FIGS. 12E to 12I and FIG. 7A may be further performed to fabricate the image sensor of FIG. 7A. Here, a portion of the fourth additional element region 218 may be removed by the recess process of the first preliminary insulating pattern 211P, and another portion of the fourth additional element region 218 may be left in the first insulating pattern 211. In order to reduce complexity in the drawings, the fourth additional element region 218 in the first insulating pattern 211 is not illustrated in the drawings except for FIGS. 13A to 13D, but embodiments are not limited to the structures illustrated in such simplified figures.

Figure 14A:
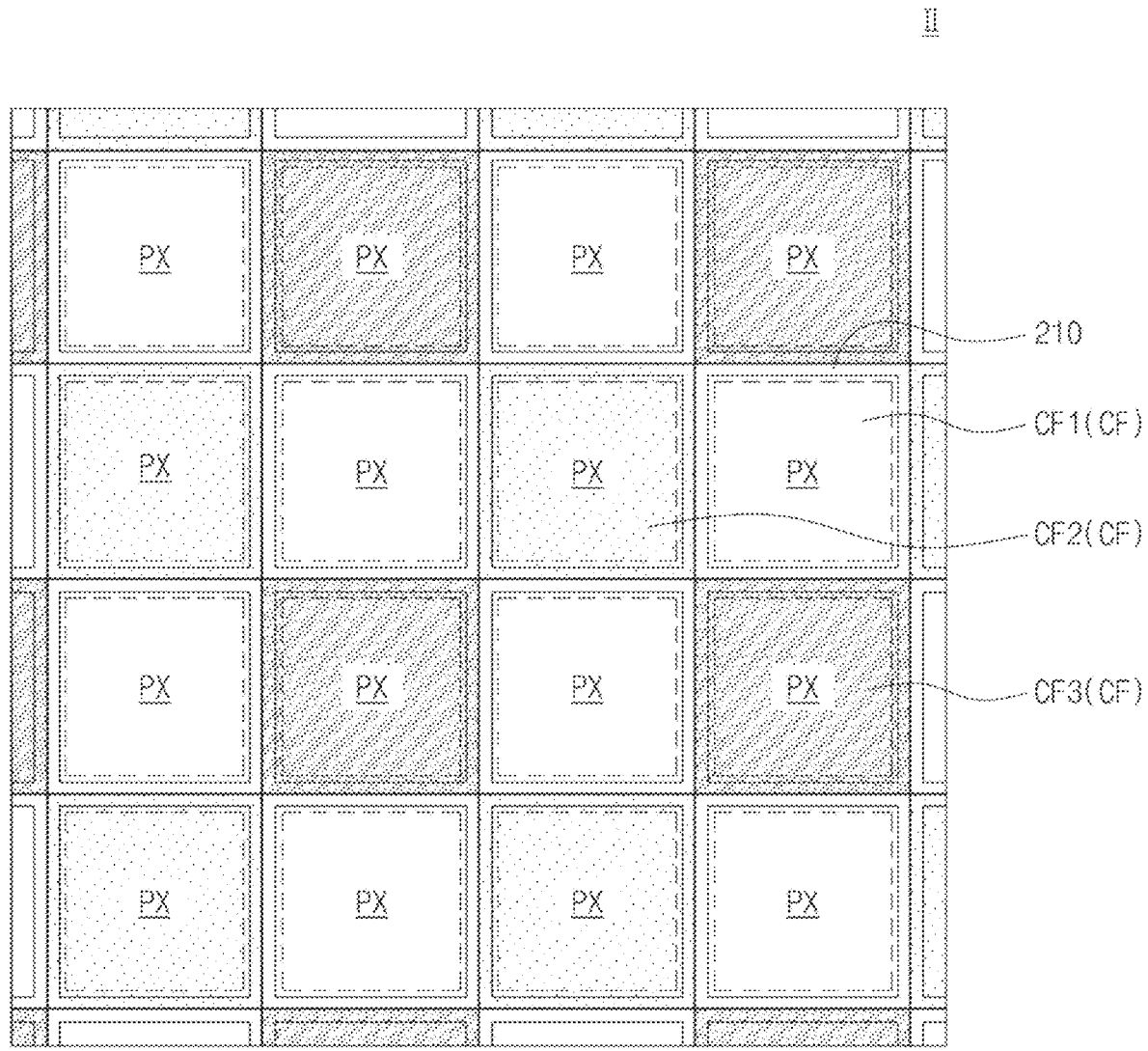
FIG. 14A is an enlarged plan view illustrating color filters, which are arranged in a region (e.g., a region II of FIG. 6) of an image sensor according to an embodiment.

FIG. 14A is an enlarged plan view illustrating color filters, which are arranged in a region (e.g., a region II of FIG. 6) of an image sensor according to an embodiment. For concise description, a previously described element may be identified by the same reference number without repeating an overlapping description thereof, and FIG. 6 may also be referred to in the following description.

Referring to FIG. 14A, the pixel array region APS (e.g., see FIG. 6 of the first substrate 100 may include the pixel regions PX. The pixel regions PX may be two-dimensionally arranged to form a plurality of rows and a plurality of columns, when viewed in a plan view. The rows may be parallel to the first direction D1, and the columns may be parallel to the second direction D2. The pixel regions PX may be defined by the first isolation pattern 210. For example, the first isolation pattern 210 may be provided to enclose each of the pixel regions PX, when viewed in a plan view.

The color filters CF may be disposed on the pixel regions PX, respectively. The color filters CF may have substantially the same features as the color filters CF in the embodiment described with reference to FIGS. 7A and 7B. The color filters CF may include a first color filter CF1, a second color filter CFS, and a third color filter CF3. The first color filter CF1 may be a green color filter. The green color filter may be configured to allow for selective transmission of a green light, among the visible light. In the case where the photoelectric conversion region PD is disposed on a bottom surface of the first color filter CF1, the photoelectric conversion region PD may generate photoelectrons corresponding to the green light. The second color filter CF2 may be a red color filler, and the third color filter CF3 may include a blue color filter.

The color filters CF may be arranged in a Bayer pattern. For example, the number of the first color filters CF1 may be greater than the number of the second color filters CF2. For example the number of the first color filters CF1 may be equal to or greater than two times the number of the second color filters CF2. The number of the first color filters CF1 may be greater than the number of the third color filters CF3. For example, the number of the first color filters CF1 may be equal to or greater than two times the number of the third color filter CF3. The first color filters CF1 may be arranged in a first diagonal direction D4. The first diagonal direction D4 may be parallel to the first surface 100a of the first substrate 100 and may not be parallel to both of the first and second directions D1 and D2, when viewed in a plan view. Each of the second color filters CF2 may be disposed between two adjacent ones of the first color filters CF1. Each of the third color filters CF3 may be disposed between two adjacent ones of the first color filters CF1. The third color filters CF3 may be located relative to in the second color filters CF2, in a second diagonal direction D5. The second diagonal direction D5 may be parallel to the first surface 100a of the first substrate 100, and when viewed in a plan view, may be substantially perpendicular to the first diagonal direction D4.

Figure 14C:
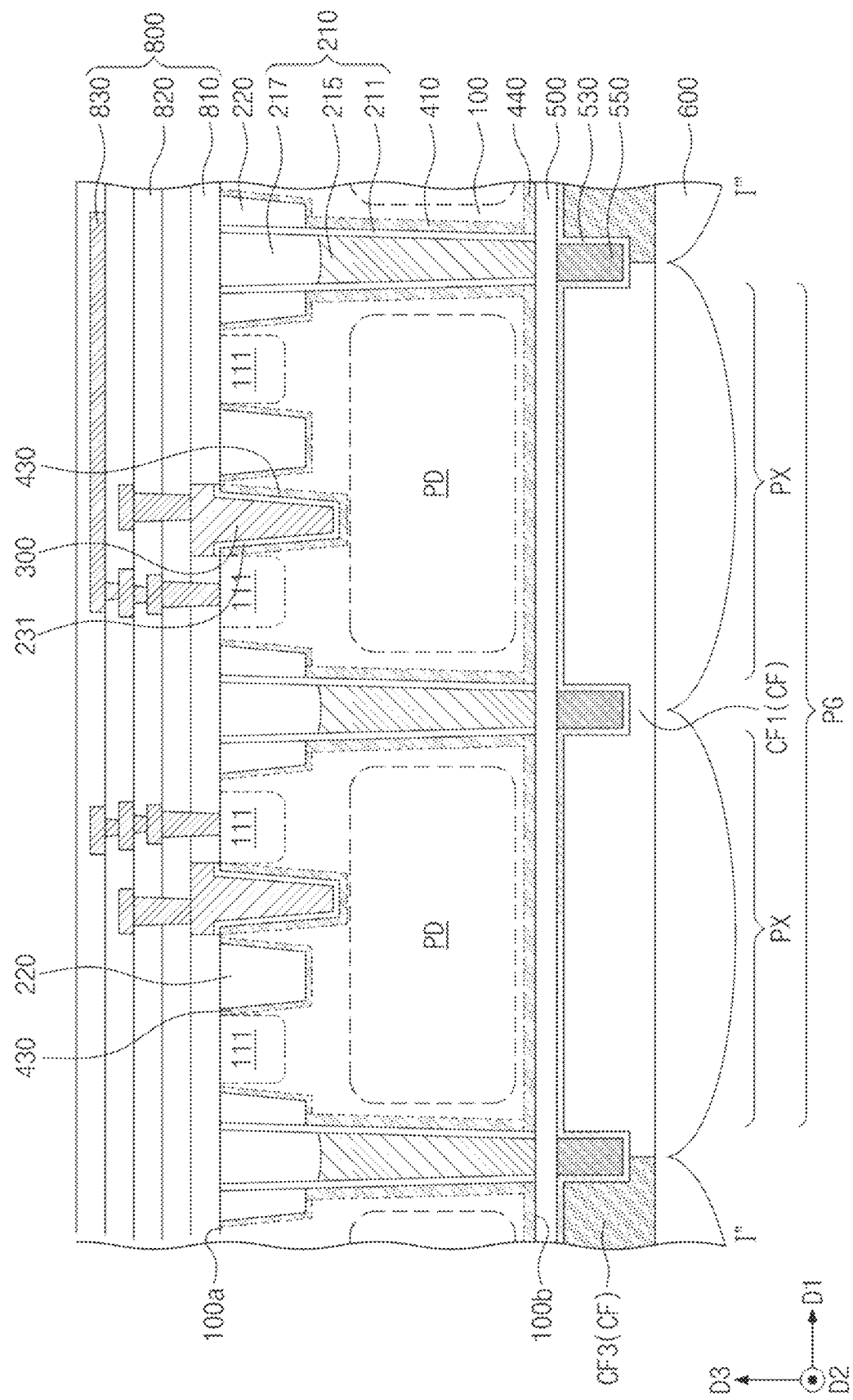
FIG. 14C is a sectional view taken along a line I'-I''' of FIG. 14B.

FIG. 14B is an enlarged plan view of a region II of FIG. 6 and illustrates an arrangement of color filters m an image sensor according to an embodiment. FIG. 14C is a sectional view taken along a line I'-I''' of FIG. 14B.

Referring to FIGS. 14B and 14C, the image sensor may include the first substrate 100, the first interconnection layer 800, the first isolation pattern 210, the device isolation pattern 220, the first to third doped regions 410, 420, and 430, the back-side doped region 440, the gate pattern 300, the color filters CF, and the micro lens layer 600. At least one of the first to third doped regions 410, 420, and 430 and the back-side doped region 440 may be omitted.

The pixel array region APS (e.g., see FIG. 6) of the first substrate 100 may include a pixel group PG. The pixel groups PG may be two-dimensionally arranged in the first and second directions D1 and D2, when viewed in a plan view. Each of the pixel group PG may include a plurality of the pixel regions PX. For example, the pixel regions PX of the pixel group PG may be two-dimensionally arranged to form two rows and two columns.

The color filters CF may be disposed in the pixel groups PG, respectively, on the second surface 100b of the first substrate 100. The color filters CF may be substantially the same as the color filters CF in the embodiment of FIG. 14A. The color filters CF may include the first color filter CF1, the second color filter CF2, and the third color filter CF3. The first color filter CF1, the second color filter CF2, and the third color filter CF3 may be arranged in the Bayer pattern, as described with reference to FIG. 14A. However, in an embodiment, each of the color filters CF may be disposed on the pixel group PG and may be overlapped with a plurality of the pixel regions PX constituting the pixel group PG, when viewed in a plan view. Each of the color filters CF may be disposed on the photoelectric conversion regions PD of the pixel regions PX of the pixel group PG.

Thus, the pixel regions PX of the pixel group PG may share a corresponding one of the color filters CF. For example, the first color filter CF1 may be provided on the pixel regions PX constituting one of the pixel groups PG. The second color filter CF2 may be disposed on the pixel regions PX constituting another one of the pixel groups PG. The third color filter CF3 may be disposed on the pixel regions PX constituting other of the pixel groups PG. The image sensor may have a tetra-cell structure.

Figure 14D:
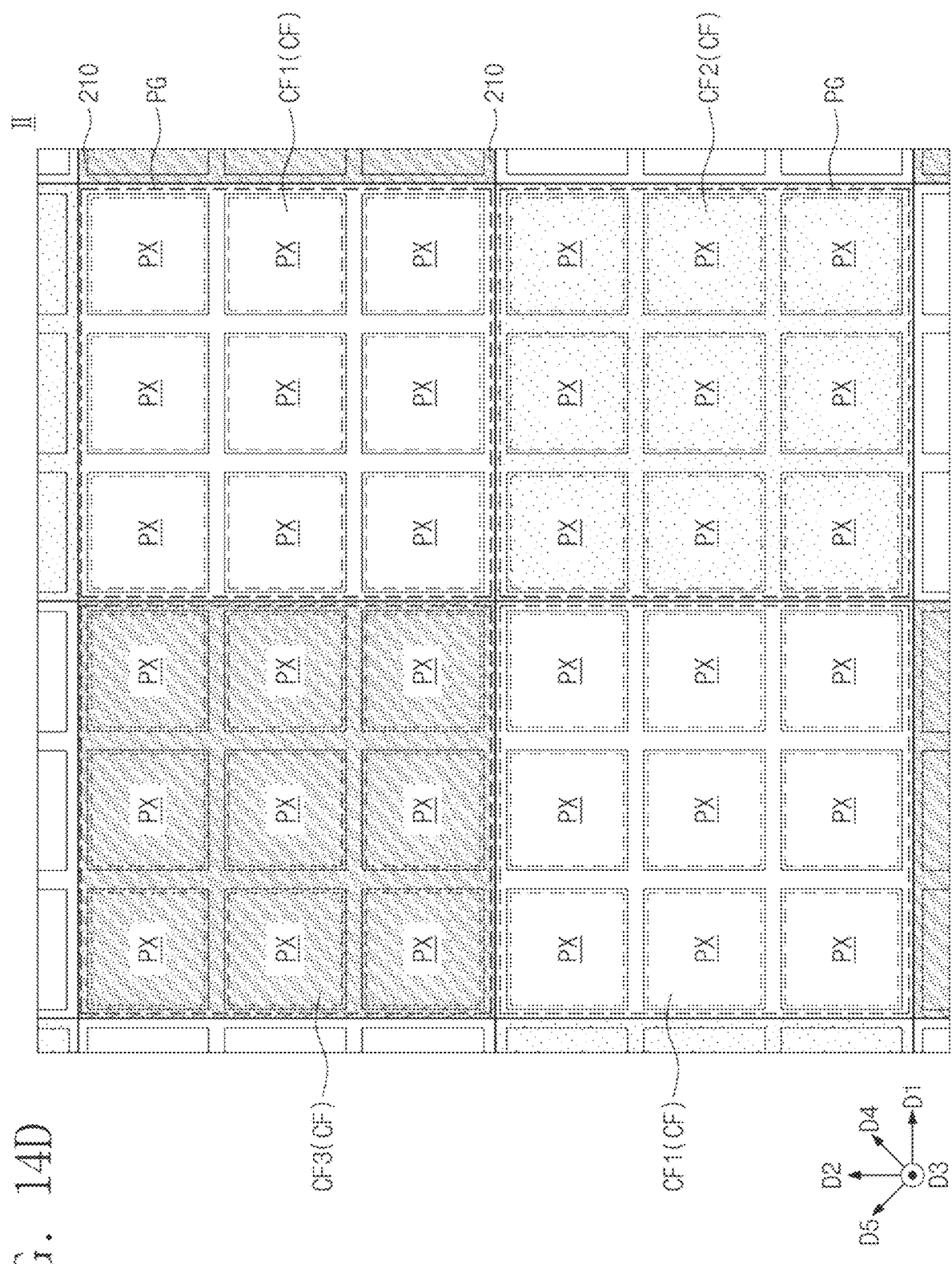
FIG. 14D is a plan view illustrating color filters, which are arranged in an image sensor according to an embodiment.

FIG. 14D is an enlarged plan view of a region II of FIG. 6 and illustrates an arrangement of color filters in an image sensor according to an embodiment.

Referring to FIG. 14D, the pixel array region of the image sensor may have a nona-cell structure. In this case, each of the pixel groups PG may include nine pixel regions PX. The nine pixel regions PX may be two-dimensionally arranged to form three rows and three columns. The color filters CF may be provided on the pixel groups PG, respectively. In other words, each of the color filters CF may be provided on the nine pixel regions PX constituting each pixel group PG and may be vertically overlapped with the photoelectric conversion regions PD of the nine pixel regions PX. The first color filter CF1, the second color filter CF2, and the third color filter CF3 may be arranged in the Bayer pattern, as described with reference to FIG. 14A.

Figure 15A:
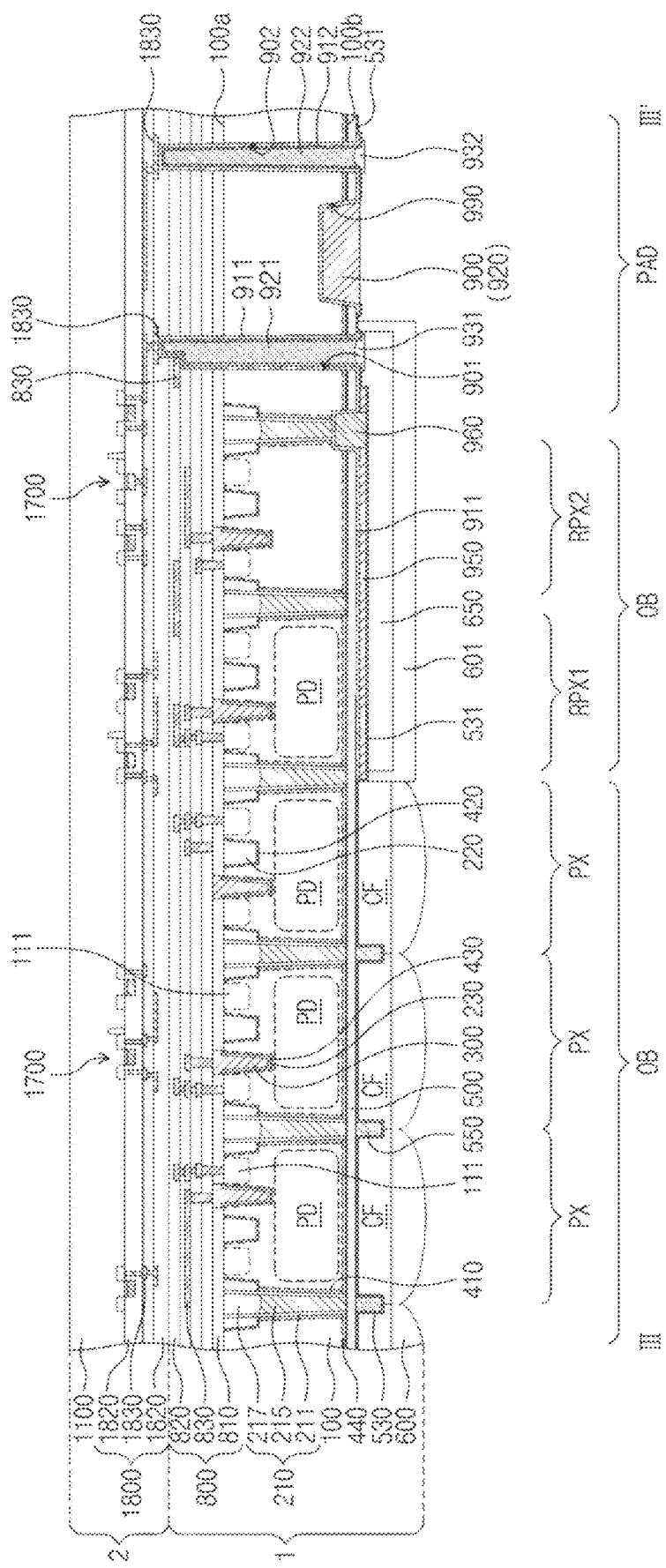
FIG. 15A is a sectional view taken along a line III-III' of FIG. 6 to illustrate an image sensor according to an embodiment.

FIG. 15A is a sectional view taken along a line III-III' of FIG. 6 to illustrate an image sensor according to an embodiment.

Referring to FIGS. 6 and 15A, the image sensor may include a sensor chip 1 and a circuit chip 2. The sensor chip 1 may include the first substrate 100, the first interconnection layer 800, the first isolation pattern 210, the device isolation pattern 220, the first to third doped regions 410, 420, and 430, the back-side doped region 440, the gate pattern 300, the color filters CF, and the micro lens layer 600. The sensor chip 1 may further include at least one of the insulating layer 500, the protection layer 530, and the fence pattern 550.

The first substrate 100 may include the pixel array region APS, the optical black region GB, and the pad region PAD. When viewed in a plan view. The pixel array region APS of the first substrate 100 may be configured to include the same elements as those in the previously-described embodiment. The optical black region OB of the first substrate 100 may be interposed between the pixel array region APS and the pad region PAD. The optical black region OB may include a first reference pixel region RPX1 and a second reference pixel region RPX2. The first reference pixel region RPX1 may be disposed between the second reference pixel region RPX2 and the pixel array region APS. In the optical black region OB, the photoelectric conversion region PD may be provided in the first reference pixel region RPX1. The photoelectric conversion region PD of the first reference pixel region RPX1 may be the same as the photoelectric, conversion regions PD of the pixel regions PX in terms of planar area and volume. The photoelectric conversion region PD may not be provided in the second reference pixel region RPX2. The impurity regions 111, the gate pattern 300, and the device isolation pattern 220 may be disposed in each of the first and second reference pixel regions RPX1 and RPX2. At least one of the first doped region 410, the second doped region 420, the third doped region 430, and the back-side doped region 440 may be further disposed in the first and second reference pixel regions RPX1 and RPX2. The insulating layer 500 may be extended to the optical black region OB and the pad region PAD of the first substrate 100 and may cover the first surface 100a of the first substrate 100.

The sensor chip 1 may further include a light-blocking layer 950, a first conductive layer 911, a filtering layer 650, an organic layer 601, and a contact plug 960. The light-blocking layer 950, the first conductive layer 911, the filtering layer 650, the organic layer 601, and the contact plug 960 may be provided on the optical black region OB of the first substrate 100.

The light-blocking layer 950 may be provided on the second surface 100b of the optical black region OB of the first substrate 100. The light-blocking layer 950 may be disposed on the bottom surface of the insulating layer 500. Owing to the light-blocking layer 950, light may not be incident into the photoelectric conversion region PD of the optical black region OB. The pixels of the first and second reference pixel regions RPX1 and RPX2 of the optical black region OB may output a noise signal, not the photoelectric signal. The noise signal may be produced by electrons, which are generated by heat or a dark current. The light-blocking layer 950 may not veil the pixel array region APS, and thus, light may be incident into the photoelectric conversion regions PD in the pixel array region APS. It may be possible to remove the noise signal from photoelectric signals. Which are output from the pixel regions PX. The light-blocking layer 950 may be formed of or include at least one of metallic materials (e.g., tungsten, copper, aluminum, or alloys thereof).

The first conductive layer 911 may be provided on the optical black region OB and the pad region PAD of the first substrate 100. The first conductive layer 911 may be disposed between the insulating layer 500 and the light-blocking layer 950. The first conductive layer 911 may serve as a barrier layer or an adhesive layer. The first conductive layer 911 may be formed of include at least one of metallic materials and/or metal nitrides. For example, the first conductive layer 911 may be formed of or include titanium and/or titanium nitride. The first conductive layer 911 may not be extended to a region on the pixel array region APS of the first substrate 100.

The contact plug 960 may be provided on the second surface 100b of the optical black region OB of the first substrate 100. The contact plug 960 may be disposed in the insulating layer 500 and on a bottom surface of the outermost portion of the first isolation pattern 210. A contact trench may be formed on the second surface 100b of the first substrate 100, and the contact plug 960 may be provided in the contact trench. The contact plug 960 may be formed of or include a material different from the light-blocking layer 950. For example, the contact plug 960 may be formed of or include aluminum. The first conductive layer 911 may be extended into regions between the contact plug 960 and the insulating layer 500 and between the contact plug 960 and the first isolation pattern 210. The contact plug 960 may be electrically connected to the conductive isolation pattern 215 through the first conductive layer 911. Thus, a negative bias voltage may be applied to the conductive isolation pattern 215.

A protection insulating layer 531 may be disposed on a bottom surface of the light-blocking layer 950 and a bottom surface of the contact plug 960. The protection insulating layer 531 may be fumed of or include the same material as the protection layer 530 and may be connected to the protection layer 530. The protection insulating layer 531 and the protection layer 530 may be formed as a single object. In an embodiment, the protection insulating layer 531 may be formed by a process, which is different from that for the protection layer 530, and may be spaced apart from the protection layer 530. The protection insulating layer 531 may be formed of or include at least one of high-k dielectric materials (e.g., aluminum oxide and/or hafnium oxide).

The filtering layer 650 may be disposed on the second surface 100b of the optical black region OB to cover a bottom surface of the protection insulating layer 531. The filtering layer 650 may block light which has a wavelength different from that by the color filters CF. For example, the filtering layer 650 may be configured to block the infrared light. The filtering layer 650 may include a blue color filter, but embodiments are not limited to this example.

The organic layer 601 may be disposed on a bottom surface of the filtering layer 650, in the optical black region OB. The organic layer 601 may be transparent. The organic layer 601 may have a bottom surface that is opposite to the first substrate 100 and is substantially flat. The organic layer 601 may be formed of or include at least one of, for example, polymers. The organic layer 601 may have an insulating property. Unlike the illustrated structure in FIG. 15A, the organic layer 601 may be connected to the micro lens layer 600. The organic layer 601 may be formed of or include the same material as the micro lens layer 600. Although not shown, a coating layer may be additionally provided on the bottom surface of the organic layer 601 to conformally cover the bottom surface of the organic layer 601.

The first interconnection layer 800 may be provided on the first surface 100a of the first substrate 100 to cover the pixel array region APS, the optical black region OB, and the pad region PAD of the first substrate 100.

The image sensor may further include the circuit chip 2. The circuit chip 2 may be stacked on the sensor chip 1. The circuit chip 2 may include a second interconnection layer 1800, integrated circuits 1700, and a second substrate 1100. The second interconnection layer 1800 may be interposed between the first interconnection layer 800 and the second substrate 1100. The integrated circuits 1700 may be disposed on a bottom surface of the second substrate 1100 or in the second substrate 1100. The integrated circuits 1700 may include logic circuits, memory circuits, or combinations thereof. The integrated circuits 1700 may include for example, transistors. The second interconnection layer 1800 may include third insulating layers 1820 and a second conductive structure 1830. The second conductive structures 1830 may be disposed between or in the third insulating layers 1820. The second conductive structures 1830 may be electrically connected to the integrated circuits 1700. The second conductive structures 1830 may include a via pattern and a line pattern. Hereinafter, one of the second conductive structures 1830 will be mentioned in the following description.

Elements on the pad region PAD of the first substrate 100 will be described hereinafter. The sensor chip 1 may further include a pad terminal 900, a first gapfill pattern 921, a first capping pattern 931, a second gapfill pattern 922, and a second capping pattern 932, which are provided on the pad region PAD of the first substrate 100. The back-side doped region 440 may be further extended to a region on the pad region PAD of the first substrate 100.

The pad terminal 900 may be disposed on the second surface 100b of the pad region PAD of the first substrate 100. The pad terminal 900 may be buried in the first substrate 100. For example, a pad trench 990 may be formed on the second surface 100b of the pad region PAD of the first substrate 100, and the pad terminal 900 may be provided in the pad trench 990. The pad terminal 900 may be formed of or include at least one of metallic materials (e.g., aluminum, copper, tungsten, titanium, tantalum, or alloys thereof). During a packaging or mounting process of the image sensor, a bonding wire may be formed on the pad terminal 900 and may be coupled to the pad terminal 900. The pad terminal 900 may be electrically connected to an external device through the bonding wire.

A first penetration hole 901 may be provided at a first side of the pad terminal 900. The first penetration hole 901 may be provided between the pad terminal 900 and the contact plug 960. The first penetration hole 901 may penetrate the insulating layer 500, the first substrate 100, and the first interconnection layer 800. The first penetration hole 901 may penetrate at least a portion of the second interconnection layer 1800. The first penetration hole 901 may have a first bottom surface and a second bottom surface. The first bottom surface of the first penetration hole 901 may be formed to expose the first conductive structure 830. The second bottom surface of the first penetration hole 901 may be located at a level higher than the first bottom surface. The second bottom surface of the first penetration hole 901 may be formed to expose the second conductive structure 1830.

The first conductive layer 911 may be extended to a region on the pad region PAD of the first substrate 100. The first conductive layer 911 may be disposed on the second surface 100b of the pad region PAD of the first substrate 100 to cover an inner side surface and a bottom surface of the first penetration hole 901. As shown in FIG. 6, a plurality of the pad terminals 900 may be provided. The pad terminals 900 may include a first pad terminal and a second pad terminal 920. Although not shown, the first conductive layer 911 may be provided on top and side surfaces of at least one (e.g., the first pad terminal) of the pad terminals 900 and may be electrically connected to the at least one (e.g., the first pad terminal) of the pad terminals 900.

The first conductive layer 911 may cover the side surface and the first bottom surface of the first penetration hole 901. The first conductive layer 911 may be in contact with a bottom surface of the first conductive structure 830. Thus, the first conductive structure 830 may be electrically connected to the at least one (e.g., the first pad terminal) of the pad terminals 900 through the first conductive layer 911. During operations of the image sensor, a voltage may be applied to the first conductive structure 830 through the pad terminal 900 (e.g., the first pad terminal) and the first conductive layer 911. The voltage may be applied to the conductive isolation pattern 215 through the first conductive layer 911 and the contact plug 960. The voltage may be the negative bias voltage described above.

The first conductive layer 911 may cover the second bottom surface of the first penetration hole 901 and may be coupled to a bottom surface of the second conductive structure 1830. The integrated circuits 1700 in the circuit chip 2 may be electrically connected to the at least one (e.g., the first pad terminal) of the pad terminal 900 through the second conductive structure 1830 and the first conductive layer 911. In an embodiment, the first conductive layer 911 may not be coupled to the contact plug 960 and may be coupled to the first conductive structure 830 and the second conductive structure 1830. The first conductive layer 911 may serve as an electric conduction path between the integrated circuits 1700 of the circuit chip 2 and the transistor of the sensor chip 1. The first conductive layer 911 may be formed of or include at least one of metallic materials (e.g., copper, tungsten, aluminum, titanium, tantalum, or alloys thereof).

The first gapfill pattern 921 may be provided in the first penetration hole 901 to fill the first penetration hole 901. The first gapfill pattern 921 may not be extended to a region on the second surface 100b of the first substrate 100. The first gapfill pattern 921 may be formed of or include at least one of low refractive materials and may have an insulating property. The first gapfill pattern 921 may be formed of or include the same material as the fence pattern 550. For example, the first gapfill pattern 921 may include a polymer and nano particles. A bottom surface of the first gapfill pattern 921 may be a recessed portion. For example, a center portion of the bottom surface of the first gapfill pattern 921 may be located at a level higher than its edge portion.

The first capping pattern 931 may be disposed on the bottom surface of the first gapfill pattern 921 to fill the recessed portion. A top surface of the first gapfill pattern 921 may be upwardly convex. A bottom surface of the first capping pattern 931 may be substantially flat. The first capping pattern 931 may be formed of or include at least one of insulating polymers (e.g., photoresist materials).

A second penetration hole 902 may be disposed at a second side of the pad terminal 900. The second side of the pad terminal 900 may be different from the first side of the pad terminal 900. The second penetration hole 902 may penetrate the insulating layer 500, the first substrate 100, and the first interconnection layer 800. The second penetration hole 902 may be provided to penetrate a portion of the second interconnection layer 1800 and thereby to expose the second conductive structure 1830.

As shown, a second conductive layer 912 may be interposed between another one (e.g., the second pad terminal 920) of the pad terminals 900 and the first substrate 100 and may be electrically connected to the second pad terminal 920. The second conductive layer 912 may be extended into the second penetration hole 902 to conformally cover the side and bottom surfaces of the second penetration hole 902. The second conductive layer 912 may be electrically connected to the second conductive structure 1830. During operations of the image sensor, the integrated circuits 1700 of the circuit chip 2 may transmit and receive electrical signals through the second conductive structure 1830, the second conductive layer 912, and the second pad terminal 920.

The second gapfill pattern 922 may be provided in the second penetration hole 902 to fill the second penetration hole 902. The second gapfill pattern 922 may not be extended to a region on the second surface 100b of the first substrate 100. The second gapfill pattern 922 may be formed of or include at least one of low refractive materials and may have an insulating property. For example, the second gapfill pattern 922 may be formed of or include the same material as the fence pattern 550. A bottom surface of the second gapfill pattern 922 may have a recessed portion.

The second capping pattern 932 may be disposed on the bottom surface of the second gapfill pattern 922 to fill the recessed portion. The second capping pattern 932 may have an upwardly convex top surface. The second capping pattern 932 may have a substantially flat bottom surface. The second capping pattern 932 may be formed of or include at least one of insulating polymers (e.g., photoresist materials).

The protection insulating layer 531 may be extended to a region on the pad region PAD of the first substrate 100. The protection insulating layer 531 may be provided on the bottom surface of the insulating layer 500 and may be extended into the first penetration hole 901 and the second penetration hole 902. The protection insulating layer 531 may be interposed between the second conductive layer 912 and the second gapfill pattern 922, in the first penetration hole 901. The protection insulating layer 531 may be interposed between the second conductive layer 912 and the second gapfill pattern 922, in the second penetration hole 902. The protection insulating layer 531 may expose the pad terminal 900.

The organic layer 601 may be provided on the second surface 100b of the pad region PAD of the first substrate 100 to cover the first capping pattern 931 and a portion of the protection insulating layer 531. The organic layer 601 may expose a bottom surface of the pad terminal 900.

Figure 15B:
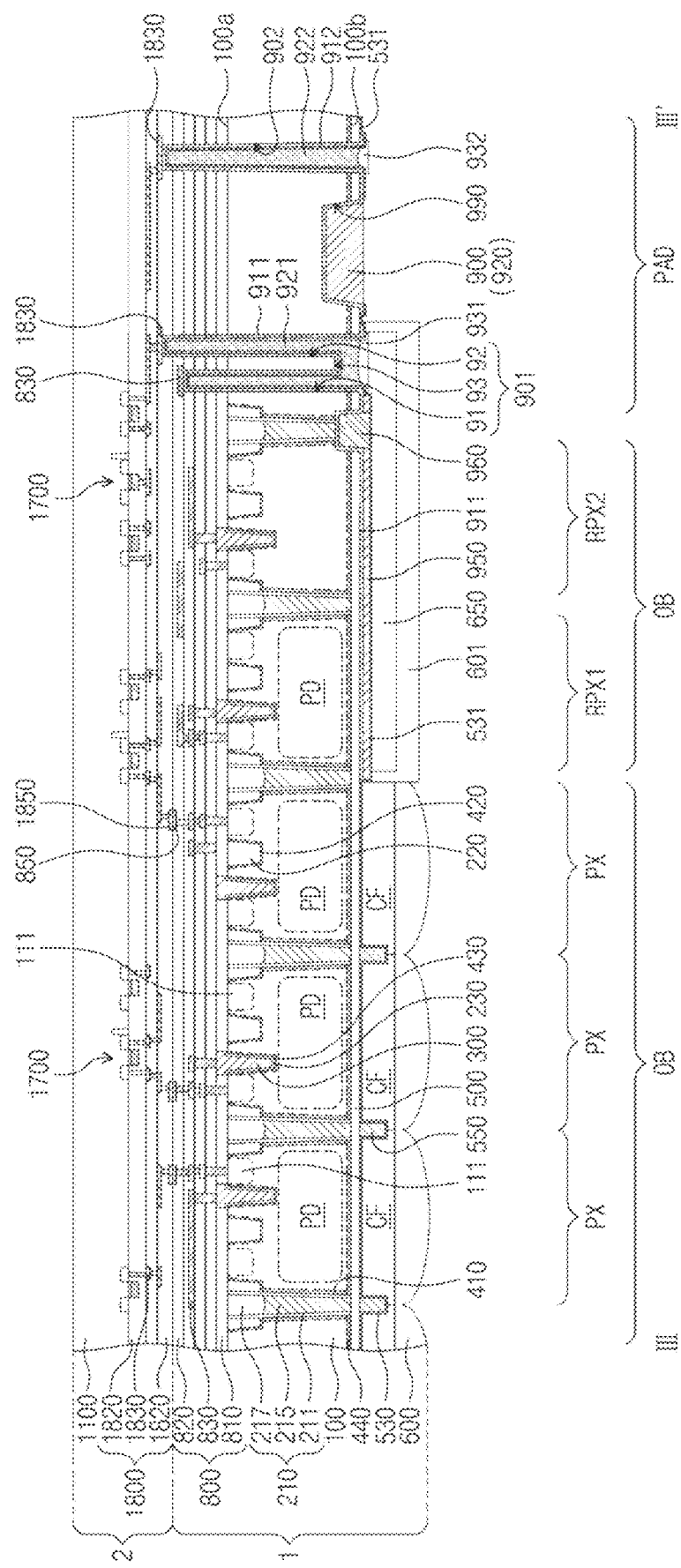
FIG. 15B is a sectional view illustrating an image sensor according to an embodiment.

FIG. 15B is a sectional view, which is taken along a fine III-III' of FIG. 6 to illustrate an image sensor according to an embodiment.

Referring to FIG. 15B, the image sensor may include the sensor chip 1 and the circuit chip 2. The sensor chip 1 and the circuit chip 2 may be provided to have substantially the same features as those in the embodiment of FIG. 15A. However, the sensor chip 1 may further include a first connection pad 850. The first connection pad 850 may be provided near the top surface of the sensor chip 1. For example, the first connection pad 850 may be provided in the uppermost layer of the second insulating layers 820. The first connection pad 850 may be electrically connected to the first conductive structure 830. The first connection pad 850 may be formed of or include at least one of conductive or metallic materials. For example, the first connection pad 850 may be formed of or include copper. As another example, the first connection pad 850 may be formed of or include at least one of aluminum, tungsten, titanium, and/or alloys thereof.

The circuit chip 2 may further include a second connection pad 1850. The second connection pad 1850 may be provided near the bottom surface of the circuit chip 2. The second connection pad 1850 may be provided in the lowermost layer of the third insulating layers 1820. The second connection pad 1850 may be electrically connected to the integrated circuits 1700 through the second conductive structure 1830. The second connection pad 1850 may be formed of or include at least one of conductive or metallic materials. For example, the second connection pad 1850 may be formed of or include copper. As another example, the second connection pad 1850 may be formed of or include at least one of aluminum, tungsten, titanium, and/or alloys thereof.

The circuit chip 2 may be connected to the sensor chip 1 in a direct bonding manner. For example, the first coal section pad 850 and the second connection pad 1850 may be vertically aligned to each other and may be in contact with each other. For example, the second connection pad 1850 may be directly bonded to the first connection pad 850. Electrical signals from the integrated circuits 1700 of the circuit chip 2, may be transmitted to the transistors or the pad terminal 900 of the sensor chip 1 through the second conductive structures 1830, the second connection pad 1850, the first connection pad 850, and the first conductive structure 1830. The uppermost layer of the second insulating layers 820 may be directly bonded to the lowermost layer of the third insulating layers 1820. In this case, the uppermost layer of the second insulating layers 820 may be chemically bonded to the lowermost layer of the third insulating layers 1820, but embodiments are not limited to this example.

The first penetration hole 901 may include a first penetration hole portion 91, a second penetration hole portion 92, and a third penetration hole portion 93. The first penetration hole portion 91 may penetrate the insulating layer 500, the first substrate 100 and the first interconnection layer 800 and may have a first bottom surface. The second penetration hole portion 92 may penetrate the insulating layer 500, the first substrate 100, and the first interconnection layer 800 and may be extended into the second interconnection layer 1800. The second penetration hole portion 92 may have a second bottom surface, and in an embodiment, the second bottom surface may expose the bottom surface of the second conductive structure 1830. A side surface of the second penetration hole portion 92 may be spaced apart from a side surface of the first penetration hole portion 91. The third penetration hole portion 93 may be provided between a lower portion of the first penetration hole portion 91 and a lower portion of the second penetration hole portion 92 and may be connected to the lower portion of the first penetration hole portion 91 and the lower portion of the second penetration hole portion 92. The first conductive layer 911 the protection insulating Layer 531, and the first gapfill pattern 921 may be provided in the first penetration hole 901. The first conductive layer 911 may cover inner surfaces of the first penetration hole portion 91, the second penetration hole portion 92, and the third penetration hole portion 93.

In addition, the embodiments disclosed the present specification may be variously combined. For example, the embodiments described with reference to FIGS. 7A to 15B may be combined.

According to various embodiments, a doped region may be provided to have a uniform thickness and a uniform dopant concentration. Thus, the electrical and optical characteristics of the image sensor may be improved.

While example embodiments have been particularly shown and described, it will be understood by one of ordinal skill in the art that variations in form and detail may be made therein without departing from the spirit and scope of the attached claims.

What is claimed is:
1. An image sensor comprising:
a semiconductor substrate with a trench; and
an insulating pattern in the trench of the semiconductor substrate,
wherein the semiconductor substrate has a doped region that is doped into the semiconductor substrate and that completely surrounds sidewalls of the trench,
wherein the doped region comprises:
a first region, which is in contact with the insulating pattern and comprises a dopant and a first auxiliary element, the first region completely surrounding the trench; and
a second region, which is interposed between the first region and the semiconductor substrate and completely surrounds the first region, the second region comprising the dopant, and wherein a concentration of the dopant in the first region is uniform and is higher than a concentration of the first auxiliary element in the first region.

2. The image sensor of claim 1, wherein the insulating pattern comprises an element and a second auxiliary element,
the element of the insulating pattern is a same element as the dopant, and
the second auxiliary element is a same element as the first auxiliary element.

3. The image sensor of claim 1, wherein the first auxiliary element comprises chlorine.

4. The image sensor of claim 1, wherein the first auxiliary element is absent in the second region of the doped region.

5. The image sensor of claim 1, wherein the insulating pattern comprises a first surface and a second surface, which have inclination angles different from each other,
the doped region comprises:
a first portion on the first surface of the insulating pattern; and
a second portion on the second surface of the insulating pattern,
a thickness of the second portion of the doped region is from 85% to 115% of a thickness of the first portion of the doped region, and
a number of dopants per unit area in the second portion of the doped region is from 85% to 115% of a number of dopants per unit area in the first portion.

6. The image sensor of claim 1, wherein a thickness of the doped region has a tolerance of 15% or less.

7. The image sensor of claim 1, wherein the doped region contacts the insulating pattern and extends into the semiconductor substrate.

8. The image sensor of claim 1, wherein the thickness of the doped region is substantially constant and is about 30 nm to about 180 nm.

9. An image sensor comprising:
a semiconductor substrate with a trench;
an insulating pattern in the trench of the semiconductor substrate; and
a doped region disposed in the semiconductor substrate and on the insulating pattern, the doped region completely surrounding sidewalls of the trench,
wherein the doped region comprises:
a first region, which is in contact with the insulating pattern and comprises a dopant and a first auxiliary element, the first region completely surrounding the trench; and
a second region, which is interposed between the first region and the semiconductor substrate and completely surrounds the first region, the second region comprising the dopant, and
wherein a concentration of the dopant in the first region is uniform and is higher than a concentration of the first auxiliary element in the first region,
wherein the first auxiliary element is fluorine or hydrogen or chlorine.

10. The image sensor of claim 9, wherein the thickness of the doped region is substantially constant and is about 30 nm to about 180 nm.

11. An image sensor comprising:
a semiconductor substrate with a trench;
an insulating pattern in the trench of the semiconductor substrate; and
a doped region disposed in the semiconductor substrate and on the insulating pattern, the doped region completely surrounding sidewalls of the trench,
wherein the doped region comprises:
a first region, which is in contact with the insulating pattern and comprises a dopant and a first auxiliary element, the first region completely surrounding the trench; and
a second region, which is interposed between the first region and the semiconductor substrate and completely surrounds the first region, the second region comprising the dopant,
wherein a concentration of the dopant in the first region is uniform and is higher than a concentration of the first auxiliary element in the first region,
wherein the image sensor further comprises:
photoelectric conversion regions provided in the semiconductor substrate; and
a conductive pixel isolation pattern provided in the trench to cover the insulating pattern, and
wherein the conductive pixel isolation pattern is disposed between the photoelectric conversion regions.

12. The image sensor of claim 11, wherein the thickness of the doped region is substantially constant and is about 30 nm to about 180 nm.

* * * * *